(12) United States Patent
Lee et al.

(10) Patent No.: US 11,456,714 B2
(45) Date of Patent: Sep. 27, 2022

(54) ELECTRONIC DEVICE FOR PROCESSING RADIO SIGNAL AND OPERATING METHOD THEREOF

(71) Applicant: SAMSUNG ELECTRONICS CO., LTD., Suwon-si (KR)

(72) Inventors: Hyosung Lee, Suwon-si (KR); Namjun Cho, Suwon-si (KR); Hyoseok Na, Suwon-si (KR); Hanyeop Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/154,264

(22) Filed: Jan. 21, 2021

(65) Prior Publication Data
US 2021/0234522 A1 Jul. 29, 2021

(30) Foreign Application Priority Data

Jan. 23, 2020 (KR) .................. 10-2020-0009123

(51) Int. Cl.
*H03F 3/24* (2006.01)
*H01Q 1/24* (2006.01)
(Continued)

(52) U.S. Cl.
CPC ............. *H03F 3/245* (2013.01); *H01Q 1/243* (2013.01); *H01Q 21/065* (2013.01); *H03F 1/56* (2013.01);
(Continued)

(58) Field of Classification Search
CPC ...... H03F 3/245; H03F 1/56; H03F 2200/294; H03F 2200/387; H03F 2200/451;
(Continued)

(56) References Cited

U.S. PATENT DOCUMENTS 6,111,459 A * 8/2000 Nishijima ................ H03F 3/68
330/126
6,216,012 B1 4/2001 Jensen
(Continued)

FOREIGN PATENT DOCUMENTS

CN 1166246 A 11/1997
CN 105375946 A 3/2016
(Continued)

OTHER PUBLICATIONS

Extended European Search Report and Written Opinion dated Oct. 4, 2021 in corresponding European Application No. 21152847.6.
(Continued)

*Primary Examiner* — Nguyen T Vo
(74) *Attorney, Agent, or Firm* — Nixon & Vanderhye P.C.

(57) ABSTRACT

Various embodiments relate to an apparatus and a method for processing a radio signal in an electronic device. The electronic device may include: a communication processor; and a power amplifier electrically connected to the communication processor, the power amplifier including a first switch, an input port, a first output port, and a second output port, the power amplifier further including a first amplification circuit disposed on a first electrical path between the input port and the first switch, a second amplification circuit disposed on a second electrical path between the first switch and the first output port, and a third amplification circuit disposed on a third electrical path between the first switch and the second output port.

13 Claims, 38 Drawing Sheets

(51) Int. Cl.
*H01Q 21/06* (2006.01)
*H03F 1/56* (2006.01)
*H04B 1/00* (2006.01)
*H04B 1/40* (2015.01)

(52) U.S. Cl.
CPC ............ *H04B 1/0064* (2013.01); *H04B 1/40* (2013.01); *H03F 2200/294* (2013.01); *H03F 2200/387* (2013.01); *H03F 2200/451* (2013.01)

(58) Field of Classification Search
CPC ....... H03F 2200/111; H03F 2203/7209; H03F 3/195; H03F 3/68; H03F 3/72; H01Q 1/243; H01Q 21/065; H04B 1/0064; H04B 1/40
See application file for complete search history.

(56) References Cited

U.S. PATENT DOCUMENTS

| | | | |
|---|---|---|---|
| 9,025,644 B2* | 5/2015 | Arkhipenkov | H04B 7/155 375/295 |
| 10,469,120 B1 | 11/2019 | Cetinoneri et al. | |
| 2004/0121753 A1 | 6/2004 | Sugar et al. | |
| 2008/0136512 A1 | 6/2008 | Dow et al. | |
| 2010/0291888 A1 | 11/2010 | Hadjichristos et al. | |
| 2013/0043944 A1 | 2/2013 | Jones | |
| 2015/0381124 A1 | 12/2015 | Joly et al. | |
| 2016/0190995 A1 | 6/2016 | Penticoff | |
| 2016/0191085 A1 | 6/2016 | Kasnavi et al. | |
| 2016/0276983 A1 | 9/2016 | Villancourt et al. | |
| 2016/0294452 A1 | 10/2016 | Sugar et al. | |
| 2018/0048345 A1* | 2/2018 | Pehlke | H04B 1/40 |
| 2018/0367105 A1 | 12/2018 | Yanagihara | |
| 2019/0181805 A1 | 6/2019 | Ahmed et al. | |
| 2019/0386397 A1 | 12/2019 | Son et al. | |
| 2019/0386616 A1 | 12/2019 | King et al. | |
| 2020/0021024 A1 | 1/2020 | Park et al. | |
| 2020/0366259 A1 | 11/2020 | Sun et al. | |

FOREIGN PATENT DOCUMENTS

| | | |
|---|---|---|
| CN | 110301103 A | 10/2019 |
| JP | 2006-180151 A | 7/2006 |
| WO | 2019/143854 | 7/2019 |

OTHER PUBLICATIONS

Saqib Muhammad et al: "Comparative Survey of Techniques and Technologies Used in Transmit Path of Transmit Receive Module of AESA Radar", 2019 16th International Bhurban Conference on Applied Sciences and Technology (IBCAST), IEEE, Jan. 8, 2019 (Jan. 8, 2019), pp. 1021-1028, XP033530920.
International Search Report dated Apr. 19, 2021 in corresponding International Application No. PCT/KR2021/000835.
Partial European Search Report and Written Opinion dated May 21, 2021 in corresponding Application No. 21152847.6.
Chinese Office Action dated Jan. 27, 2022 for CN Application No. 202110086598.0.

* cited by examiner

ELECTRONIC DEVICE FOR PROCESSING RADIO SIGNAL AND OPERATING METHOD THEREOF

CROSS-REFERENCE TO RELATED APPLICATION

This application is based on and claims priority under 35 U.S.C. § 119 to Korean Patent Application No. 10-2020-0009123, filed on Jan. 23, 2020, in the Korean Intellectual Property Office, the disclosure of which is incorporated by reference herein in its entirety.

BACKGROUND

Field

The disclosure relates to an apparatus and a method for processing a radio signal in an electronic device.

Description of Related Art

With the development of information communication technology and semiconductor technology, electronic devices can provide various functions. For example, an electronic device can provide not only a voice communication function but also a short-range wireless communication function (e.g., Bluetooth, wireless LAN, or near field communication (NFC)) and/or a mobile communication function (long term evolution (LTE), LTE-advanced (A), or 5th generation new radio (5G NR).

An electronic device can generate and/or restore a radio frequency (RF) signal for wireless communication. A circuit for processing an RF signal (e.g., radio frequency front end (RFFE)) may require a certain physical area in the electronic device.

A circuit for processing an RF signal (e.g., RFFE) may require a relatively larger physical area as the structure becomes relatively complicated. As the physical area occupied by the circuit for processing the RF signal becomes larger in an electronic device, it may cause an increase of the size of the electronic device and may cause an increase in cost.

SUMMARY

Embodiments of the disclosure disclose an apparatus and a method for processing a radio signal using a wireless communication circuit (e.g., radio frequency integrated circuit (RFIC)) having a structure in which a plurality of amplification circuits of an amplification module (e.g., power amplifier or low noise amplifier) are separated from an electronic device.

According to various example embodiments, an electronic device may include: a communication processor; and a power amplifier electrically connected to the communication processor, the power amplifier including a first switch, an input port, a first output port, and a second output port, the power amplifier further including a first amplification circuit disposed on a first electrical path between the input port and the first switch, a second amplification circuit disposed on a second electrical path between the first switch and the first output port, and a third amplification circuit disposed on a third electrical path between the first switch and the second output port.

According to various example embodiments, an electronic device may include: a communication processor; and at least one antenna module electrically connected to the communication processor, the at least one antenna module including a first antenna array including at least one first antenna, a second antenna array including at least one second antenna, and a wireless communication circuit, wherein the wireless communication circuit includes a power amplifier including a first switch, an input port, a first output port, and a second output port, the power amplifier further including a first amplification circuit disposed on a first electrical path between the input port and the first switch, a second amplification circuit disposed on a second electrical path between the at least one first antenna connected through the first output port and the first switch, and a third amplification circuit disposed on a third electrical path between the at least one second antenna connected through the second output port and the first switch.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments will be described in greater detail with reference to the accompanying drawings.

Figure 1:
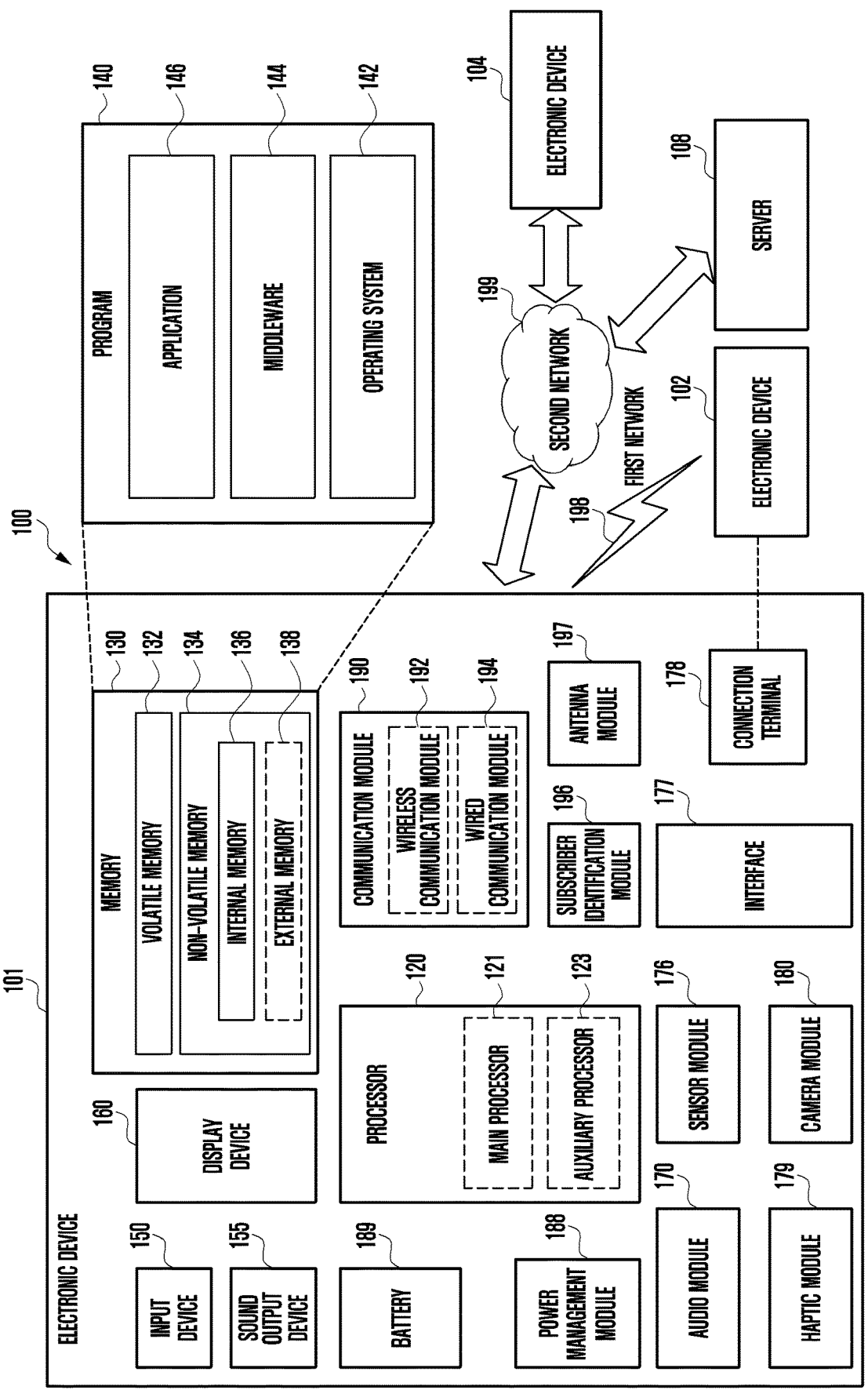
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term may not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
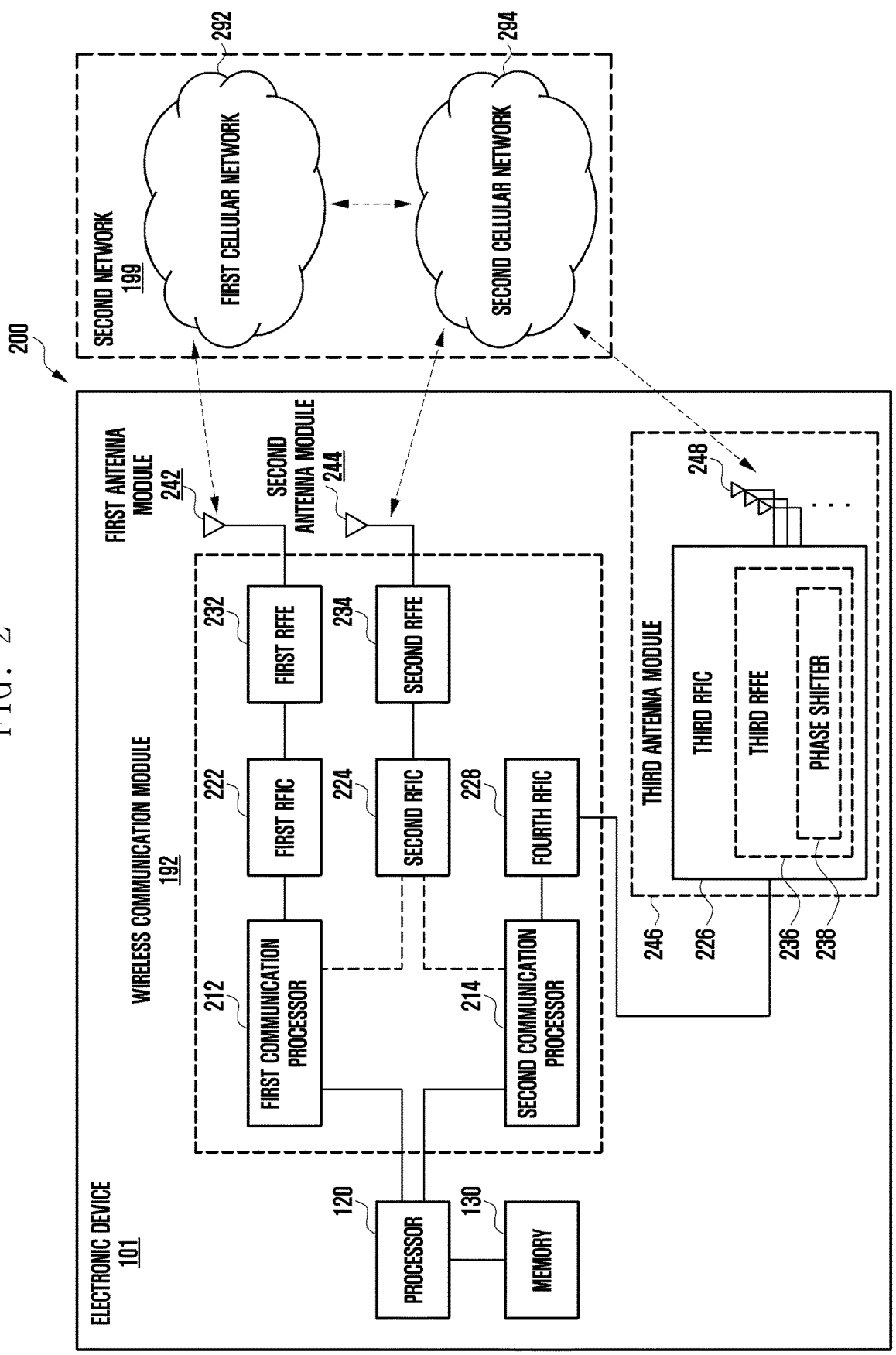
FIG. 2 is a block diagram illustrating an example electronic device supporting legacy network communication and 5G network communication according to various embodiments.

FIG. 2 is a block diagram 200 illustrating an example electronic device 101 supporting legacy network communication and 5G network communication according to various embodiments.

With reference to FIG. 2, an electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130. A network 199 may include a first network 292 and a second network 294. According to another embodiment, the electronic device 101 may further include at least one of components described in FIG. 1, and the network 199 may further include at least one other network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to another embodiment, the fourth RFIC 228 may be omitted, or may be included as a part of the third RFIC 226.

The first communication processor 212 may establish a communication channel of a band to be used for wireless communication with the first network 292, and may support legacy network communication through the established communication channel. According to an embodiment, the first network may be a legacy network including a second generation (2G), 3G, 4G, or long term evolution (LTE) network. The second communication processor 214 may establish a communication channel corresponding to a designated band (e.g., about 6 to 60 GHz) among bands to be used for wireless communication with the second network 294, and may support 5G network communication through the established communication channel. According to an embodiment, the second network 294 may be a 5G network (e.g., new radio (NR)) being defined in 3GPP. In addition, according to an embodiment, the first communication processor 212 or the second communication processor 214 may establish a communication channel corresponding to another designated band (e.g., about 6 GHz or less) among the bands to be used for the wireless communication with the second network 294, and may support 5G network communication through the established communication channel. According to an embodiment, the first communication processor 212 and the second communication processor 214 may be implemented in a single chip or a single package. According to an embodiment, the first communication processor 212 or the second communication processor 214 may be formed in a single chip or a single package with the processor 120, an auxiliary processor 123, or a communication module 190.

The first RFIC 222, during transmission, may convert a baseband signal generated by the first communication processor 212 into a radio frequency (RF) signal of about 700 MHz to about 3 GHz being used in the first network 292 (e.g., legacy network). During reception, the RF signal may be acquired from the first network 292 (e.g., legacy network) through the antenna (e.g., first antenna module 242), and may be preprocessed through the RFFE (e.g., first RFFE 232). The first RFIC 222 may convert the preprocessed RF signal into the baseband signal so that it can be processed by the first communication processor 212.

The second RFIC 224, during transmission, may convert a baseband signal generated by the first communication processor 212 or the second communication processor 214 into an RF signal (hereinafter, 5G Sub6 RF signal) of a Sub6 band (e.g., about 6 GHz or less) being used in the second network 294 (e.g., 5G network). During reception, the 5G Sub6 RF signal may be acquired from the second network 294 (e.g., 5G network) through the antenna (e.g., second antenna module 244), and may be preprocessed through the RFFE (e.g., second RFFE 234). The second RFIC 224 may convert the preprocessed 5G Sub6 RF signal into the baseband signal so that it can be processed by the corresponding communication processor between the first communication processor 212 and the second communication processor 214.

The third RFIC 226 may convert the baseband signal generated by the second communication processor 214 into an RF signal (hereinafter, 5G Above6 RF signal) of a 5G Above6 band (e.g., about 6 to 60 GHz) to be used in the second network 294 (e.g., 5G network). During reception, the 5G Above6 RF signal may be acquired from the second network 294 (e.g., 5G network) through the antenna (e.g., antenna 248), and may be preprocessed through the third RFFE 236. The third RFIC 226 may convert the preprocessed 5G Above6 RF signal into the baseband signal so that it can be processed by the second communication processor 214. According to an embodiment, the third RFFE 236 may be formed as a part of the third RFIC 226.

According to an embodiment, the electronic device 101, separately from the third RFIC 226 or as at least a part thereof, may include the fourth RFIC 228. In this case, the fourth RFIC 228 may convert the baseband signal generated by the second communication processor 214 into an RF signal (hereinafter, IF signal) of an intermediate frequency band (e.g., about 9 to 11 GHz), and may transfer the IF signal to the third RFIC 226. The third RFIC 226 may convert the IF signal into the 5G Above6 RF signal. During reception, the 5G Above6 RF signal may be received from the second network 294 (e.g., 5G network) through the antenna (e.g., antenna 248), and may be converted into the IF signal by the third RFIC 226. The fourth RFIC 228 may convert the IF signal into the baseband signal so that it can be processed by the second communication processor 214.

According to an embodiment, the first RFIC 222 and the second RFIC 224 may be implemented as at least parts of a single chip or a single package. According to an embodiment, the first RFFE 232 and the second RFFE 234 may be implemented as at least parts of the single chip or the single package. According to an embodiment, at least one of the first antenna module 242 or the second antenna module 244 may be omitted, or may be coupled to another antenna module to process RF signals of a corresponding plurality of bands.

According to an embodiment, the third RFIC 226 and the antenna 248 may be disposed on the same substrate, and may form the third antenna module 246. For example, the wireless communication module 192 or the processor 120 may be disposed on a first substrate (e.g., main PCB). In this case, the third antenna module 246 may be formed in a manner that the third RFIC 226 is disposed on one partial area (e.g., lower surface) of a second substrate (e.g., sub PCB) separately from the first substrate, and the antenna 248 is disposed on the other partial area (e.g., upper surface) thereof. By disposing the third RFIC 226 and the antenna 248 on the same substrate, it is possible to reduce a length of a transmission line between them. That is, for example, it is possible to reduce a loss (e.g., attenuation) of a signal of a high frequency band (e.g., about 6 to 60 GHz) being used for 5G network communication, which is caused by the transmission line. Because of this, the electronic device 101 can improve the quality or speed of communication with the second network 294 (e.g., 5G network).

According to an embodiment, the antenna 248 may be formed of an antenna array including a plurality of antenna elements capable of being used for beamforming. In this case, the third RFIC 226 may include a plurality of phase shifters 238 corresponding to the plurality of antenna elements, for example, as a part of the third RFFE 236. During transmission, each of the plurality of phase shifters 238 may change the phase of the 5G Above6 RF signal to be transmitted to an outside (e.g., base station of the 5G network) of the electronic device 101 through the corresponding antenna element. During reception, each of the plurality of phase shifters 238 may change the phase of the 5G Above6 RF signal received from the outside through the corresponding antenna element to the same or substantially the same phase. This enables the transmission or reception through beamforming between the electronic device 101 and the outside.

The second network 294 (e.g., 5G network) may operate independently of the first network 292 (e.g., legacy network) (e.g., standalone (SA)), or may operate through being connected to the first network 292 (e.g., non-standalone (NSA). For example, in the 5G network, only an access network (e.g., 5G radio access network (RAN) or next generation RAN (NG RAN)) may exist, but a core network (e.g., next generation core (NGC)) may not exist. In this case, the electronic device 101 may access an external network (e.g., Internet) under the control of a core network (e.g., evolved packed core (EPC)) of the legacy network after accessing the access network of the 5G network. Protocol information (e.g., LTE protocol information) for communication with the legacy network or protocol information (e.g., new radio (NR) protocol information) for communication with the 5G network may be stored in the memory 130, and may be accessed by another element (e.g., the processor 120, the first communication processor 212, or the second communication processor 214).

Figure 3A:
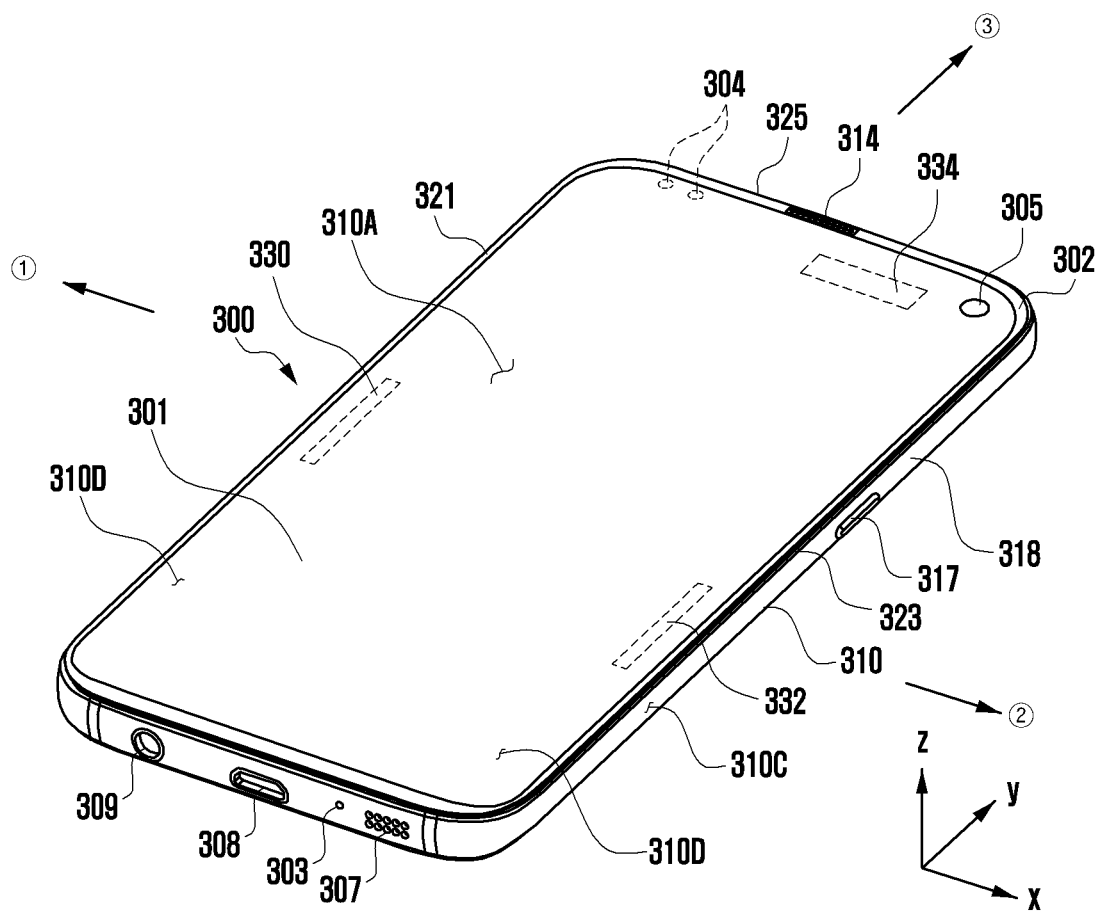
FIG. 3A is a front perspective view of an electronic device according to various embodiments.
Figure 3B:
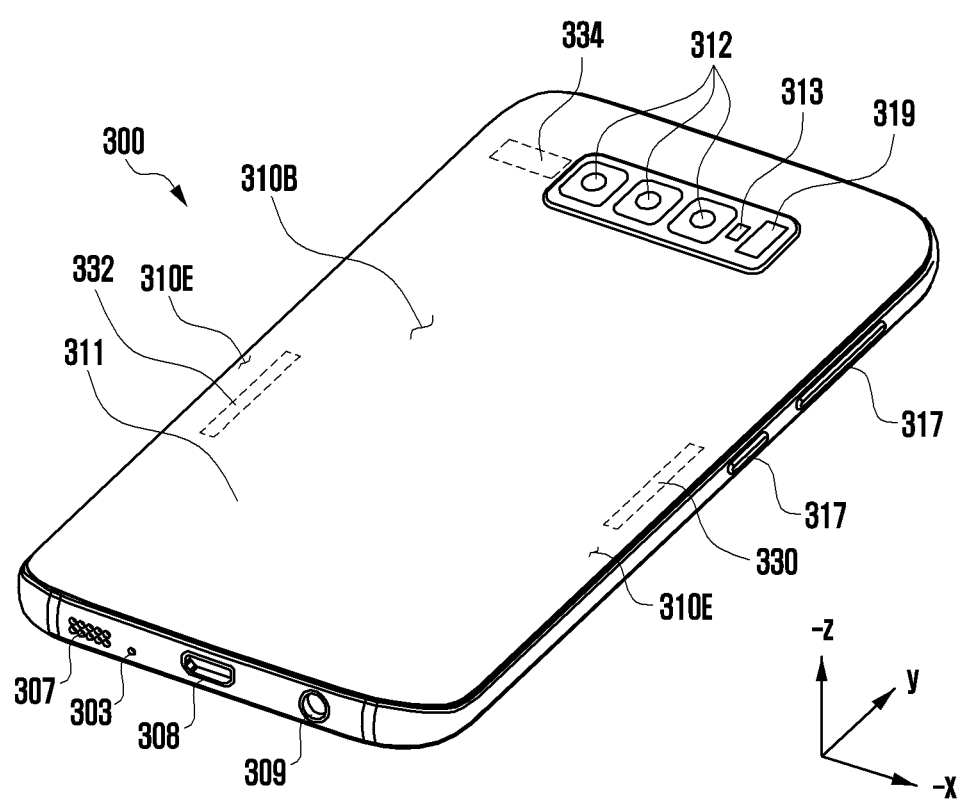
FIG. 3B is a rear perspective view of an electronic device according to various embodiments.

FIG. 3A is a front perspective view of an electronic device 300 according to various embodiments. FIG. 3B is a rear perspective view of an electronic device 300 according to various embodiments. For example, the electronic device 300 of FIGS. 3A and 3B may be at least partly similar to the electronic device 101 of FIG. 1, or may include another embodiment of the electronic device.

With reference to FIGS. 3A and 3B, according to various embodiments, the electronic device 300 may include a housing 310 including a first surface (or front surface) 310A, a second surface (or rear surface) 310B, and a side surface 310C surrounding a space between the first surface 310A and the second surface 310B. In another embodiment (not illustrated), the housing 310 may refer to a structure forming parts of the first surface 310A, the second surface 310B, and the side surface 310C of FIG. 3A. According to an embodiment, the first surface 310A may be formed by a front plate 302 (e.g., a glass plate including various coating layers or polymer plate) of which at least a part is substantially transparent. The second surface 310B may be formed by a rear plate 311 being substantially opaque. For example, the rear plate 311 may be formed by coated or colored glass, ceramic, polymer, metal (e.g., aluminum, stainless steel (STS), or magnesium), or a combination of at least two of the materials. The side surface 310C is combined with the front plate 302 and the rear plate 311, and may be formed by a side bezel structure (or "side member") 318 including metal and/or polymer. According to an embodiment, the rear plate 311 and the side bezel structure 318 may be integrally formed, and may include the same material (e.g., metal material such as aluminum).

In the illustrated embodiment, the front plate 302 may include a first area 310D being bent from the first surface 310A toward the rear plate 311 and extending seamlessly at both ends of long edges of the front plate 302. In the illustrated embodiment (refer to FIG. 3B), the rear plate 311 may include a second area 310E being bent from the second surface 310B toward the front plate 302 and extending seamlessly at both ends of long edges of the rear plate 311. According to an embodiment, the front plate 302 or the rear plate 311 may include only one of the first area 310D or the second area 310E. According to an embodiment, the front plate 302 may not include the first area 310D and the second area 310E, but may include only a flat plane being disposed in parallel to the second surface 310B. According to an embodiment, as seen from the side of the electronic device 300, the side bezel structure 318 may have a first thickness (or width) from the side that does not include the first area 310D or the second area 310E as described above, and may have a second thickness that is thinner than the first thickness from the side that includes the first area 310D or the second area 310E.

According to various embodiments, the electronic device 300 may include at least one of a display 301, an input device 303, sound output devices 307 and 314, sensor modules 304 and 319, camera modules 305, 312, and 313, a key input device 317, an indicator (not illustrated), and connectors 308 and 309. According to an embodiment, the electronic device 300 may omit at least one (e.g., the key input device 317, the indicator, or the connector 309) of the elements, or may additionally include other elements.

According to an embodiment, the display 301 may be exposed through a significant part of the front plate 302. For example, at least a part of the display 301 may be exposed through the front plate 302 forming the first surface 310A and the first area 310D of the side surface 310C. According to an embodiment, the display 301 may be disposed to be coupled to or to be adjacent to a touch sensing circuit, a pressure sensor capable of measuring the strength (pressure) of a touch, and/or a digitizer detecting a magnetic field type stylus pen. According to an embodiment, at least a part of the sensor modules 304 and 319 and/or at least a part of the key input device 317 may be disposed on the first area 310D and/or the second area 310E.

According to an embodiment, the input device 303 may include a microphone 303. For example, the input device 303 may include a plurality of microphones 303 disposed to sense the direction of the sound. According to an embodiment, the sound output devices 307 and 314 may include speakers 307 and 314. For example, the speakers 307 and 314 may include an external speaker 307 and a call receiver 314. According to an embodiment, the microphone 303, the speakers 307 and 314, and the connectors 308 and 309 may be disposed in spaces of the electronic device 300, and may be exposed to an external environment through at least one hole formed on the housing 310. According to an embodiment, the hole formed on the housing 310 may be commonly used for the microphone 303 and the speakers 307 and 314. According to an embodiment, the sound output devices 307 and 314 may include a speaker (e.g., piezo speaker) operating in a state where the hole formed on the housing 310 is excluded.

According to an embodiment, the sensor modules 304 and 319 may generate an electrical signal or a data value corresponding to the internal operation state of the electronic device 300 or an external environment state. For example, the sensor modules 304 and 319 may include a first sensor module 304 (e.g., proximity sensor) and/or a second sensor module (not illustrated) (e.g., fingerprint sensor) disposed on the first surface 310A of the housing 310 and/or a third sensor module 319 (e.g., HRM sensor) disposed on the second surface 310B of the housing 310. The finger print sensor may be disposed on the first surface 310A of the housing 310. The finger print sensor (e.g., ultrasonic or optical finger print sensor) may be disposed below the display 301 on the first surface 310A. For example, the electronic device 300 may further include at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illumination sensor, which is a sensor module not illustrated.

According to an embodiment, the camera modules 305, 312, and 313 may include a first camera device 305 disposed on the first surface 310A of the electronic device 300, a second camera device 312 disposed on the second surface 310B, and/or a flash 313. For example, the camera modules 305 and 312 may include one or a plurality of lenses, an image sensor, and/or an image signal processor. For example, the flash 313 may include a light emitting diode or a xenon lamp. For example, two or more lenses (wide angle and telephoto lenses) and image sensors may be disposed on one surface of the electronic device 300.

According to an embodiment, the key input device 317 may be disposed on the side surface 310C of the housing 310. In another embodiment, the electronic device 300 may not include a part or the whole of the key input device 317, and the key input device 317 that is not included may be implemented in another form, such as a soft key, on the display 301. As another embodiment, the key input device 317 may be implemented using a pressure sensor included in the display 301.

According to an embodiment, the indicator may be disposed on the first surface 310A of the housing 310. For example, the indicator may provide status information of the electronic device 300 in a light form. In another embodiment, the light emitting element may provide a light source interlocking with the operation of the camera module 305. For example, the indicator may include an LED, an IR LED, and a xenon lamp.

According to an embodiment, the connectors 308 and/or 309 may include a first connector 308 capable of accommodating a connector (e.g., USB connector and/or interface connector port (IF) module) for transmitting and receiving a power and/or data to and from an external electronic device, and/or a second connector hole (or earphone jack) 309 capable of accommodating a connector for transmitting and receiving an audio signal to and from the external electronic device.

According to an embodiment, the camera module 305 of the camera modules 305 and 312, the sensor module 304 of the sensor modules 304 and 319, or the indicator may be disposed to be exposed through the display 101. For example, the camera module 305, the sensor module 304, or the indicator may be disposed to contact with the external environment through an opening perforated up to the front plate 302 of the display 301 in an inner space of the electronic device 300. As another embodiment, the sensor module 304 may not be visually exposed through the front plate 302 in the inner space of the electronic device, but may be disposed to perform its function. For example, in this case, the area of the display 301 facing the sensor module may not require the perforated opening.

According to various embodiments, the electronic device 300 may include a plurality of antenna modules 330, 332, or 334 being disposed in various locations of the inner space. According to an embodiment, the plurality of antenna modules 330, 332, or 334 may substantially have the same configuration in all, and may be disposed to have different beam pattern forming directions at least partly, or to overlap at least partly in the internal space of the electronic device 300.

According to various embodiments, the first antenna module 330 may be disposed in the neighborhood of the first side surface 321 in the inner space of the electronic device 300. According to an embodiment, the first antenna module 330 may form a beam pattern in a direction (e.g., direction −z of FIG. 3B) to which the rear plate (e.g., rear plate 311 of FIG. 3B) of the electronic device 300 is directed and/or in a direction (e.g., direction Q) to which the first side surface 321 is directed.

According to various embodiments, the second antenna module 332 may be disposed in the neighborhood of the second side surface 323 in the inner space of the electronic device 300. According to an embodiment, the second antenna module 332 may form a beam pattern in a direction (e.g., direction −z of FIG. 3B) to which the rear plate (e.g., rear plate 311 of FIG. 3B) of the electronic device 300 is directed and/or in a direction (e.g., direction ②) to which the second side surface 323 is directed.

According to various embodiments, the third antenna module 334 may be disposed in the neighborhood of the third side surface 325 in the inner space of the electronic device 300. According to an embodiment, the third antenna module 334 may form a beam pattern in a direction (e.g., direction −z of FIG. 3B) to which the rear plate (e.g., rear plate 311 of FIG. 3B) of the electronic device 300 is directed and/or in a direction (e.g., direction ③) to which the third side surface 325 is directed.

Figure 4A:
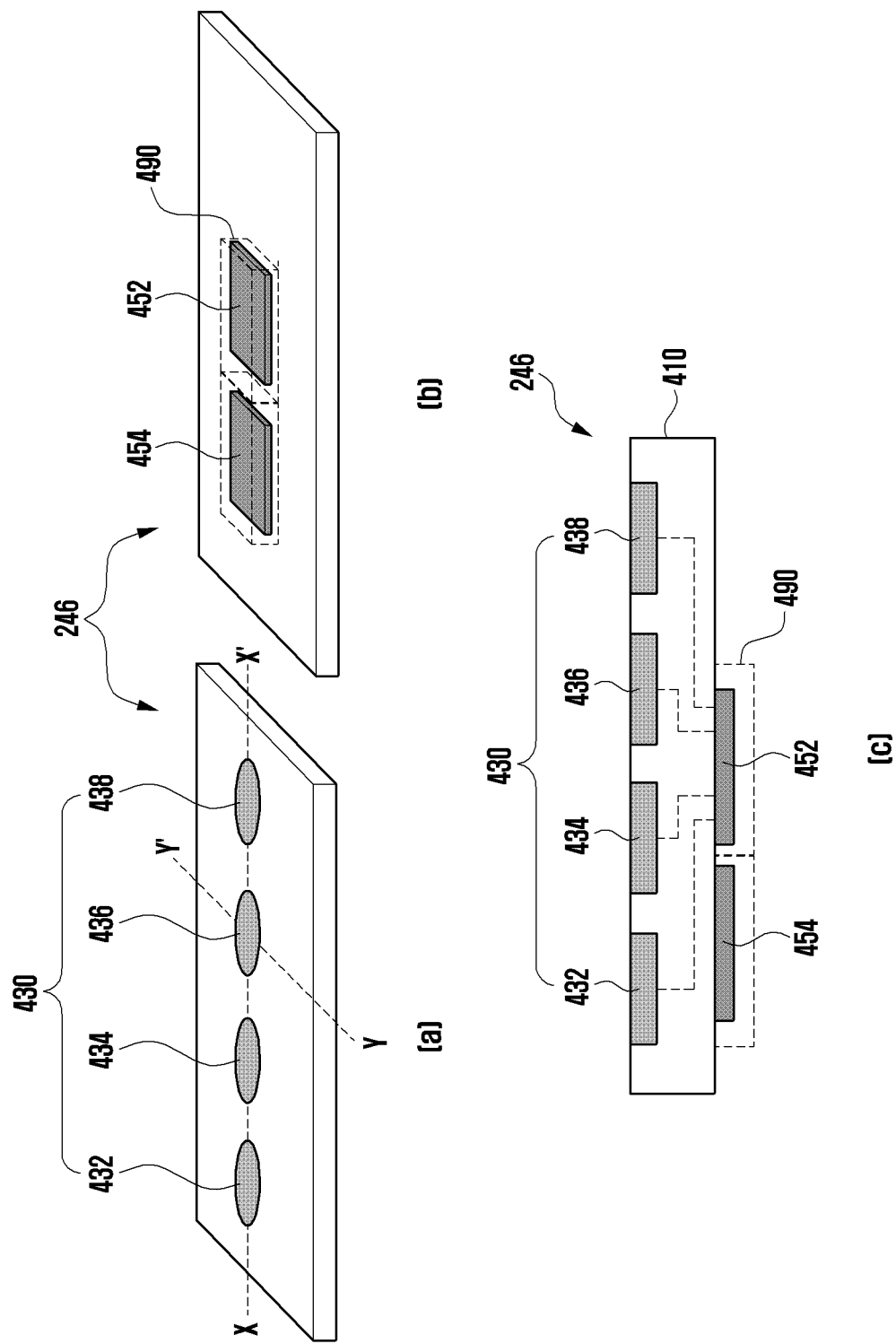
FIG. 4A is a diagram illustrating an example third antenna module structure according to various embodiments.

FIG. 4A is a diagram illustrating an example structure of a third antenna module 246 explained with reference to FIG. 2 according to various embodiments. In FIG. 4A, (a) is a perspective view as seen from one side of the third antenna module 246, (b) is a perspective view as seen from the other side of the third antenna module 246, and (c) is a cross-sectional view taken along line X-X' of the third antenna module 246.

With reference to FIG. 4A, according to various embodiments, the third antenna module 246 may include a printed circuit board 410, an antenna array 430, a radio frequency integrated circuit (RFIC) 452, or a power management integrated circuit (PMIC) 454. Selectively, the third antenna module 246 may further include a shielding member 490. In other embodiments, at least one of the above-described elements may be omitted, or at least two of the above-described elements may be integrally formed.

The printed circuit board 410 may include a plurality of conductive layers and a plurality of non-conductive layers alternately laminated with the conductive layers. The printed circuit board 410 may provide an electrical connection between the printed circuit board 410 and/or various electronic elements disposed outside using wirings and conductive vias formed on the conductive layers.

The antenna array 430 (e.g., 248 of FIG. 2) may include a plurality of antenna elements 432, 434, 436, or 438 disposed to form directional beams. As illustrated, the antenna elements 432, 434, 436, or 438 may be formed on the first surface of the printed circuit board 410. According to various embodiments, the antenna array 430 may be formed inside the printed circuit board 410. According to an embodiment, the antenna array 430 may include a plurality of antenna arrays (e.g., dipole antenna array and/or patch antenna array) of the same or different shapes or kinds.

The RFIC 452 (e.g., 226 of FIG. 2) may be disposed on the other area (e.g., second surface that is opposite to the first surface) of the printed circuit board 410, being spaced apart from the antenna array. The RFIC 452 is configured to process a signal of a selected frequency band that is transmitted/received through the antenna array 430. According to an embodiment, the RFIC 452, during transmission, may convert a baseband signal acquired from a communication processor (not illustrated) into an RF signal of a designated band. The RFIC 452, during reception, may convert the RF signal received through the antenna array 430 into the baseband signal, and may transfer the baseband signal to the communication processor.

According to another embodiment, the RFIC 452, during transmission, may up-convert an IF signal (e.g., about 9 to 11 GHz) acquired from the intermediate frequency integrated circuit (IFIC) (e.g., 228 of FIG. 2) into an RF signal of a selected band. The RFIC 452, during reception, may convert the RF signal acquired through the antenna array 430 into the IF signal through down conversion, and may transfer the IF signal to the IFIC.

The PMIC 454 may be disposed on the other partial area (e.g., second surface) of the printed circuit board 410, being spaced apart from the antenna array 430. The PMIC may be supplied with a voltage from the main PCB (not illustrated), and may provide a necessary power to various elements (e.g., RFIC 452) on the antenna module.

The shielding member 490 may be disposed on a part (e.g., second surface) of the printed circuit board 410 to electromagnetically shield at least one of the RFIC 452 or the PMIC 454. According to an embodiment, the shielding member 490 may include a shield can.

Although not illustrated, according to various embodiments, the third antenna module 246 may be electrically connected to the other printed circuit board (e.g., main circuit board) through a module interface. The module interface may include a connection member, for example, a coaxial cable connector, a board-to-board connector, an interposer, or a flexible printed circuit board (FPCB). The RFIC 452 and/or the PMIC 454 of the antenna module may be electrically connected to the printed circuit board through the connection member.

Figure 4B:
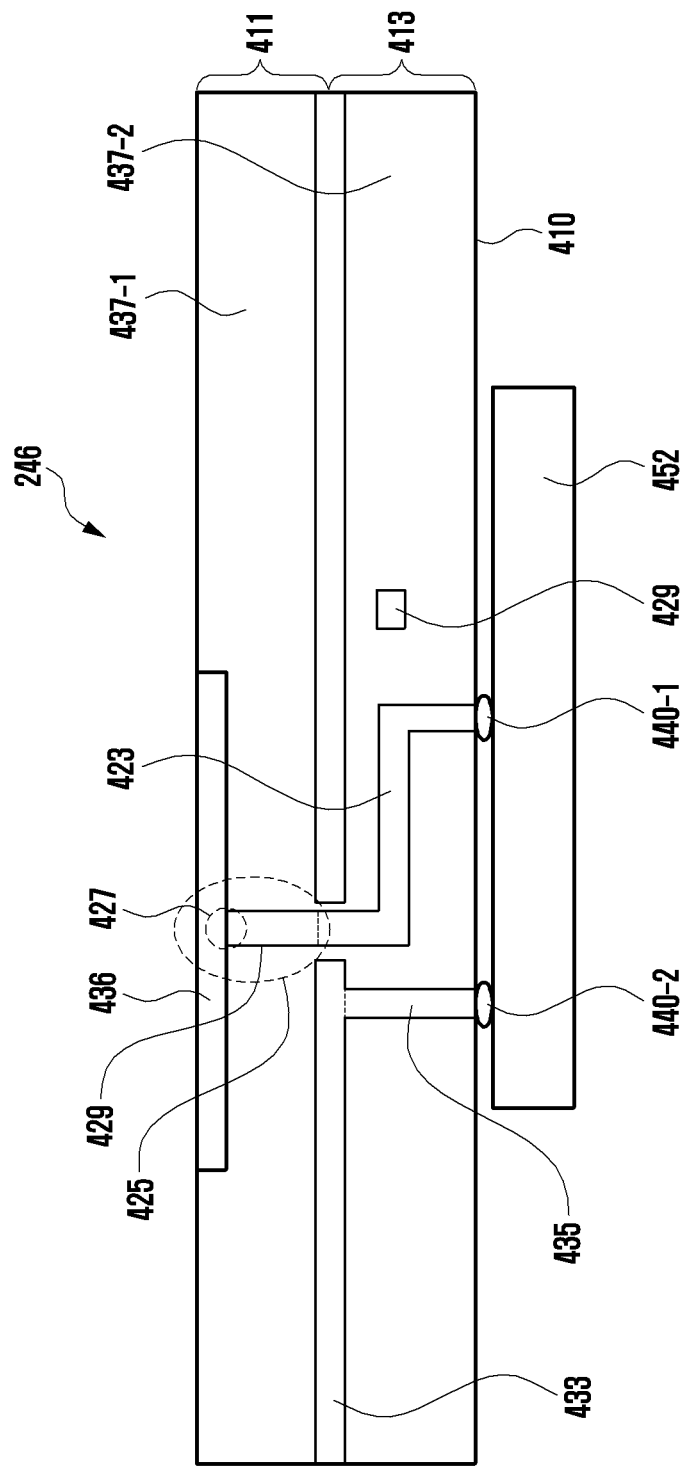
FIG. 4B is a cross sectional view taken along line Y-Y' of a third antenna module illustrated in FIG. 4A according to various embodiments.

FIG. 4B is a cross sectional view taken along line Y-Y' of a third antenna module 246 illustrated in (a) of FIG. 4A according to various embodiments. In the illustrated embodiment, a printed circuit board 410 may include an antenna layer 411 and a network layer 413.

With reference to FIG. 4B, the antenna layer 411 may include at least one dielectric layer 437-1, an antenna element 436 formed on the external surface or inside of the dielectric layer 437-1, and/or a feeder part 425. The feeder part 425 may include a feeder point 427 and/or a feeder line 429.

The network layer 413 may include at least one dielectric layer 437-2, at least one ground layer 433 formed on the external surface or inside of the dielectric layer 437-1, at least one conductive via 435, a transmission line 423, and/or a signal line 429.

In addition, in the illustrated embodiment, the RFIC 452 (e.g., third RFIC 226 of FIG. 2) illustrated in (c) of FIG. 4A, may be electrically connected to the network layer 413 through, for example, first and second connection parts (solder bumps) 440-1 and 440-2. In other embodiments, various connection structures (e.g., soldering or BGA) may be used instead of the connection parts. The RFIC 452 may be electrically connected to the antenna element 436 through the first connection part 440-1, the transmission line 423, and the feeder part 425. Also, the RFIC 452 may be electrically connected to the ground layer 433 through the second connection part 440-2 and the conductive via 435. Although not illustrated, the RFIC 452 may also be electrically connected to the above-described module interface through the signal line 429.

Figure 5:
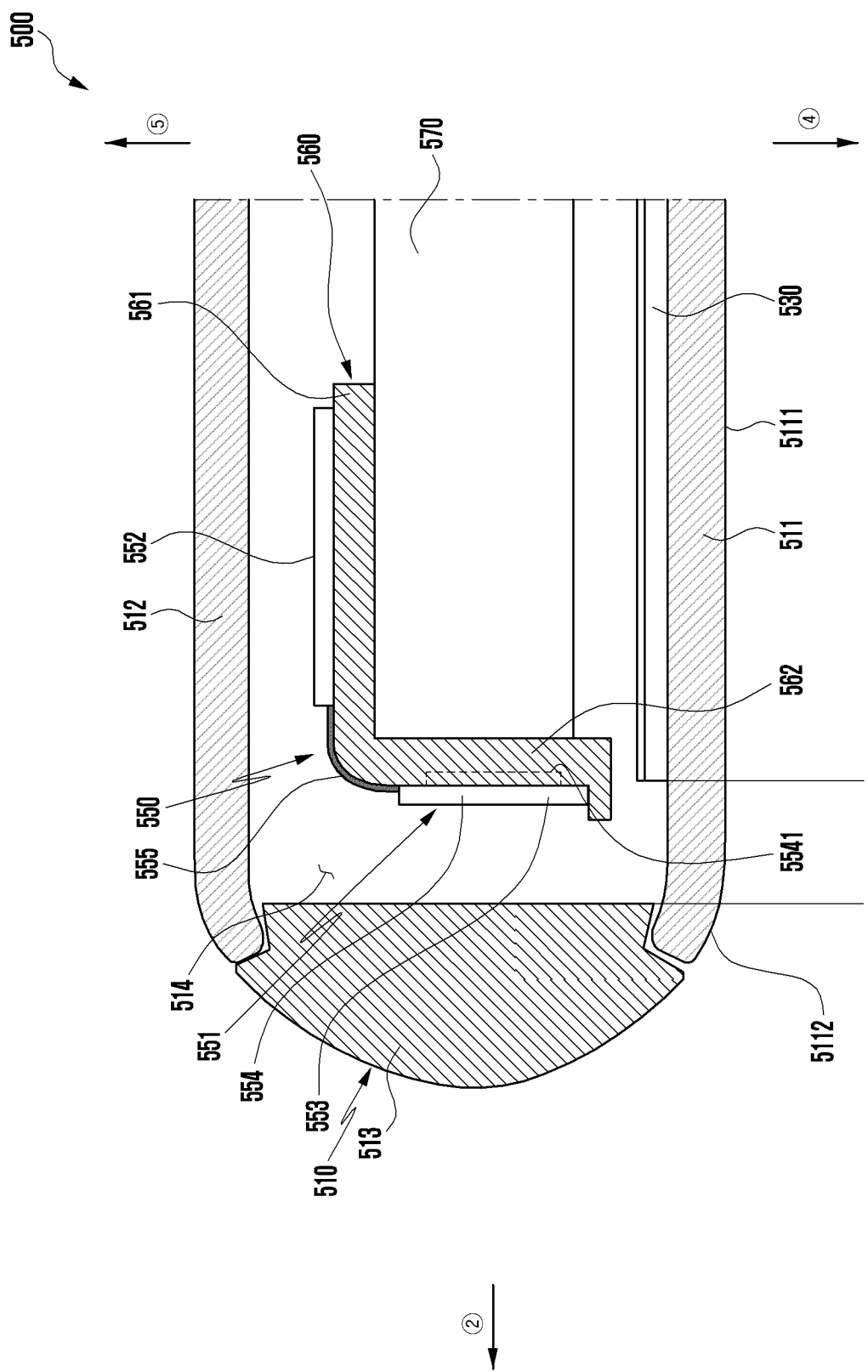
FIG. 5 is a cross-sectional view of an electronic device according to various embodiments.

FIG. 5 is a cross-sectional view of an electronic device 500 according to various embodiments. As an example, the electronic device 500 of FIG. 5 may be at least partly similar to the electronic device 101 of FIG. 1 or the electronic device 300 of FIG. 3A, or may include other embodiments of the electronic device.

With reference to FIG. 5, the electronic device 500 may include a housing 510 including a first plate 511 directed to a first direction (direction ④) (e.g., direction z of FIG. 3A), a second plate 512 directed to a second direction (direction ⑤) (e.g., direction –z of FIG. 3A) opposite to the first plate 511, and a side member 513 surrounding a space 514 between the first plate 511 and the second plate 512. According to an embodiment, the first plate 511 may include a flat part 5111 and a curved part 5112 being bent from the flat part 5111 and extending up to the side member 513. According to an embodiment, although not illustrated, the second plate 512 may also include a flat part and a curved part being bent from the flat part and extending up to the side member 513. According to an embodiment, the electronic device 500 may include a display 530 disposed in the inner space 514. For example, the display 530 may include a touch screen display. For example, the display 530 may be disposed so that the display 530 can be seen from an outside through at least a partial area of the first plate 511.

According to various embodiments, the electronic device 500 may include an antenna module 550 disposed in the inner space 514. According to an embodiment, the antenna module 550 may include an antenna structure 551 disposed in the inner space 514 of the electronic device 500. According to an embodiment, the antenna structure 551 may include a first substrate (e.g., substrate) 552, a second substrate (e.g., printed circuit board) 554 disposed spaced apart from the first substrate 552, and a conductive cable 555 (e.g., flexible printed circuit board (FPCB)) disposed to electrically connect the first substrate 552 and the second substrate 554 to each other. According to an embodiment, the first substrate 552 may include a plurality of antenna elements (e.g., antenna elements 6001, 6002, 6003, or 6004 of FIG. 6) to be described later. According to an embodiment, the second substrate 554 may include a plurality of antenna elements (e.g., antenna elements 6101, 6102, 6103, or 6104 of FIG. 6) to be described later. According to an embodiment, the second substrate 554 may include a wireless communication circuit 5541 (e.g., RFIC and/or PMIC) disposed on at least one surface thereof. According to an embodiment, the wireless communication circuit 5541 may be configured to transmit and/or receive a radio frequency signal in the range of about 3 to 100 GHz through the antenna structure 551.

According to various embodiments, the antenna module 550 may be supported through a support member 560 disposed in the inner space 514 of the electronic device 500. According to an embodiment, the support member 560 may be formed of a dielectric material (e.g., polycarbonate (PC)) or a conductive material (e.g., metal), and may be formed in various types in accordance with the disposal structure of the antenna structure 551. According to an embodiment, the antenna structure 551 may help to improve the radiation performance by providing a gap distance from a conductive electronic element 570 (e.g., speaker device or microphone device) disposed in the neighborhood through the dielectric material. According to an embodiment, the support member 560 may include a first support part 561 supporting the first substrate 552 and a second support part 562 supporting the second substrate 554. According to an embodiment, the first support part 561 and the second support part 562 may be integrally formed.

According to various embodiments, the wireless communication circuit 5541 may be electrically connected to the antenna elements of the first substrate 552 or the antenna elements of the second substrate 554 through the conductive cable 555, and thus may form a directional beam at least partly.

Figure 6:
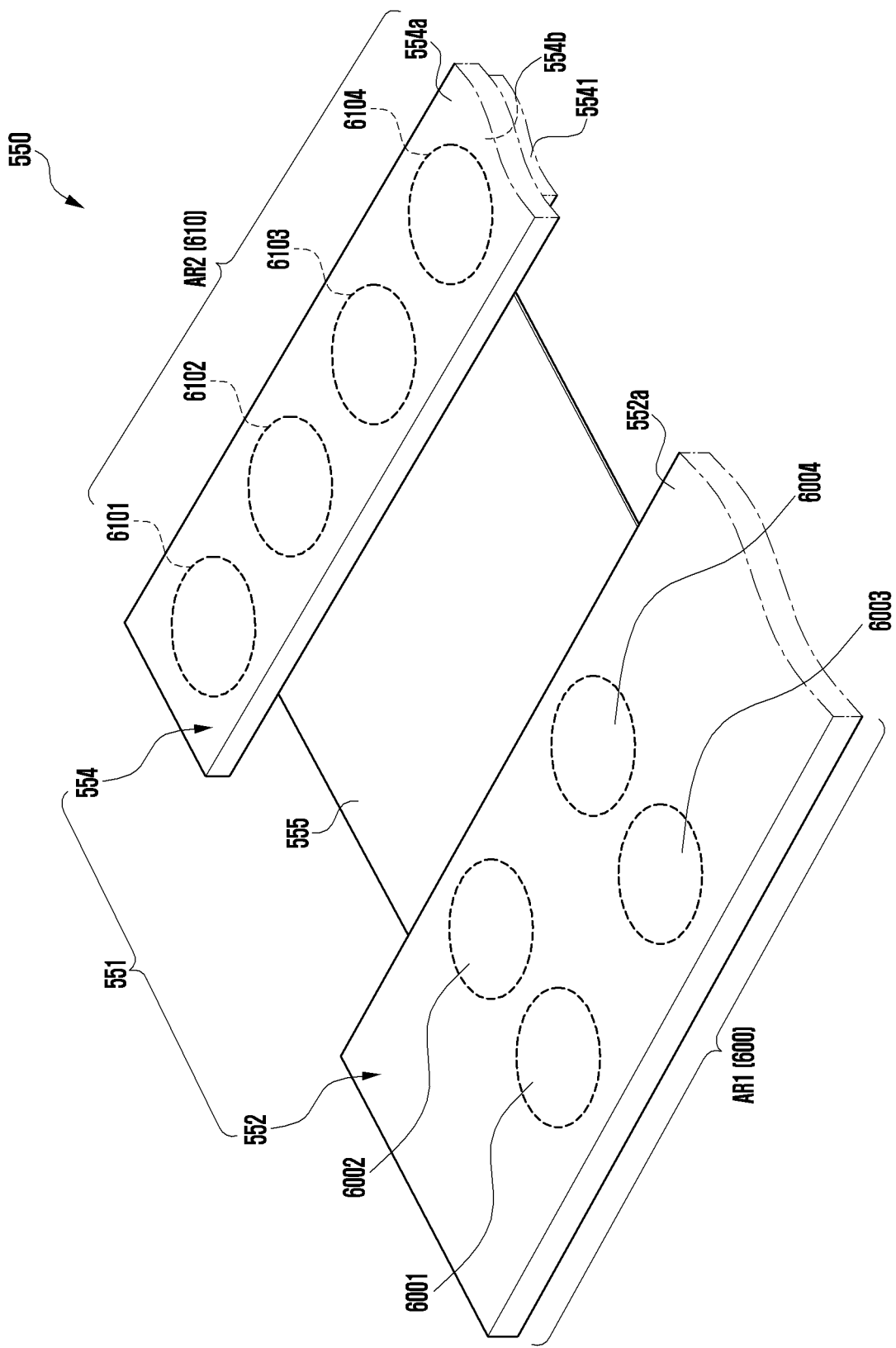
FIG. 6 is a perspective view of an antenna module of FIG. 5 according to various embodiments.

FIG. 6 is a perspective view of an antenna module 550 of FIG. 5 according to various embodiments. As an example, the antenna module 550 of FIG. 6 may be at least partly similar to the third antenna module 246 of FIG. 2, or may include other embodiments of the antenna module.

With reference to FIG. 6, the antenna module 550 may include an antenna structure 551. According to an embodiment, the antenna structure 551 may include a first substrate 552, a second substrate 554 disposed spaced apart from the first substrate 552, and a conductive cable 555 (e.g., FPCB) disposed to electrically connect the first substrate 552 and the second substrate 554 to each other. According to an embodiment, the second substrate 554 may include a wireless communication circuit 5541 disposed on at least one surface.

According to various embodiments, the first substrate 552 may include a first antenna array 600. According to an embodiment, the first antenna array 600 may include a first antenna element 6001, a second antenna element 6002, a third antenna element 6003, or a fourth antenna element 6004 disposed to form directional beams. The plurality of antenna elements 6001, 6002, 6003, or 6004 may be formed on the first surface 552a of the first substrate 552. According to another embodiment, the first antenna array 600 may be formed on the first surface 552a of the first substrate 552 or an inside thereof. According to an embodiment, the first antenna element 6001, the second antenna element 6002, the third antenna element 6003, or the fourth antenna element 6004 may include a patch antenna or a dipole antenna.

According to various embodiments, the second substrate 554 may include a second antenna array 610. According to an embodiment, the second antenna array 610 may include a fifth antenna element 6101, a sixth antenna element 6102, a seventh antenna element 6103, or an eighth antenna element 6104 disposed to form directional beams. According to an embodiment, the second substrate 554 may include a second surface 554a and a third surface 554b directed to an opposite direction to the second surface 554a. According to an embodiment, the fifth antenna element 6101, the sixth antenna element 6102, the seventh antenna element 6103, or the eighth antenna element 6104 may be formed on the second surface 554a of the second substrate 554 or an inside thereof. According to an embodiment, the wireless communication circuit 5541 may be disposed on the third surface 554b of the second substrate 554. According to an embodiment, the wireless communication circuit 5541 may be configured to transmit and/or receive a radio frequency in the range of about 3 to 100 GHz through the first antenna array 600 or the second antenna array 610. In an embodiment, the fifth antenna element 6101, the sixth antenna element 6102, the seventh antenna element 6103, or the eighth antenna element 6104 may include a patch antenna or a dipole antenna.

According to various embodiments, the antenna module 550 electrically connects the first substrate 552 and the second substrate 554 to each other through the conductive cable 555 having flexibility, and thus the disposal degree of freedom can be secured. According to an embodiment, the antenna module 550 may be disposed so that beam patterns formed by the first antenna array 600 of the first substrate 552 and the second antenna array 610 of the second substrate 554 through the conductive cable 555 have different directions. For example, the first antenna array 600 of the first substrate 552 may be disposed to form a beam pattern in the second direction (e.g., direction ⑤ of FIG. 5) in the inner space (e.g., inner space 514 of FIG. 5) of the electronic device (e.g., electronic device 500 of FIG. 5). For example, The second antenna array 610 of the second substrate 554 may be disposed to form a beam pattern in the third direction (e.g., direction ② of FIG. 5) in the inner space (e.g., inner space 514 of FIG. 5) of the electronic device (e.g., electronic device 500 of FIG. 5).

Figure 7:
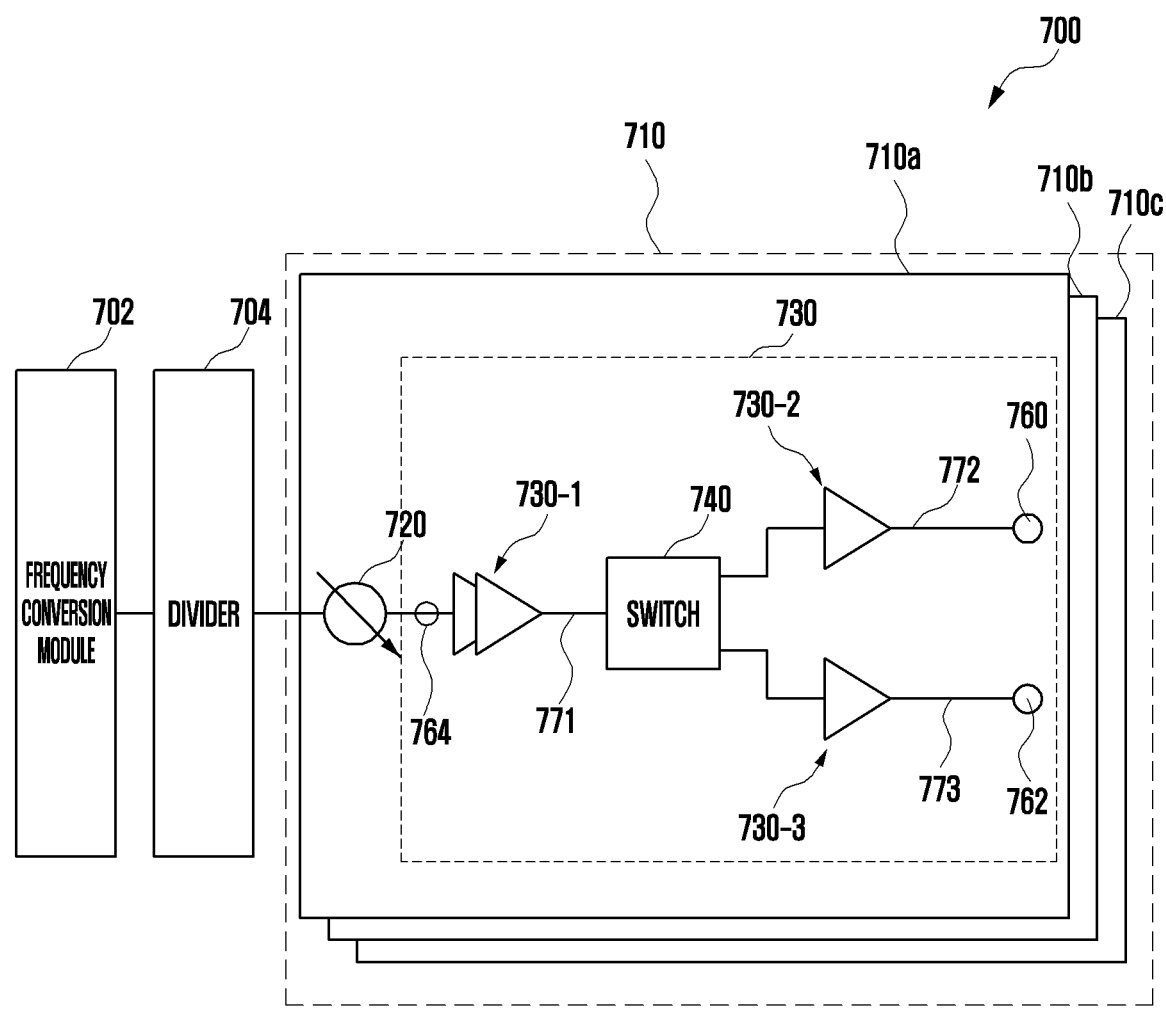
FIG. 7 is a diagram illustrating an example configuration of an RFIC according to various embodiments.

FIG. 7 is a diagram illustrating an example configuration of an RFIC according to various embodiments. As an example, the RFIC 700 of FIG. 7 may be at least partly similar to the third RFIC 226 of FIG. 2, or may include other embodiments of the RFIC.

With reference to FIG. 7, according to various embodiments, the RFIC 700 may include a frequency conversion module (e.g., including frequency conversion circuitry) 702, a divider (e.g., including dividing circuitry) 704, and/or an RFFE 710.

According to various embodiments, the frequency conversion module 702, during transmission, may include various conversion circuitry and up-convert a signal of an intermediate frequency (IF) (e.g., IF signal) provided from a processor (e.g., processor 120 of FIG. 1 or second communication processor 214 of FIG. 2) into a signal of a radio frequency (RF) (e.g., RF signal).

According to various embodiments, the divider 704, during transmission, may include various circuitry and divide the RF signal provided from the frequency conversion module 702 into a plurality of signals, and may provide the divided signals to the RFFE 710. For example, the divider 704 may provide the RF signal that is divided into a first RF chain 710a, a second RF chain 710b, and/or a third RF chain 710c of the RFFE 710 corresponding to a plurality of antenna elements (e.g., a fifth antenna element 6101, a sixth antenna element 6102, a seventh antenna element 6103, or an eighth antenna element 6104) included in an antenna array (e.g., second antenna array 610 of FIG. 6) being used for signal transmission.

According to various embodiments, the RFFE 710 may process a signal of a radio frequency band. According to an embodiment, the RFFE 710 may correspond to the third RFFE 236 of FIG. 2. According to an embodiment, the RFFE 710 may include a plurality of RF chains (e.g., a first RF chain 710*a*, a second RF chain 710*b*, and/or a third RF chain 710*c*) for processing a signal being transmitted and/or received through an antenna element (e.g., a fifth antenna element 6101, a sixth antenna element 6102, a seventh antenna element 6103, or an eighth antenna element 6104) included in an antenna array (e.g., second antenna array 610 of FIG. 6). As an example, the first RF chain 710*a*, the second RF chain 710*b*, and the third RF chain 710*c* may be substantially the same. Accordingly, hereinafter, the configuration of the first RF chain 710*a* will be described by way of non-limiting example, and the same or similar descriptions with respect to the configurations of the second RF chain 710*b* and the third RF chain 710*c* may not be repeated.

According to various embodiments, the first RF chain 710*a* may include a phase shifter 720 and/or a power amplifier 730. According to an embodiment, the phase shifter 720 may adjust and output the phase of the RF signal being input to the first RF chain 710*a*. According to an embodiment, the phase value being adjusted by the phase shifter 720 is a phase value of a signal being transmitted through an antenna element (e.g., a fifth antenna element 6101, a sixth antenna element 6102, a seventh antenna element 6103, or an eighth antenna element 6104 of FIG. 6) of an antenna array (e.g., second antenna array 610 of FIG. 6), and may be determined by a control signal. As an example, the control signal may be input from another element (e.g., processor 120).

According to various embodiments, the power amplifier 730 may include a first amplification circuit 730-1, a second amplification circuit 730-2, a third amplification circuit 730-3, and/or a switch 740. According to an embodiment, the first amplification circuit 730-1 may be located on a first electrical path 771 between an input port 764 of the power amplifier 730 (e.g., output port of the phase shifter 720) and the switch 740. As an example, the first amplification circuit 730-1 may include at least a part including a first stage among a plurality of stages included in the power amplifier 730 to amplify the power of a signal. As an example, at least a part of the power amplifier 730 including the first stage may perform amplification to increase the gain rather than the power of the signal. As an example, the first amplification circuit 730-1 may be called a drive amplifier.

According to an embodiment, the second amplification circuit 730-2 may be located on a second electrical path 772 between the switch 740 and a first output port 760 of the first RF chain 710*a*. As an example, the second amplification circuit 730-2 may include a remaining part (e.g., remaining part that is not included in the first power amplification circuit 730-1) including the last stage among the plurality of stages included in the power amplifier 730 to amplify the power of the signal. As an example, the remaining part of the power amplifier 730 including the last stage may perform amplification to increase the power rather than the gain of the signal.

According to an embodiment, the third amplification circuit 730-3 may be located on a third electrical path 773 between the switch 740 and a second output port 762 of the first RF chain 710*a*. As an example, the third amplification circuit 730-3 may include a remaining part (e.g., remaining part that is not included in the first power amplification circuit 730-1) including the last stage among the plurality of stages included in the power amplifier 730 to amplify the power of the signal. As an example, the second amplification circuit 730-2 and the third amplification circuit 730-3 may support different amplification factors or different frequency bands. As an example, the second amplification circuit 730-2 and/or the third amplification circuit 730-3 may be disposed in a first chip (e.g., complementary metal oxide semiconductor (CMOS)) in which the first amplification circuit 730-1 is disposed, or may be disposed in a second chip (e.g., compound semiconductor) being different from the first chip.

According to various embodiments, the switch 740 may selectively connect the first amplification circuit 730-1 to the second amplification circuit 730-2 or the third amplification circuit 730-3. According to an embodiment, in case of transmitting the signal through the second electrical path 772, the switch 740 may connect the first amplification circuit 730-1 to the second amplification circuit 730-2 under control of the processor (e.g., processor 120 of FIG. 1 or communication processor 212 or 214 of FIG. 2). According to an embodiment, in case of transmitting the signal through the third electrical path 773, the switch 740 may connect the first amplification circuit 730-1 to the third amplification circuit 730-3 under control of the processor (e.g., processor 120 of FIG. 1 or communication processor 212 or 214 of FIG. 2).

According to various embodiments, the electronic device (e.g., electronic device 101 of FIG. 1 or electronic device 300 of FIG. 3A) may reduce the size of the physical area of the RFFE since the second amplification circuit 730-2 and the third amplification circuit 730-3 share the first amplification circuit 730-1 (e.g., RFFE drive area or drive amplifier) and/or the phase shifter 720 as shown in FIG. 7.

According to various embodiments, the electronic device (e.g., electronic device 101 of FIG. 1 or electronic device 300 of FIG. 3A) may include the RFFE having a structure in which the first power amplifier and the second power amplifier share the phase shifter 720.

Figure 8:
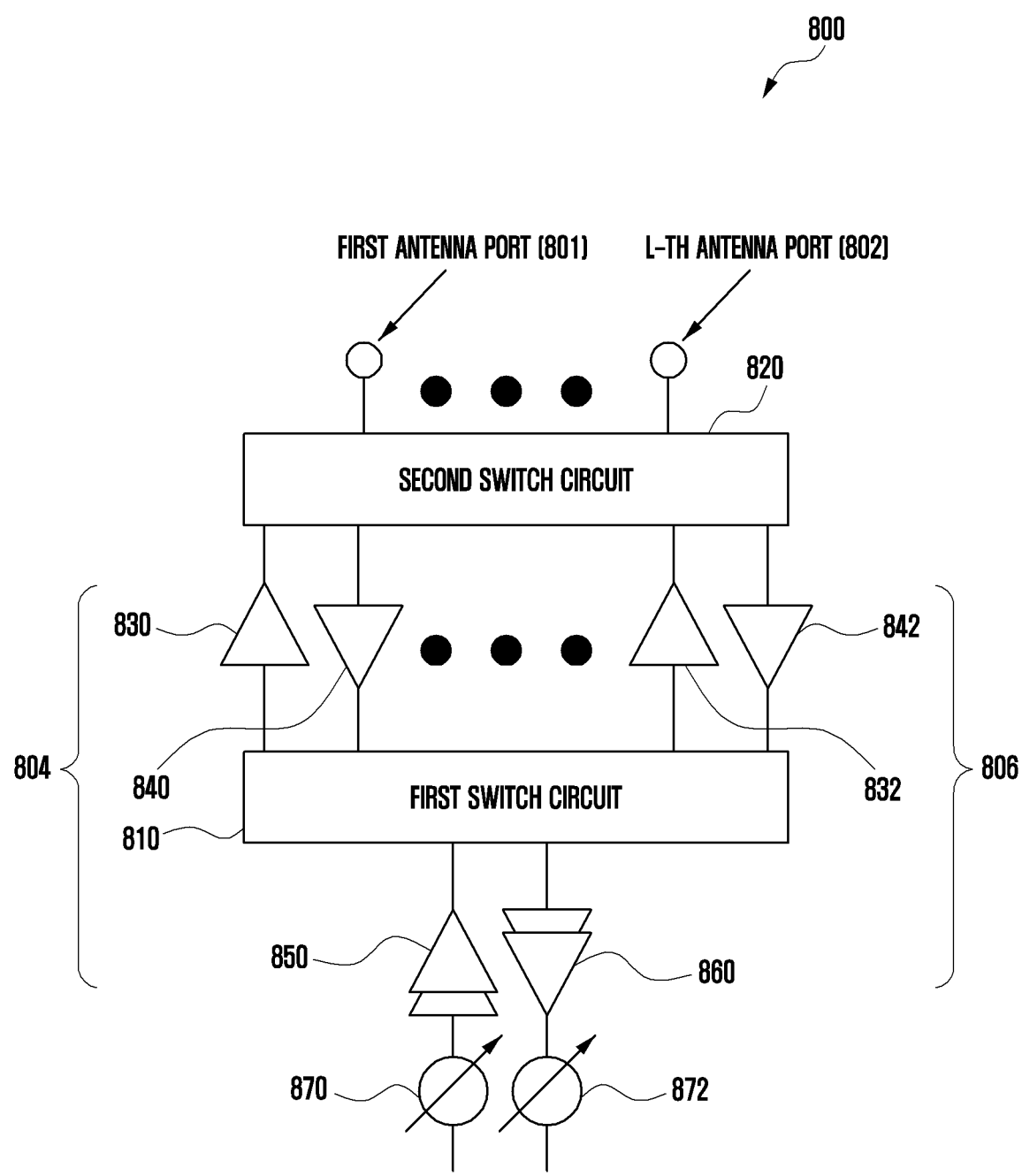
FIG. 8 is a diagram illustrating an example configuration of an RFFE according to various embodiments.

FIG. 8 is a diagram illustrating an example configuration of an RFFE 800 according to various embodiments. As an example, the RFFE 800 of FIG. 8 may be at least partly similar to the third RFFE 236 of FIG. 2, or may include other embodiments of the RFFE.

With reference to FIG. 8, according to various embodiments, the RFFE 800 (e.g., first RF chain 710*a* of the RFFE 710 of FIG. 7) may include a first switch circuit 810, a second switch circuit 820, a power amplifier (PA) 804, a low noise amplifier (LNA) 806, a first phase shifter 870, and/or a second phase shifter 872.

According to various embodiments, the power amplifier 804 (e.g., power amplifier 730 of FIG. 7) may include a first amplification circuit 850 (e.g., first amplification circuit 730-1 of FIG. 7), a second amplification circuit 830 (e.g., second amplification circuit 730-2 of FIG. 7), and/or an n-th amplification circuit 832 (e.g., third amplification circuit 730-3 of FIG. 7). According to an embodiment, the first amplification circuit 850 may include m stages including the first stage among a plurality of stages included in the power amplifier 830 to amplify the power of a signal. As an example, m may be the number of stages included in the first amplification circuit 850, and may include a positive integer being equal to or larger than 1. As an example, the first amplification circuit 850 may include at least one stage (e.g., drive stage) mainly for gain amplification of an RF signal.

As an example, the first amplification circuit 850 may be located on an electrical path between an input port 764 of the power amplifier 804 (e.g., output port of the first phase shifter 870) and the first switch circuit 810. As an example, n is the number of amplification circuits (e.g., the second amplification circuit 830 and/or the n-th amplification circuit 832) including the last stage in the power amplifier 804, and may include a positive integer being equal to or larger than 1.

According to an embodiment, the second amplification circuit 830 and/or the n-th amplification circuit 832 may include k stages including the last stage among a plurality of stages included in the power amplifier 804 to amplify the power of the signal. As an example, the k stages including the last stage may include the remaining stages excluding m stages included in the first amplification circuit 850 among the plurality of stages of the power amplifier 804. As an example, k may be the number of stages included in the second amplification circuit 830 and/or the n-th amplification circuit 832, and may include a positive integer being equal to or larger than 1. As an example, the second amplification circuit 830 and/or the n-th amplification circuit 832 may include at least one stage mainly for amplifying the power of the RF signal. As an example, the second amplification circuit 830 and/or the n-th amplification circuit 832 may be located on different electrical paths between the first switch circuit 810 and the second switch circuit 820.

According to various embodiments, the low noise amplifier 806 may include a fourth amplification circuit 860, a fifth amplification circuit 840, and/or the j-th amplification circuit 842. According to an embodiment, the fourth amplification circuit 860 may include t stages including the last stage among the plurality of stages included in the low noise amplifier 806. As an example, t may be the number of stages included in the fourth amplification circuit 860, and may include a positive integer being equal to or larger than 1. As an example, the fourth amplification circuit 860 may include at least one stage mainly for gain increase. According to an embodiment, the fourth amplification circuit 860 may be located on the electrical path between the output port of the low noise amplifier 806 (e.g., input port of the second phase shifter 872) and the first switch circuit 810.

According to an embodiment, the fifth amplification circuit 840 and/or the j-th amplification circuit 842 may include p stages including the first stage among the plurality of stages being included to decrease noise included in the signal and to increase the gain in the low noise amplifier 806. As an example, the p stages including the first stage may include the remaining stages excluding t stages included in the fourth amplification circuit 860 among the plurality of stages included in the low noise amplifier 806. As an example, p may be the number of stages included in the fifth amplification circuit 840 and/or the j-th amplification circuit 842, and may include a positive integer being equal to or larger than 1. As an example, the fifth amplification circuit 840 and/or the j-th amplification circuit 842 may include at least one stage mainly for decreasing the noise figure (NF) of the signal. As an example, the fifth amplification circuit 840 and/or the j-th amplification circuit 842 may be located on different electrical paths between the first switch circuit 810 and the second switch circuit 820. As an example, j may be the number of amplification circuits including the first stage in the low noise amplifier 806, and may include a positive integer being equal to or larger than 1.

According to various embodiments, the first switch circuit 810 (e.g., switch 740 of FIG. 7), during transmission, may selectively connect the first amplification circuit 850 of the power amplifier 804 to the second amplification circuit 830 or the n-th amplification circuit 832. According to an embodiment, the first switch circuit 810 may configure a transmission path (e.g., the second amplification circuit 830 or the n-th amplification circuit 832) on which the signal amplified by the first amplification circuit 850 is transmitted under control of the processor (e.g., the processor 120 of FIG. 1 or the communication processor 212 or 214 of FIG. 2). According to various embodiments, the first switch circuit 810, during reception, may selectively connect the fourth amplification circuit 860 of the low noise amplifier 806 to the fifth amplification circuit 840 or the j-th amplification circuit 842. According to an embodiment, the first switch circuit 810 may connect the reception path (e.g., the fifth amplification circuit 840 or the j-th amplification circuit 842) selected under the control of the processor (e.g., the processor 120 of FIG. 1 or the communication processor 212 or 214 of FIG. 2) to the fourth amplification circuit 860.

According to various embodiments, the second switch circuit 820 may connect the first antenna port 801 or the L-th antenna port 802 to the power amplifier 804 or the low noise amplifier 806. According to an embodiment, the second switch circuit 820, during transmission, may connect the first antenna port 801 or the L-th antenna port 802 to the power amplifier 804 (e.g., the second amplification circuit 830 or the n-th amplification circuit 832). For example, the second switch circuit 820, during transmission, may connect one of the first antenna port 801 or the L-th antenna port 802 to one of the second amplification circuit 830 or the n-th amplification circuit 832 of the power amplifier 804. According to an embodiment, the second switch circuit 820, during reception, may connect the first antenna port 801 or the L-th antenna port 802 to the low noise amplifier 806 (e.g., the fifth amplification circuit 840 or the j-th amplification circuit 842). For example, the second switch circuit 820, during reception, may connect one of the first antenna port 801 or the L-th antenna port 802 to one of the fifth amplification circuit 840 or the j-th amplification circuit 842 of the low noise amplifier 806. As an example, L is the number of antenna ports included in the RFFE 800, and may include a positive integer being equal to or larger than 2.

According to various embodiments, the first phase shifter 870 (e.g., the phase shifter 720 of FIG. 7) may adjust the phase of the RF signal being input to the first amplification circuit 850 of the power amplifier 804. According to various embodiments, the second phase shifter 872 may adjust the phase of the RF signal being provided from the fourth amplification circuit 860 of the low noise amplifier 804.

FIGS. 9A, 9B, 9C, and 9D are diagrams illustrating example configurations of a first switch circuit 810 of an RFFE 800 according to various embodiments. Hereinafter, explanation will be made under the assumption that the power amplifier 804 of the RFFE 800 includes two amplification circuits (e.g., n=2) including the last stage, and the low noise amplifier 806 of the RFFE 800 includes one or two amplification circuits (e.g., j=1 or 2) including the first stage. However, the number of amplification circuits including the last stage included in the power amplifier 804 and the number of amplification circuits including the first stage included in the low noise amplifier 806 are not limited thereto, and even a case including different numbers of amplification circuits may be substantially equally formed.

With reference to FIGS. 9A, 9B, 9C, and 9D, according to various embodiments, the RFFE 800 (e.g., the first RF chain 710*a* of the RFFE 710 of FIG. 7) may include a first switch circuit 810, a second switch circuit 820, a first amplification circuit 850, a second amplification circuit 830, a third amplification circuit 932 (e.g., the n-th amplification circuit 832 of FIG. 8), a fourth amplification circuit 860, a fifth amplification circuit 840, a sixth amplification circuit 942 (e.g., the j-th amplification circuit 842 of FIG. 8), a first phase shifter 870, and/or a second phase shifter 872. In the following description, the remaining internal configuration of the RFFE 800 excluding the first switch circuit 810 may operate in a similar manner to that of the internal configuration of the RFFE 800 of FIG. 8. For example, the second switch circuit 820, the first amplification circuit 850, the second amplification circuit 830, the third amplification circuit 932, the fourth amplification circuit 860, the fifth amplification circuit 840, the sixth amplification circuit 942, the first phase shifter 870 and/or the second phase shifter 872 in FIGS. 9A, 9B, 9C, and 9D may operate in a similar manner to that of the second switch circuit 820, the first amplification circuit 850, the second amplification circuit 830, the third amplification circuit 932, the fourth amplification circuit 860, the fifth amplification circuit 840, the sixth amplification circuit 942, the first phase shifter 870, and/or the second phase shifter 872 in FIG. 8. Accordingly, in order to avoid duplicate explanation with FIG. 8, detailed explanation of the remaining internal configuration of the RFFE 800 excluding the first switch circuit 810 may not be repeated.

Figure 9A:
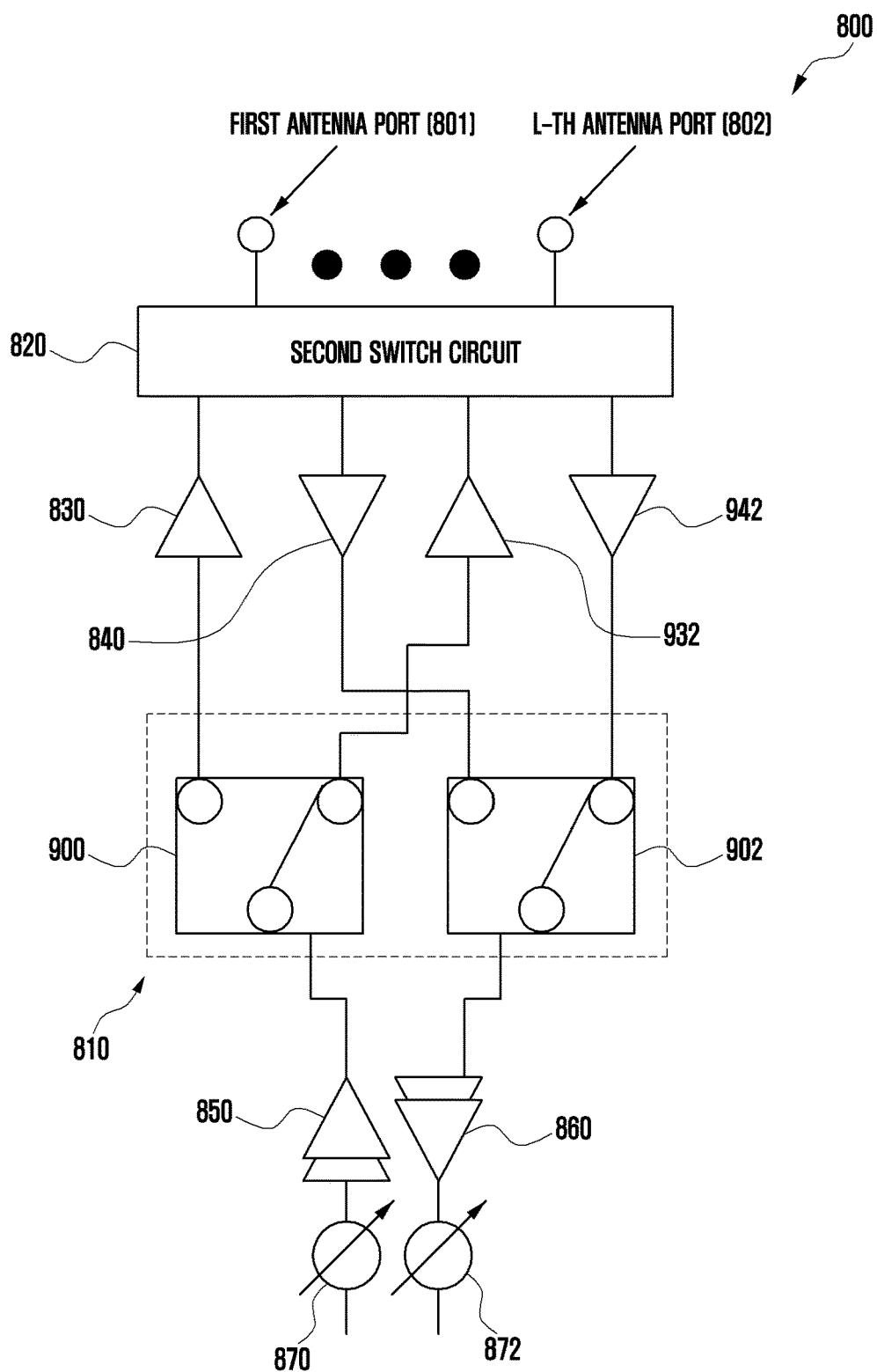
FIG. 9A is a diagram illustrating an example configuration of a first switch circuit of an RFFE according to various embodiments.
Figure 9B:
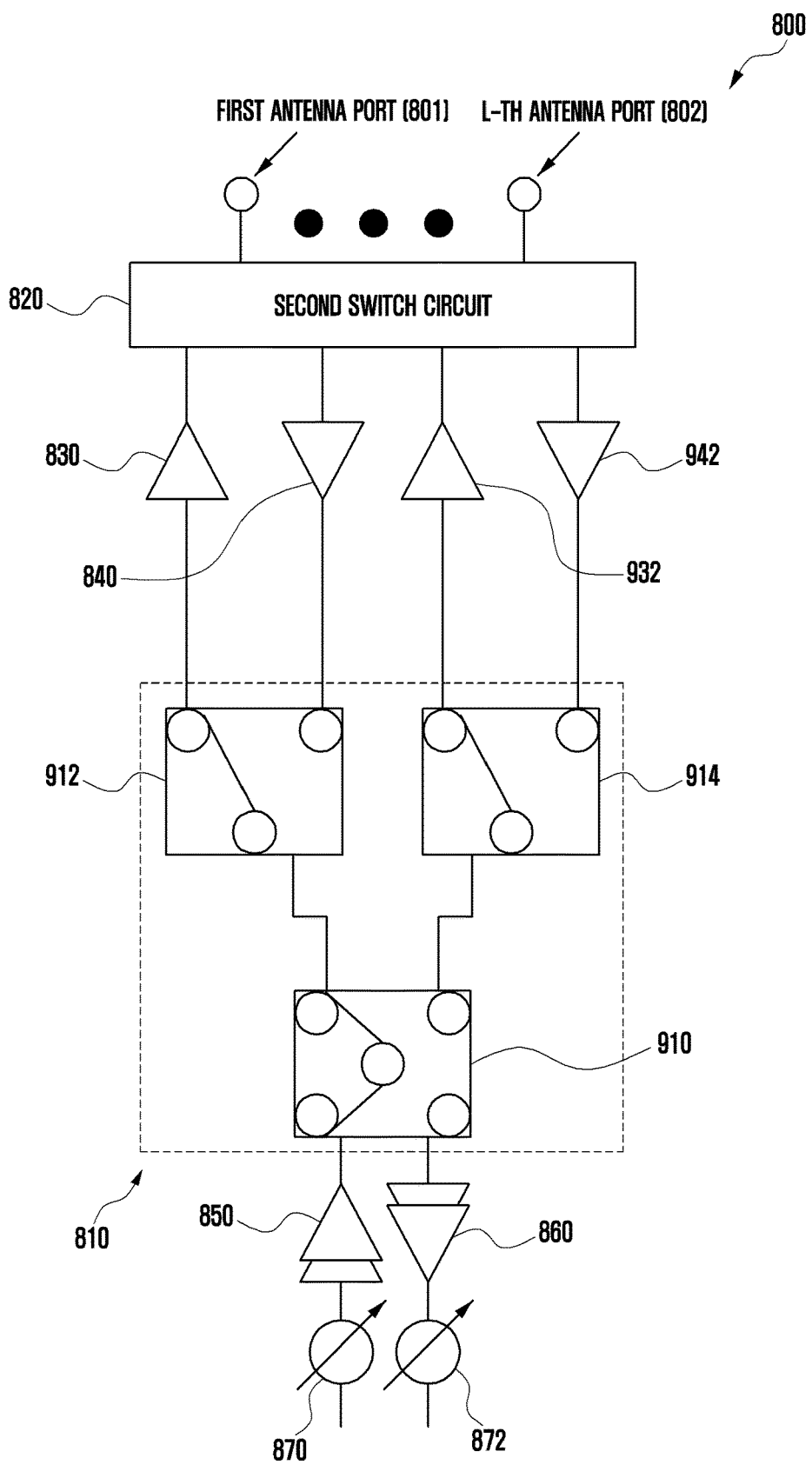
FIG. 9B is a diagram illustrating an example configuration of a first switch circuit of an RFFE according to various embodiments.
Figure 9C:
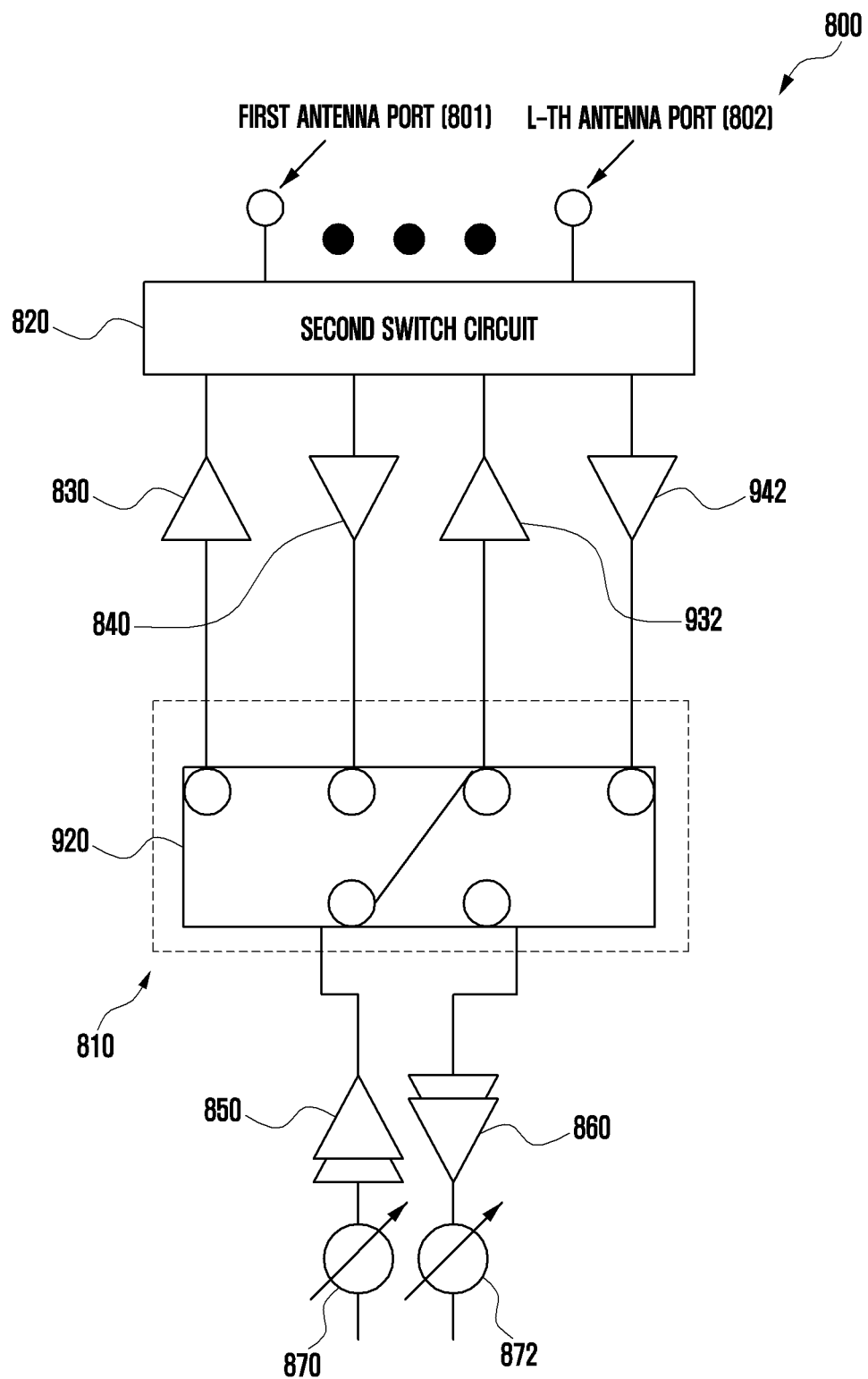
FIG. 9C is a diagram illustrating an example configuration of a first switch circuit of an RFFE according to various embodiments.

According to various embodiments, the power amplifier 804 of the RFFE 800, as illustrated in FIGS. 9A, 9B, and 9C, may include the second amplification circuit 830 or the third amplification circuit 932 including the last stage. The lower power amplifier 806 of the RFFE 800 may include the fifth amplification circuit 840 or the sixth amplification circuit 942 including the first stage.

According to various embodiments, with reference to FIG. 9A, the first switch circuit 810 may include a first switch 900 and/or a second switch 902. According to an embodiment, the first switch 900 and/or the second switch 902 may include switches of a single pole double through (SPDT) type. For example, the first switch 900 may selectively connect an output terminal of the first amplification circuit 850 of the power amplifier 804 to an input terminal of the second amplification circuit 830 or the third amplification circuit 932. For example, the second switch 902 may selectively connect the output terminal of the fifth amplification circuit 840 or the sixth amplification circuit 942 of the low noise amplifier 804 to the input terminal of the fourth amplification circuit 860.

According to various embodiments, with reference to FIG. 9B, the first switch circuit 810 may include the third switch 910, the fourth switch 912, and/or the fifth switch 914. According to an embodiment, the third switch 910 may include a switch of a double pole double through (DPDT) type. According to an embodiment, the fourth switch 912 and/or the fifth switch 914 may include SPDT type switches. For example, in case of transmitting a signal through a first transmission/reception path 952 (e.g., the second amplification circuit 830), the third switch 910 may connect the fourth switch 912 to the output terminal of the first amplification circuit 850 of the power amplifier 804. The fourth switch 912 may connect the third switch 910 to the input terminal of the second amplification circuit 830 of the power amplifier 804. As an example, the first amplification circuit 850 of the power amplifier 804 may be connected to the second amplification circuit 830 through the third switch 910 and the fourth switch 912. For example, in case of receiving the signal through the first transmission/reception path 952 (e.g., the fifth amplification circuit 840), the third switch 910 may connect the fourth switch 912 to the input terminal of the fourth amplification circuit 860 of the low noise amplifier 806. The fourth switch 912 may connect the third switch 910 to the output terminal of the fifth amplification circuit 840 of the low noise amplifier 806. As an example, the fourth amplification circuit 860 of the low noise amplifier 806 may be connected to the fifth amplification circuit 840 through the third switch 910 and the fourth switch 912. For example, in case of transmitting the signal through a second transmission/reception path 954 (e.g., the third amplification circuit 932), the third switch 910 may connect the fifth switch 914 to the output terminal of the first amplification circuit 850 of the power amplifier 804. The fifth switch 914 may connect the third switch 910 to the input terminal of the third amplification circuit 932 of the power amplifier 804. As an example, the first amplification circuit 850 of the power amplifier 804 may be connected to the third amplification circuit 932 through the third switch 910 and the fifth switch 914. For example, in case of receiving the signal through the second transmission/reception path 954 (e.g., the sixth amplification circuit 942), the third switch 910 may connect the fifth switch 914 to the input terminal of the fourth amplification circuit 860 of the low noise amplifier 806. The fifth switch 914 may connect the third switch 910 to the output terminal of the sixth amplification circuit 942 of the low noise amplifier 806. As an example, the fourth amplification circuit 860 of the low noise amplifier 806 may be connected to the sixth amplification circuit 942 through the third switch 910 and the fifth switch 914. For example, the first transmission/reception path 952 may include the second amplification circuit 830 of the power amplifier 804 and/or the fifth amplification circuit 840 of the low noise amplifier 806. For example, the second transmission/reception path 954 may include a third amplifying circuit 932 of the power amplifier 804 and/or a sixth amplifying circuit 942 of the low noise amplifier 806.

According to various embodiments, with reference to FIG. 9C, the first switch circuit 810 may include a sixth switch 920 for connection of a transmission path or a reception path of an antenna port for transmission and/or reception of the signal. According to an embodiment, the sixth switch 920 may include a switch of a double pole 4 through (DP4T) type. For example, in case of transmitting the signal, the sixth switch 920 may selectively connect the output terminal of the first amplification circuit 850 of the power amplifier 804 to the input terminal of the second amplification circuit 830 or the third amplification circuit 932. For example, in case of receiving the signal, the sixth switch 920 may selectively connect the input terminal of the fourth amplification circuit 860 of the low noise amplifier 806 to the output terminal of the fifth amplification circuit 840 or the sixth amplification circuit 942.

Figure 9D:
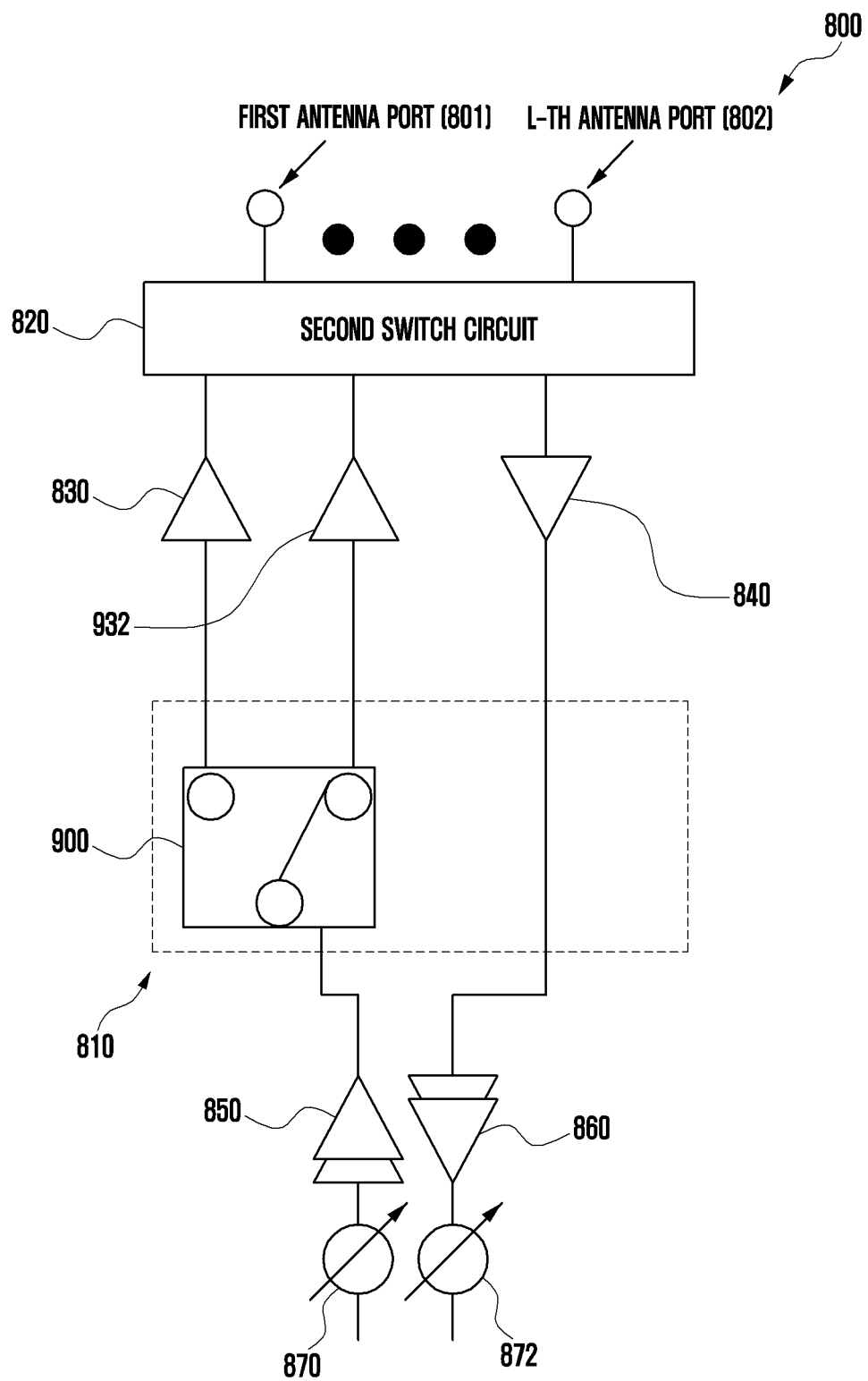
FIG. 9D is a diagram illustrating an example configuration of a first switch circuit of an RFFE according to various embodiments.

According to various embodiments, with reference to FIG. 9D, the power amplifier 804 of the RFFE 800 may include the second amplification circuit 830 or the third amplification circuit 932 including the last stage. The low noise amplifier 806 of the RFFE 800 may include the fifth amplification circuit 840 including the first stage.

According to various embodiments, with reference to FIG. 9D, the first switch circuit 810 may include the first switch 900 connecting the output terminal of the first amplification circuit 850 to the input terminal of the second amplification circuit 830 or the third amplification circuit 932 (e.g., the n-th amplification circuit 832 of FIG. 8). For example, in case of transmitting the signal, the first switch 900 may selectively connect the output terminal of the first amplification circuit 850 of the power amplifier 804 to the input terminal of the second amplification circuit 830 or the third amplification circuit 932. As an example, the first switch 900 may include a SPDT type switch.

Figure 10A:
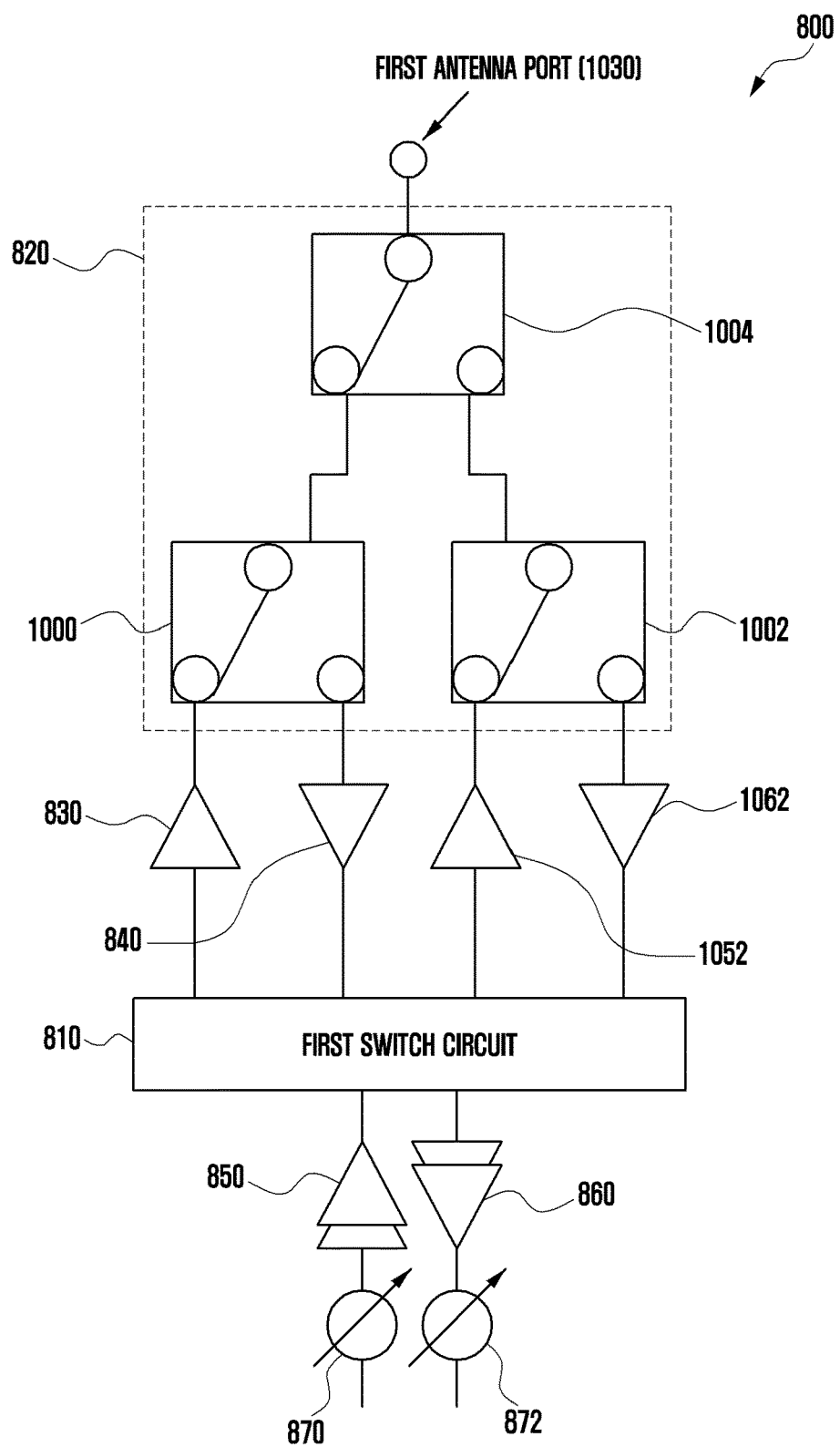
FIG. 10A is a diagram illustrating an example configuration of a second switch circuit of an RFFE for connection to one antenna port according to various embodiments.
Figure 10B:
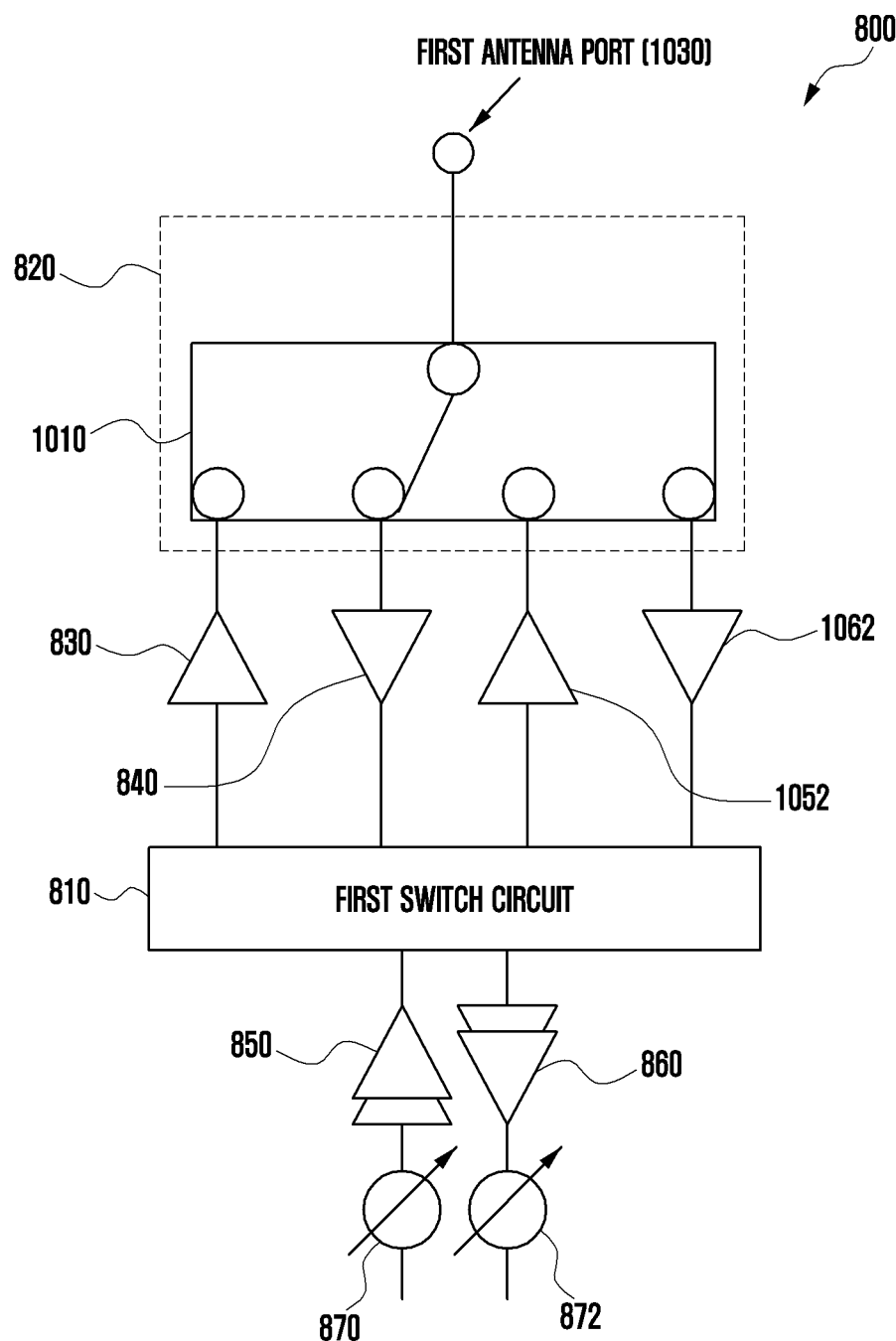
FIG. 10B is a diagram illustrating an example configuration of a second switch circuit of an RFFE for connection to one antenna port according to various embodiments.
Figure 10C:
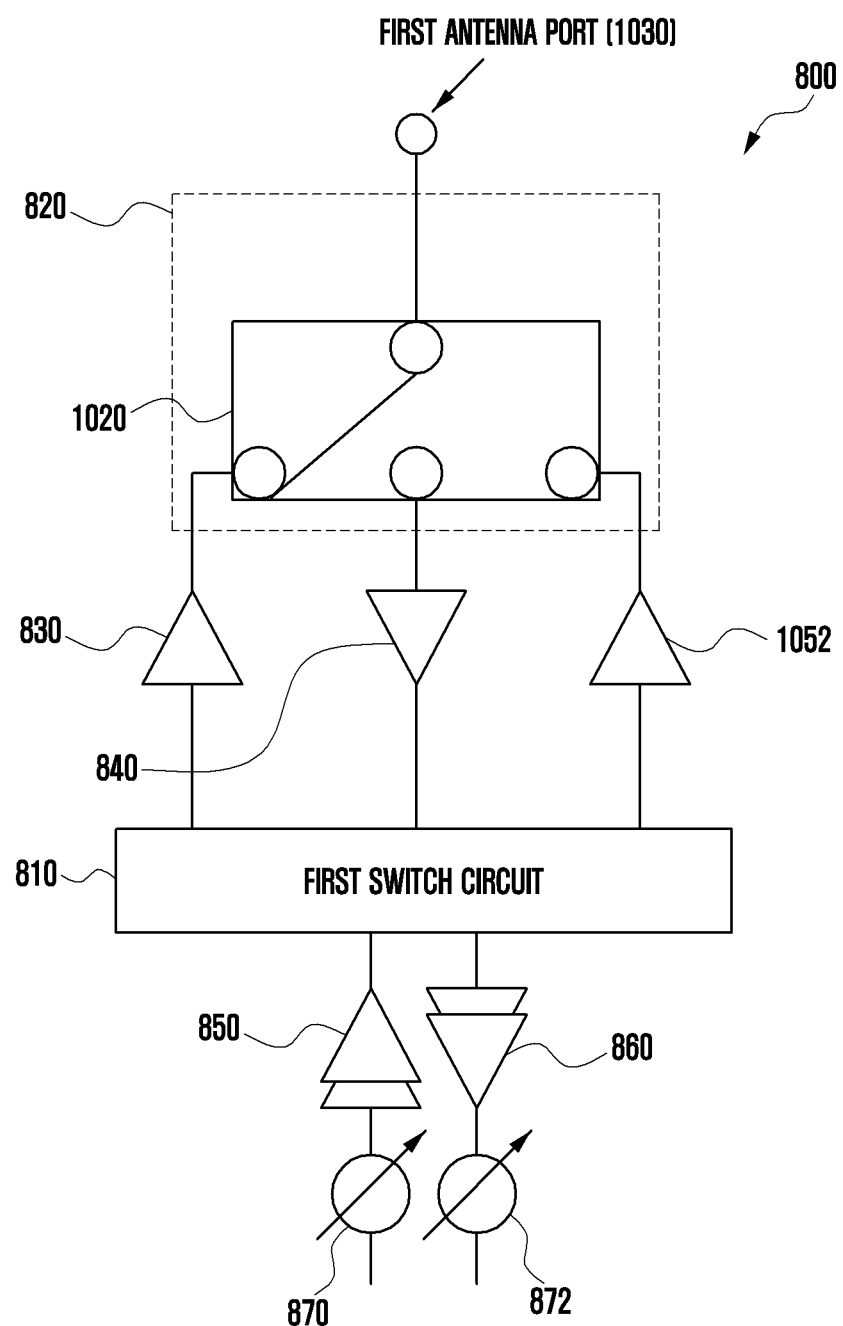
FIG. 10C is a diagram illustrating an example configuration of a second switch circuit of an RFFE for connection to one antenna port according to various embodiments.

FIGS. 10A, 10B, and 10C are diagrams illustrating example configurations of a second switch circuit 820 of an RFFE 800 for connection to one antenna port 1030 according to various embodiments. Hereinafter, explanation will be made under the assumption that the power amplifier 804 of the RFFE 800 includes two amplification circuits (e.g., n=2) including the last stage, and the low noise amplifier 806 of the RFFE 800 includes one or two amplification circuits (e.g., j=1 or 2) including the first stage. However, the number of amplification circuits including the last stage included in the power amplifier 804 and the number of amplification circuits including the first stage included in the low noise amplifier 806 are not limited thereto, and even a case including different numbers of amplification circuits may be substantially equally formed.

With reference to FIGS. 10A, 10B, and 10C, according to various embodiments, the RFFE 800 (e.g., the first RF chain 710a of the RFFE 710 of FIG. 7) may include a first switch circuit 810, a second switch circuit 820, a first amplification circuit 850, a second amplification circuit 830, a third amplification circuit 1052 (e.g., the n-th amplification circuit 832 or the third amplification circuit 932), a fourth amplification circuit 860, a fifth amplification circuit 840, a sixth amplification circuit 1062 (e.g., the j-th amplification circuit 842 or the sixth amplification circuit 942), a first phase shifter 870, and/or a second phase shifter 872. In the following description, the remaining internal configuration of the RFFE 800 excluding the second switch circuit 820 may operate in a similar manner to that of the internal configuration of the RFFE 800 of FIG. 8. For example, the first switch circuit 810, the first amplification circuit 850, the second amplification circuit 830, the third amplification circuit 1052, the fourth amplification circuit 860, the fifth amplification circuit 840, the sixth amplification circuit 1062, the first phase shifter 870, and/or the second phase shifter 872 in FIGS. 10A, 10B, and 10C may operate in a similar manner to that of the first switch circuit 810, the first amplification circuit 850, the second amplification circuit 830, the third amplification circuit 1052, the fourth amplification circuit 860, the fifth amplification circuit 840, the sixth amplification circuit 1062, the first phase shifter 870, and/or the second phase shifter 872 in FIG. 8. Accordingly, in order to avoid duplicate explanation with FIG. 8, detailed explanation of the remaining internal configuration of the RFFE 800 excluding the second switch circuit 820 may not be repeated.

According to various embodiments, the power amplifier 804 of the RFFE 800, as illustrated in FIGS. 10A and 10B, may include the second amplification circuit 830 or the third amplification circuit 1052 including the last stage. The lower power amplifier 806 of the RFFE 800 may include the fifth amplification circuit 840 or the sixth amplification circuit 1062 including the first stage.

According to various embodiments, with reference to FIG. 10A, the second switch circuit 820 may include a seventh switch 1000, an eighth switch 1002, and/or a ninth switch 1004 for connecting at least one of a plurality of transmission paths or at least one of a plurality of reception paths of the RFFE 800 to a first antenna port 1030 (e.g., the first antenna port 801 or the L-th antenna port 802 of FIG. 8). According to an embodiment, the ninth switch 1004 may selectively connect the first antenna port 1030 to the seventh switch 1000 or the eighth switch 1002. According to an embodiment, the seventh switch 1000 may selectively connect the ninth switch 1004 to the fifth amplification circuit 840 of the low noise amplifier 806 or the second amplification circuit 830 of the power amplifier 804. According to an embodiment, the eighth switch 1002 may selectively connect the ninth switch 1004 to the third amplification circuit 1052 of the power amplifier 804 or the sixth amplification circuit 1062 of the low noise amplifier 806. For example, in case that the second amplification circuit 830 of the power amplifier 804 is used to transmit the signal, the second switch circuit 820 may connect the output terminal of the second amplification circuit 830 to the first antenna port 1030 through the seventh switch 1000 and the ninth switch 1004. For example, in case that the third amplification circuit 1052 of the power amplifier 804 is used to transmit the signal, the second switch circuit 820 may connect the output terminal of the third amplification circuit 1052 to the first antenna port 1030 through the eighth switch 1002 and the ninth switch 1004. For example, in case that the fifth amplification circuit 840 of the low noise amplifier 806 is used to receive the signal, the second switch circuit 820 may connect the input terminal of the fifth amplification circuit 840 to the first antenna port 1030 through the seventh switch 1000 and the ninth switch 1004. For example, in case that the sixth amplification circuit 1062 of the low noise amplifier 806 is used to receive the signal, the second switch circuit 820 may connect the input terminal of the sixth amplification circuit 1062 to the first antenna port 1030 through the eighth switch 1002 and the ninth switch 1004. As an example, the seventh switch 1000, the eighth switch 1002, and/or the ninth switch 1004 may include SPDT type switches.

According to various embodiments, with reference to FIG. 10B, the second switch circuit 820 may include a tenth switch 1010 for connecting at least one of a plurality of transmission paths or at least one of a plurality of reception paths of the RFFE 800 to the first antenna port 1030. According to an embodiment, the tenth switch 1010 may include a switch of a single pole 4 through (SP4T) type. For example, in case that the second amplification circuit 830 of the power amplifier 804 is used to transmit the signal, the tenth switch 1010 may connect the output terminal of the second amplification circuit 830 to the first antenna port 1030. For example, in case that the third amplification circuit 1052 of the power amplifier 804 is used to transmit the signal, the tenth switch 1010 may connect the output terminal of the third amplification circuit 1052 to the first antenna port 1030. For example, in case that the fifth amplification circuit 840 of the low noise amplifier 806 is used to receive the signal, the tenth switch 1010 may connect the input terminal of the fifth amplification circuit 840 to the first antenna port 1030. For example, in case that the sixth amplification circuit 1062 of the low noise amplifier 806 is used to receive the signal, the tenth switch 1010 may connect the input terminal of the sixth amplification circuit 1062 to the first antenna port 1030.

According to various embodiments, with reference to FIG. 10C, the power amplifier 804 of the RFFE 800 may include the second amplification circuit 830 or the third amplification circuit 1052 including the last stage. The low noise amplifier 806 of the RFFE 800 may include the fifth amplification circuit 840 including the first stage.

According to various embodiments, with reference to FIG. 10C, the second switch circuit 820 may include an eleventh switch 1020 for connecting at least one of a plurality of transmission paths or a reception path of the RFFE 800 to the first antenna port 1030. According to an embodiment, the eleventh switch 1020 may include a switch of a single pole 3 through (SP3T) type. For example, the eleventh switch 1020, during transmission, may selectively connect the output terminal of the second amplification circuit 830 or the third amplification circuit 1052 of the power amplifier 804 to the first antenna port 1030. For example, the eleventh switch 1020, during reception, may connect the input terminal of the fifth amplification circuit 840 of the low noise amplifier 806 to the first antenna port 1030.

FIGS. 11A, 11B, 11C, and 11D are diagrams illustrating example configurations of a second switch circuit 820 of an RFFE 800 for connection to two antenna ports 1140 and/or 1142 according to various embodiments. Hereinafter, explanation will be made under the assumption that the power amplifier 804 of the RFFE 800 includes two amplification circuits (e.g., n=2) including the last stage, and the low noise amplifier 806 of the RFFE 800 includes one or two amplification circuits (e.g., j=1 or 2) including the first stage. However, the number of amplification circuits including the last stage included in the power amplifier 804 and the number of amplification circuits including the first stage included in the low noise amplifier 806 are not limited thereto, and even a case including different numbers of amplification circuits may be substantially equally formed.

With reference to FIGS. 11A, 11B, 11C, and 11D, according to various embodiments, the RFFE 800 (e.g., the first RF chain 710*a* of the RFFE 710 of FIG. 7) may include a first switch circuit 810, a second switch circuit 820, a first amplification circuit 850, a second amplification circuit 830, a third amplification circuit 1152 (e.g., the n-th amplification circuit 832 or the third amplification circuit 932 or 1052), a fourth amplification circuit 860, a fifth amplification circuit 840, a sixth amplification circuit 1162 (e.g., the j-th amplification circuit 842 or the sixth amplification circuit 942 or 1062), a first phase shifter 870, and/or a second phase shifter 872. In the following description, the remaining internal configuration of the RFFE 800 excluding the second switch circuit 820 may operate in a similar manner to that of the internal configuration of the RFFE 800 of FIG. 8. For example, the first switch circuit 810, the first amplification circuit 850, the second amplification circuit 830, the third amplification circuit 1152, the fourth amplification circuit 860, the fifth amplification circuit 840, the sixth amplification circuit 1162, the first phase shifter 870, and/or the second phase shifter 872 in FIGS. 11A, 11B, 11C. and 11D may operate in a similar manner to that of the first switch circuit 810, the first amplification circuit 850, the second amplification circuit 830, the third amplification circuit 1152, the fourth amplification circuit 860, the fifth amplification circuit 840, the sixth amplification circuit 1162, the first phase shifter 870, and/or the second phase shifter 872 in FIG. 8. Accordingly, in order to avoid duplicate explanation with FIG. 8, detailed explanation of the remaining internal configuration of the RFFE 800 excluding the second switch circuit 820 may not be repeated.

Figure 11A:
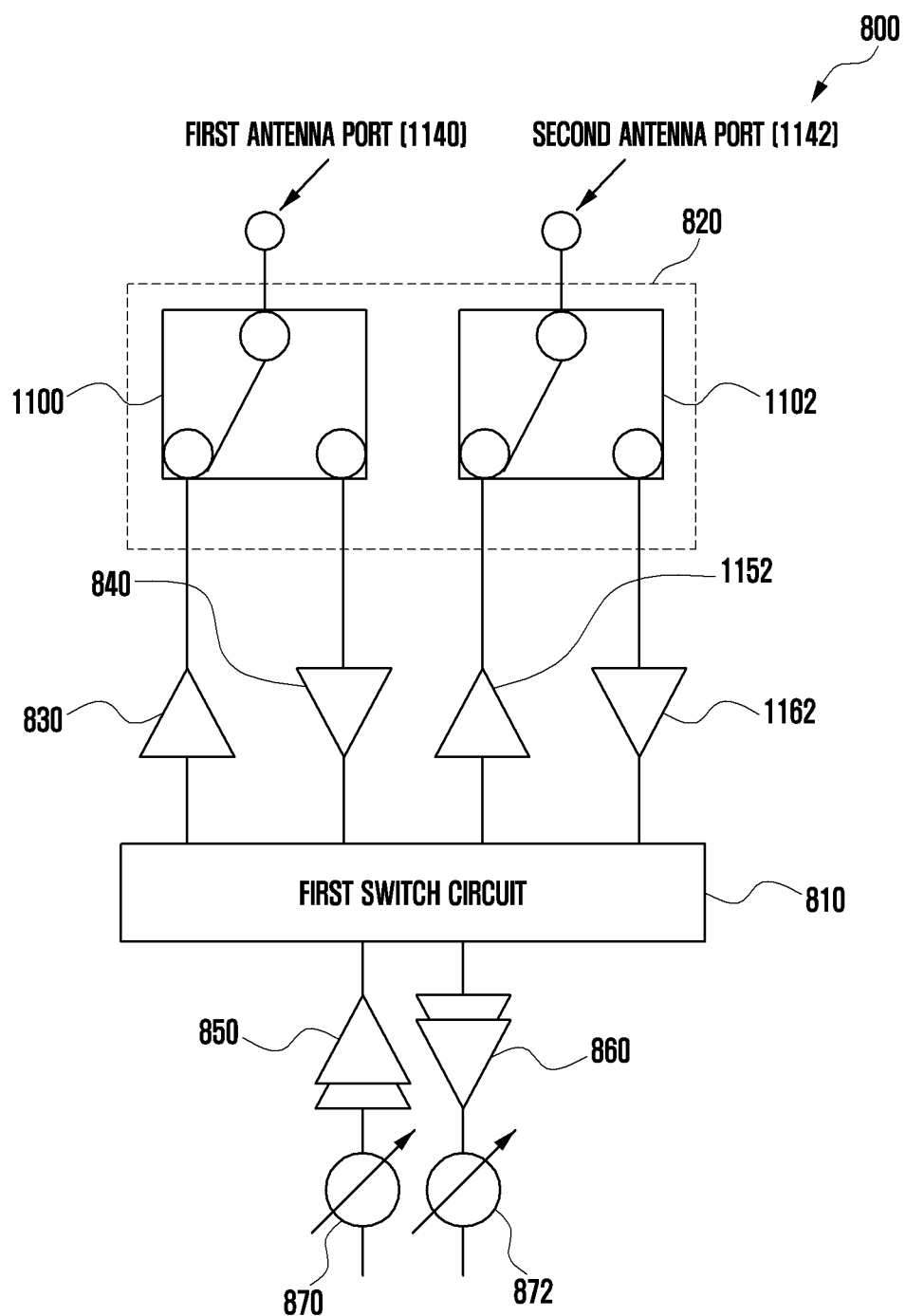
FIG. 11A is a diagram illustrating an example configuration of a second switch circuit of an RFFE for connection to two antenna ports according to various embodiments.
Figure 11B:
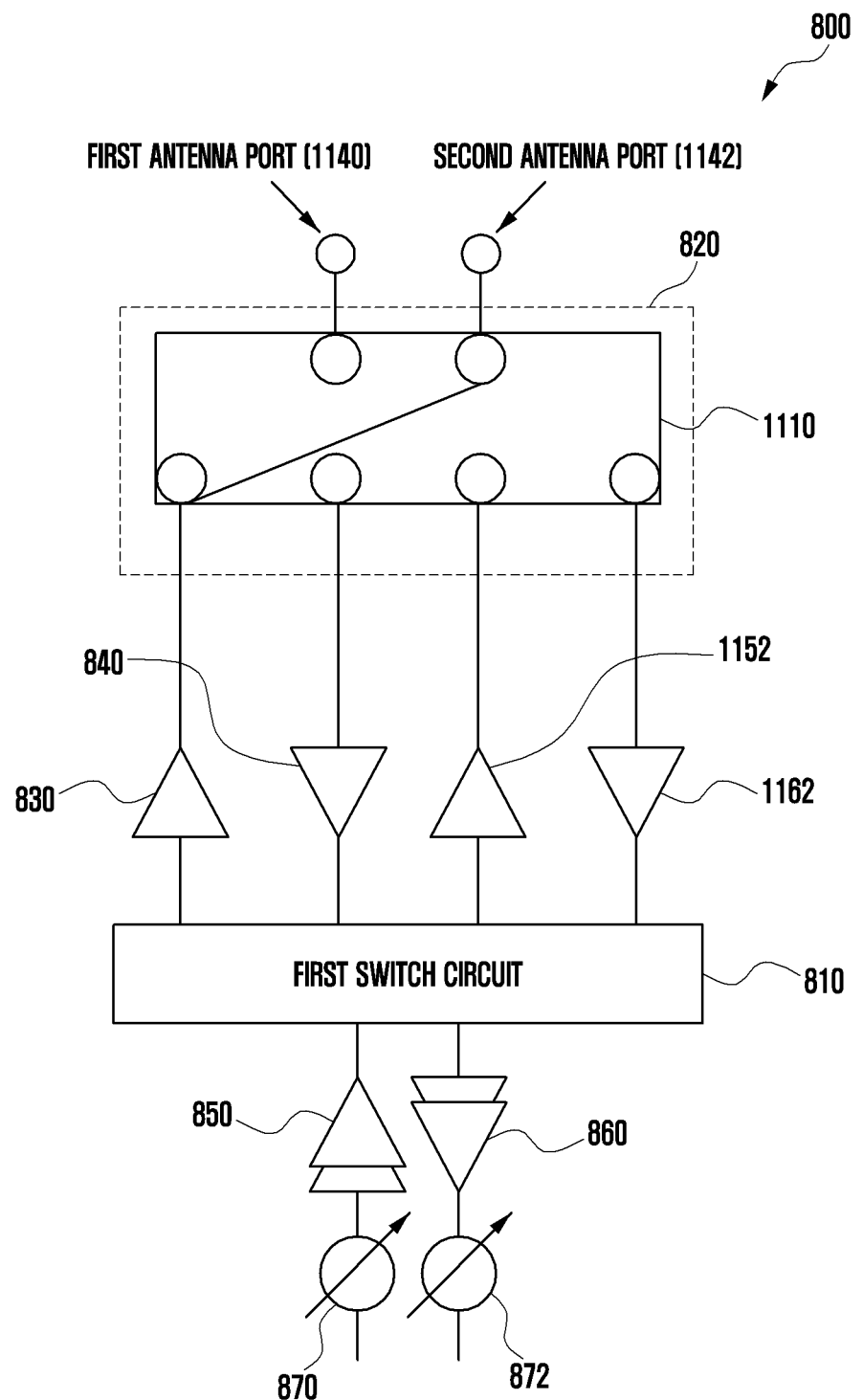
FIG. 11B is a diagram illustrating an example configuration of a second switch circuit of an RFFE for connection to two antenna ports according to various embodiments.

According to various embodiments, the power amplifier 804 of the RFFE 800, as illustrated in FIGS. 11A and 11B, may include the second amplification circuit 830 or the third amplification circuit 1152 including the last stage. The lower power amplifier 806 of the RFFE 800 may include the fifth amplification circuit 840 or the sixth amplification circuit 1162 including the first stage.

According to various embodiments, with reference to FIG. 11A, the second switch circuit 820 may include a twelfth switch 1100 and/or a thirteenth switch 1102 for connecting a transmission path or a reception path to the first antenna port 1140 (e.g., the first antenna port 801 of FIG. 8) and/or the second antenna port 1142 (e.g., the L-th antenna port 802 of FIG. 8). According to an embodiment, the twelfth switch 1100 and/or the thirteenth switch 1102 may include SPDT type switches. For example, in case of transmitting the signal through the first antenna port 1140, the twelfth switch 1100 may connect the output terminal of the second amplification circuit 830 of the power amplifier 804 to the first antenna port 1140. For example, in case of receiving the signal through the first antenna port 1140, the twelfth switch 1100 may connect the input terminal of the fifth amplification circuit 840 of the low noise amplifier 806 to the first antenna port 1140. For example, in case of transmitting the signal through the second antenna port 1142, the thirteenth switch 1102 may connect the output terminal of the third amplification circuit 1152 of the power amplifier 804 to the second antenna port 1142. For example, in case of receiving the signal through the second antenna port 1142, the thirteenth switch 1102 may connect the input terminal of the sixth amplification circuit 1162 of the low noise amplifier 806 to the second antenna port 1142.

According to various embodiments, with reference to FIG. 11B, the second switch circuit 820 may include a fourteenth switch 1110 for connecting a transmission path or a reception path to the first antenna port 1140 or the second antenna port 1142. According to an embodiment, the fourteenth switch 1110 may include a DP4T type switch. For example, in case of transmitting the signal through the first antenna port 1140, the fourteenth switch 1110 may connect the output terminal of the second amplification circuit 830 of the power amplifier 804 to the first antenna port 1140. For example, in case of receiving the signal through the first antenna port 1140, the fourteenth switch 1110 may connect the input terminal of the fifth amplification circuit 840 of the low noise amplifier 806 to the first antenna port 1140. For example, in case of transmitting the signal through the second antenna port 1142, the fourteenth switch 1110 may connect the output terminal of the third amplification circuit 1152 of the power amplifier 804 to the second antenna port 1142. For example, in case of receiving the signal through the second antenna port 1142, the fourteenth switch 1110 may connect the input terminal of the sixth amplification circuit 1162 of the low noise amplifier 806 to the second antenna port 1142.

Figure 11C:
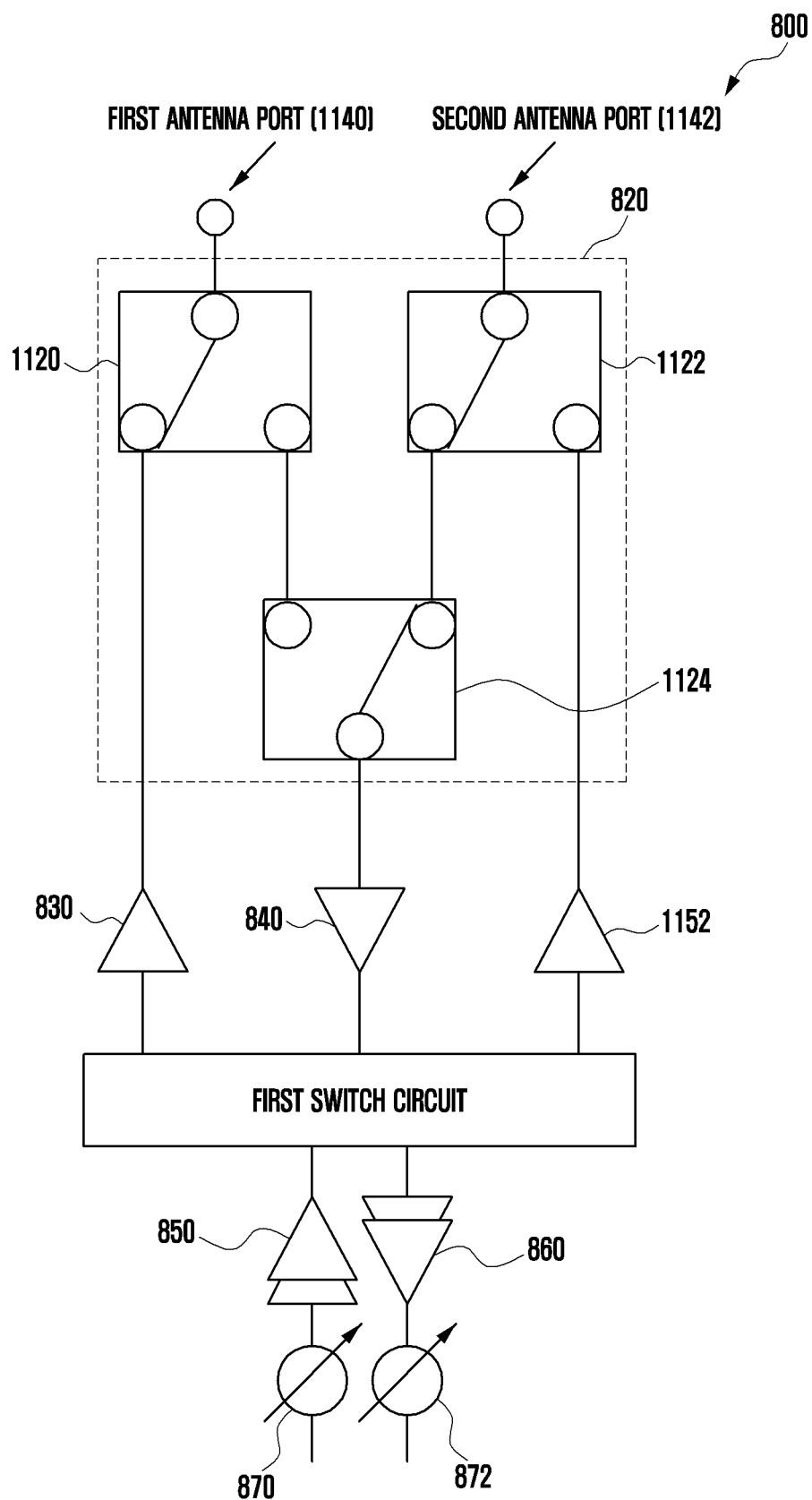
FIG. 11C is a diagram illustrating an example configuration of a second switch circuit of an RFFE for connection to two antenna ports according to various embodiments.
Figure 11D:
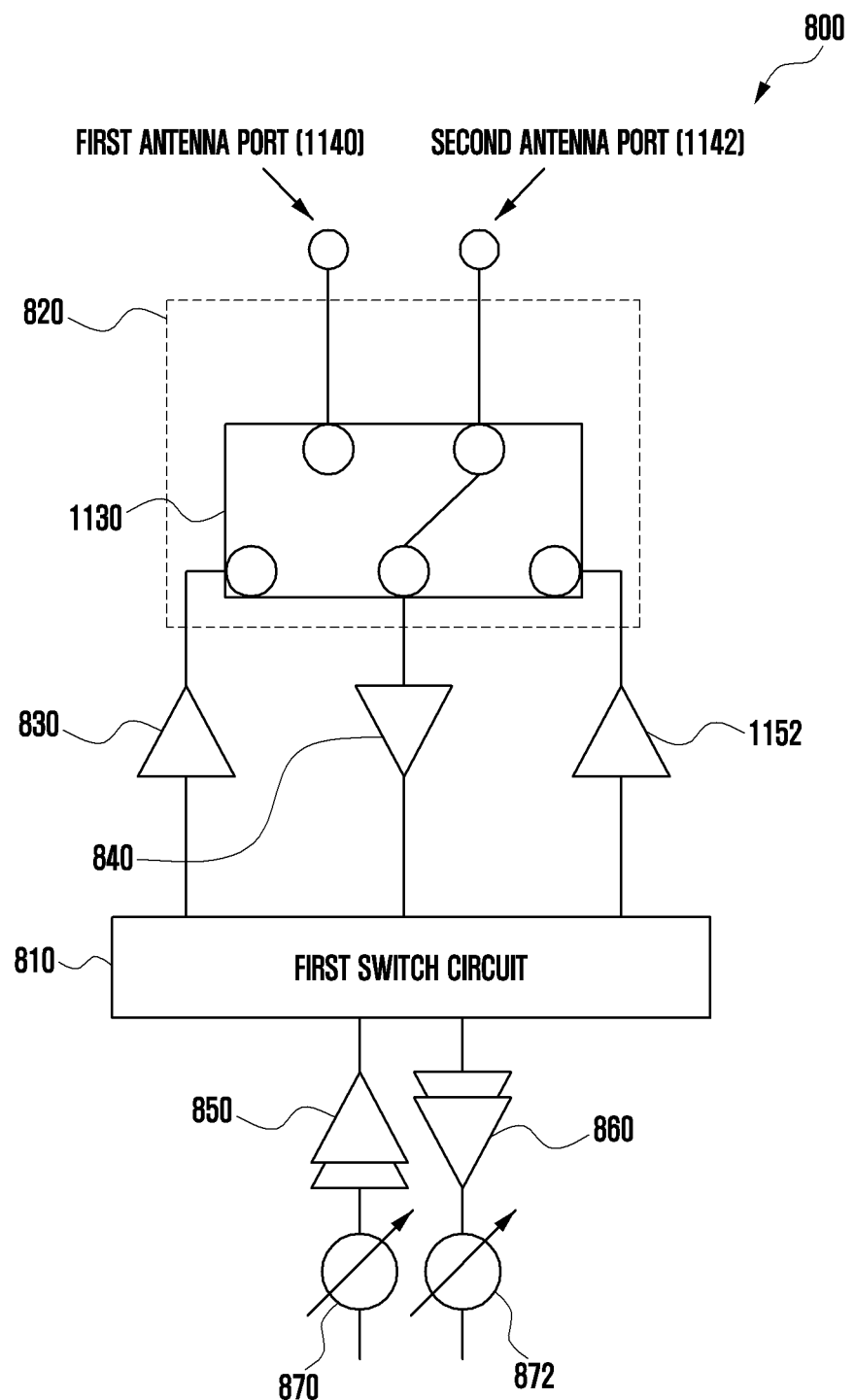
FIG. 11D is a diagram illustrating an example configuration of a second switch circuit of an RFFE for connection to two antenna ports according to various embodiments.

According to various embodiments, with reference to FIGS. 11C and 11D, the power amplifier 804 of the RFFE 800 may include the second amplification circuit 830 or the third amplification circuit 1152 including the last stage. The low noise amplifier 806 of the RFFE 800 may include the fifth amplification circuit 840 including the first stage.

According to various embodiments, with reference to FIG. 11C, the second switch circuit 820 may include a fifteenth switch 1120, a sixteenth switch 1122, and/or a seventeenth switch 1124 for connecting the transmission path or the reception path to the first antenna port 1140 or the second antenna port 1142. According to an embodiment, the seventeenth switch 1124 may connect the fifth amplification circuit 840 of the low noise amplifier 806 to the fifteenth switch 1120 or the sixteenth switch 1122. According to an embodiment, the fifteenth switch 1120 may selectively connect the first antenna port 1140 to the seventeenth switch 1124 or the second amplification circuit 830 of the power amplifier 804. According to an embodiment, the sixteenth switch 1122 may selectively connect the second antenna port 1142 to the seventeenth switch 1124 or the third amplification circuit 1152 of the power amplifier 804. For example, in case of transmitting the signal through the first antenna port 1140, the second switch circuit 820 may connect the output terminal of the second amplification circuit 830 to the first antenna port 1140 through the fifteenth switch 1120. For example, in case of transmitting the signal through the second antenna port 1142, the second switch circuit 820 may connect the output terminal of the third amplification circuit 1152 to the second antenna port 1142 through the sixteenth switch 1122. For example, in case of receiving the signal through the first antenna port 1140, the second switch circuit 820 may connect the input terminal of the fifth amplification circuit 840 to the first antenna port 1140 through the fifteenth switch 1120 and the seventeenth switch 1124. For example, in case of receiving the signal through the second antenna port 1142, the second switch circuit 820 may connect the input terminal of the fifth amplification circuit 840 to the second antenna port 1142 through the sixteenth switch 1122 and the seventeenth switch 1124. As an example, the fifteenth switch 1120, the sixteenth switch 1122, and/or the seventeenth switch 1124 may include SPDT type switches.

According to various embodiments, with reference to FIG. 11D, the second switch circuit 820 may include an eighteenth switch 1130 for connecting the transmission path or the reception path to the first antenna port 1140 or the second antenna port 1142. According to an embodiment, the eighteenth switch 1130 may include a switch of a double pole 3 through (DP3T) type. For example, in case of transmitting the signal through the first antenna port 1140, the eighteenth switch 1130 may selectively connect the first antenna port 1140 to the output terminal of the second amplification circuit 830 or the third amplification circuit 1152 of the power amplifier 804. For example, in case of transmitting the signal through the second antenna port 1142, the eighteenth switch 1130 may selectively connect the second antenna port 1142 to the output terminal of the second amplification circuit 830 or the third amplification circuit 1152 of the power amplifier 804. For example, in case of receiving the signal through the first antenna port 1140 or the second antenna port 1142, the eighteenth switch 1130 may selectively connect the input terminal of the fifth amplification circuit 840 of the low noise amplifier 806 to the first antenna port 1140 or the second antenna port 1142.

FIGS. 12A, 12B, 12C, and 12D are diagrams illustrating example configurations of an RFFE 800 for connection to two antenna ports 1250 and/or 1252 according to various embodiments. As an example, the RFFE 800 of FIGS. 12A, 12B, 12C, and 12D may be formed by a combination of the configuration of the first switch circuit 810 of FIG. 9A, 9B, 9C, or 9D and the configuration of the second switch circuit 820 of FIG. 11A, 11B, 11C, or 11D.

Figure 12A:
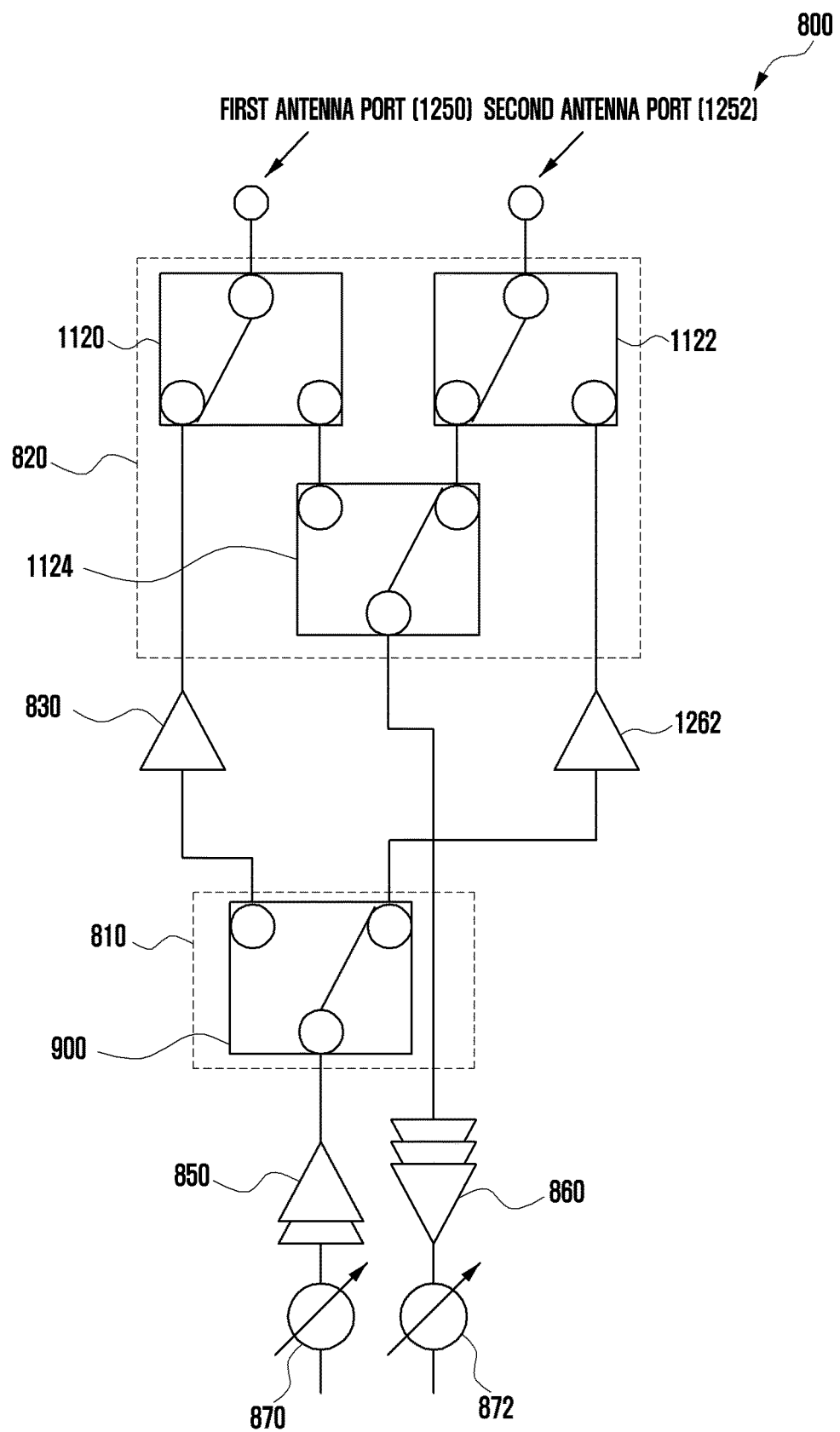
FIG. 12A is a diagram illustrating an example configuration of an RFFE for connection to two antenna ports according to various embodiments.

With reference to FIG. 12A, according to various embodiments, the RFFE 800 may include the first switch circuit 810 of FIG. 9D and the second switch circuit 820 of FIG. 11C. According to an embodiment, in case of transmitting the signal through the antenna element (e.g., the first antenna element 6001 of FIG. 6) (or antenna) of the antenna array (e.g., the first antenna array 600 of FIG. 6) connected to the first antenna port 1250 (e.g., the first antenna port 801 or 1140), the RFFE 800 may connect the output terminal of the first amplification circuit 850 of the power amplifier 804 to the input terminal of the second amplification circuit 830 through the first switch 900 of the first switch circuit 810. The RFFE 800 may connect the output terminal of the second amplification circuit 830 to the first antenna port 1250 through the fifteenth switch 1120 of the second switch circuit 820.

According to an embodiment, in case of transmitting the signal through the antenna element (e.g., the fifth antenna element 6101 of FIG. 6) (or antenna) of the antenna array (e.g., the second antenna array 610 of FIG. 6) connected to the second antenna port 1252 (e.g., the second antenna port 802 or 1142), the RFFE 800 may connect the output terminal of the first amplification circuit 850 of the power amplifier 804 to the input terminal of the third amplification circuit 1262 (e.g., the n-th amplification circuit 832 or the third amplification circuit 932, 1052, or 1152) through the first switch 900 of the first switch circuit 810. The RFFE 800 may connect the output terminal of the third amplification circuit 1262 to the second antenna port 1252 through the sixteenth switch 1122 of the second switch circuit 820.

According to an embodiment, in case of receiving the signal through the antenna element (or antenna) (e.g., the first antenna element 6001 of FIG. 6) of the antenna array (e.g., the first antenna array 600 of FIG. 6) connected to the first antenna port 1250, the RFFE 800 may connect the first antenna port 1250 to the input terminal of the low noise amplifier 806 through the fifteenth switch 1120 and the seventeenth switch 1124 of the second switch circuit 820.

According to an embodiment, in case of receiving the signal through the antenna element (or antenna) (e.g., the fifth antenna element 6101 of FIG. 6) of the antenna array (e.g., the second antenna array 610 of FIG. 6) connected to the second antenna port 1252, the RFFE 800 may connect the second antenna port 1252 to the input terminal of the low noise amplifier 806 through the sixteenth switch 1122 and the seventeenth switch 1124 of the second switch circuit 820.

Figure 12B:
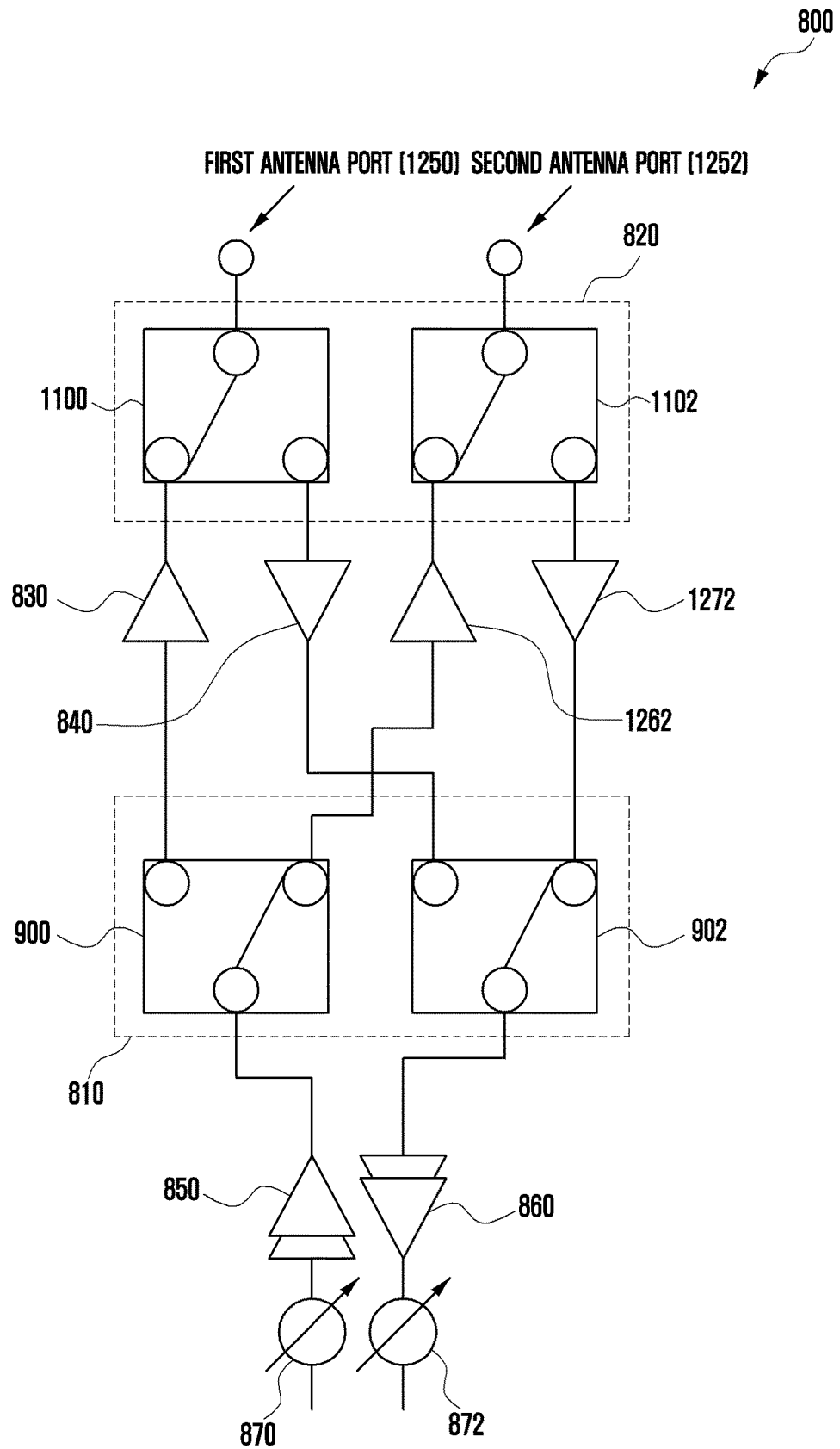
FIG. 12B is a diagram illustrating an example configuration of an RFFE for connection to two antenna ports according to various embodiments.

With reference to FIG. 12B, according to various embodiments, the RFFE 800 may include the first switch circuit 810 of FIG. 9A and the second switch circuit 820 of FIG. 11A. According to an embodiment, in case of transmitting the signal through the antenna element (e.g., the first antenna element 6001 of FIG. 6) (or antenna) of the antenna array (e.g., the first antenna array 600 of FIG. 6) connected to the first antenna port 1250 (e.g., the first antenna port 801 or 1140), the RFFE 800 may connect the output terminal of the first amplification circuit 850 of the power amplifier 804 to the input terminal of the second amplification circuit 830 through the first switch 900 of the first switch circuit 810. The RFFE 800 may connect the output terminal of the second amplification circuit 830 to the first antenna port 1250 through the twelfth switch 1100 of the second switch circuit 820.

According to an embodiment, in case of transmitting the signal through the antenna element (e.g., the fifth antenna element 6101 of FIG. 6) (or antenna) of the antenna array (e.g., the second antenna array 610 of FIG. 6) connected to the second antenna port 1252 (e.g., the second antenna port 802 or 1142), the RFFE 800 may connect the output terminal of the first amplification circuit 850 of the power amplifier 804 to the input terminal of the third amplification circuit 1262 (e.g., the n-th amplification circuit 832 or the third amplification circuit 932, 1052, or 1152) through the first switch 900 of the first switch circuit 810. The RFFE 800 may connect the output terminal of the third amplification circuit 1262 to the second antenna port 1252 through the thirteenth switch 1102 of the second switch circuit 820.

According to an embodiment, in case of receiving the signal through the antenna element (e.g., the first antenna element 6001 of FIG. 6) (or antenna) of the antenna array (e.g., the first antenna array 600 of FIG. 6) connected to the first antenna port 1250, the RFFE 800 may connect the first antenna port 1250 to the input terminal of the fifth amplification circuit 840 of the low noise amplifier 806 through the twelfth switch 1100 of the second switch circuit 820. The RFFE 800 may connect the output terminal of the fifth amplification circuit 840 of the low noise amplifier 806 to the input terminal of the fourth amplification circuit 860 through the second switch 902 of the first switch circuit 810.

According to an embodiment, in case of receiving the signal through the antenna element (e.g., the fifth antenna element 6101 of FIG. 6) (or antenna) of the antenna array (e.g., the second antenna array 610 of FIG. 6) connected to the second antenna port 1252, the RFFE 800 may connect the second antenna port 1252 to the input terminal of the sixth amplification circuit 1272 (e.g., the j-th amplification circuit 842 or the sixth amplification circuit 942, 1062, or 1162) of the low noise amplifier 806 through the thirteenth switch 1102 of the second switch circuit 820. The RFFE 800 may connect the output terminal of the sixth amplification circuit 1272 of the low noise amplifier 806 to the input terminal of the fourth amplification circuit 860 through the second switch 902 of the first switch circuit 810.

Figure 12C:
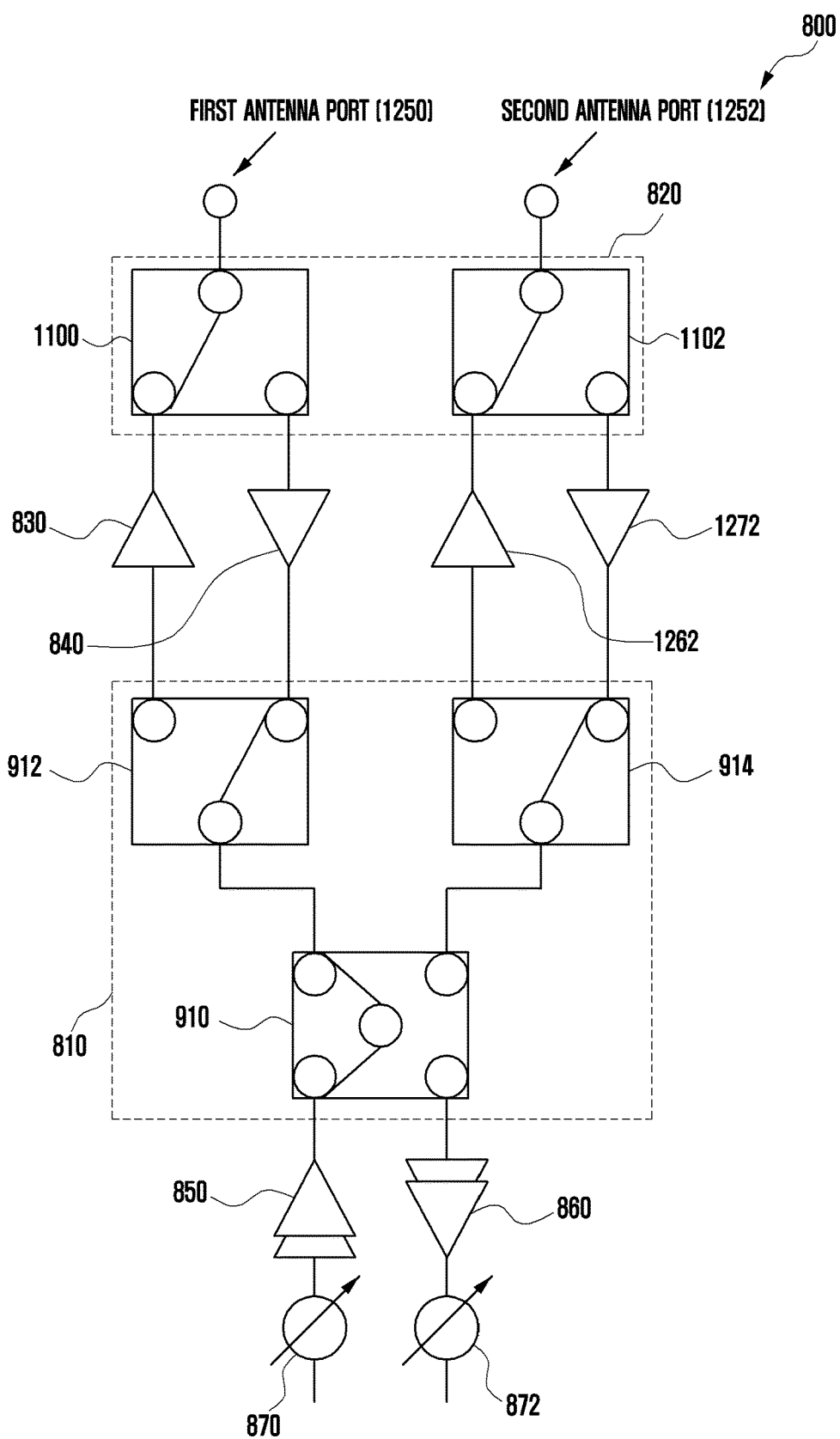
FIG. 12C is a diagram illustrating an example configuration of an RFFE for connection to two antenna ports according to various embodiments.

With reference to FIG. 12C, according to various embodiments, the RFFE 800 may include the first switch circuit 810 of FIG. 9B and the second switch circuit 820 of FIG. 11A. According to an embodiment, in case of transmitting the signal through the antenna element (or antenna) (e.g., the first antenna element 6001 of FIG. 6) of the antenna array (e.g., the first antenna array 600 of FIG. 6) connected to the first antenna port 1250 (e.g., the first antenna port 801 or 1140), the RFFE 800 may connect the output terminal of the first amplification circuit 850 of the power amplifier 804 to the input terminal of the second amplification circuit 830 through the third switch 910 and the fourth switch 912 of the first switch circuit 810. The RFFE 800 may connect the output terminal of the second amplification circuit 830 to the first antenna port 1250 through the twelfth switch 1100 of the second switch circuit 820.

According to an embodiment, in case of transmitting the signal through the antenna element (e.g., the fifth antenna element 6101 of FIG. 6) (or antenna) of the antenna array (e.g., the second antenna array 610 of FIG. 6) connected to the second antenna port 1252 (e.g., the second antenna port 802 or 1142), the RFFE 800 may connect the output terminal of the first amplification circuit 850 of the power amplifier 804 to the input terminal of the third amplification circuit 1262 (e.g., the n-th amplification circuit 832 or the third amplification circuit 932, 1052, or 1152) through the third switch 910 and the fifth switch 914 of the first switch circuit 810. The RFFE 800 may connect the output terminal of the third amplification circuit 1262 to the second antenna port 1252 through the thirteenth switch 1102 of the second switch circuit 820.

According to an embodiment, in case of receiving the signal through the antenna element (e.g., the first antenna element 6001 of FIG. 6) (or antenna) of the antenna array (e.g., the first antenna array 600 of FIG. 6) connected to the first antenna port 1250, the RFFE 800 may connect the first antenna port 1250 to the input terminal of the fifth amplification circuit 840 of the low noise amplifier 806 through the twelfth switch 1100 of the second switch circuit 820. The RFFE 800 may connect the output terminal of the fifth amplification circuit 840 of the low noise amplifier 806 to the input terminal of the fourth amplification circuit 860 through the fourth switch 912 and the third switch 910 of the first switch circuit 810.

According to an embodiment, in case of receiving the signal through the antenna element (e.g., the fifth antenna element 6101 of FIG. 6) (or antenna) of the antenna array (e.g., the second antenna array 610 of FIG. 6) connected to the second antenna port 1252, the RFFE 800 may connect the second antenna port 1252 to the input terminal of the sixth amplification circuit 1272 (e.g., the j-th amplification circuit 842 or the sixth amplification circuit 942, 1062, or 1162) of the low noise amplifier 806 through the thirteenth switch 1102 of the second switch circuit 820. The RFFE 800 may connect the output terminal of the sixth amplification circuit 1272 of the low noise amplifier 806 to the input terminal of the fourth amplification circuit 860 through the fifth switch 914 and the third switch 910 of the first switch circuit 810.

Figure 12D:
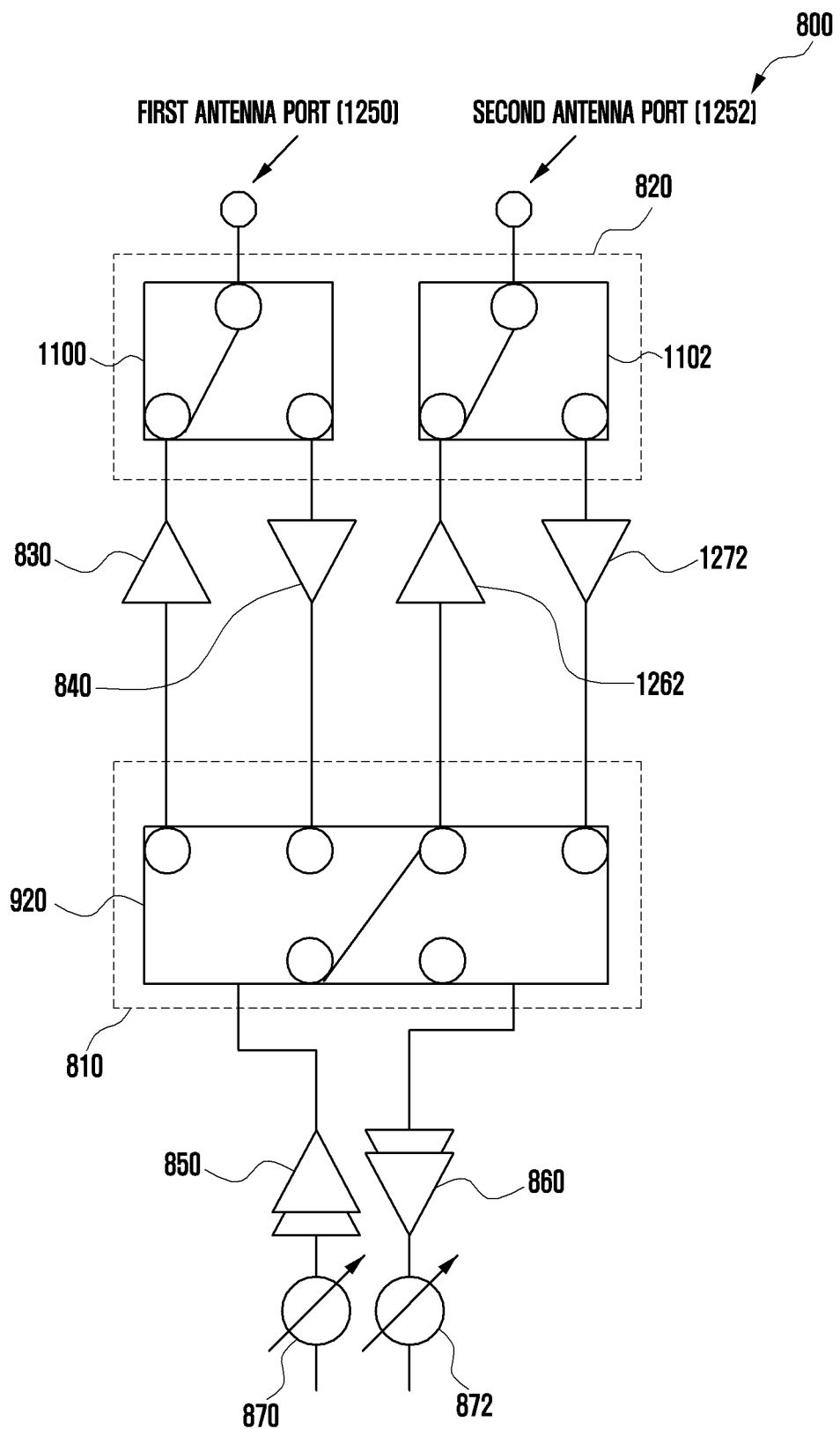
FIG. 12D is a diagram illustrating an example configuration of an RFFE for connection to two antenna ports according to various embodiments.

With reference to FIG. 12D, according to various embodiments, the RFFE 800 may include the first switch circuit 810 of FIG. 9C and the second switch circuit 820 of FIG. 11A. According to an embodiment, in case of transmitting the signal through the antenna element (or antenna) (e.g., the first antenna element 6001 of FIG. 6) of the antenna array (e.g., the first antenna array 600 of FIG. 6) connected to the first antenna port 1250 (e.g., the first antenna port 801 or 1140), the RFFE 800 may connect the output terminal of the first amplification circuit 850 of the power amplifier 804 to the input terminal of the second amplification circuit 830 through the sixth switch 920 of the first switch circuit 810. The RFFE 800 may connect the output terminal of the second amplification circuit 830 to the first antenna port 1250 through the twelfth switch 1100 of the second switch circuit 820.

According to an embodiment, in case of transmitting the signal through the antenna element (e.g., the fifth antenna element 6101 of FIG. 6) (or antenna) of the antenna array (e.g., the second antenna array 610 of FIG. 6) connected to the second antenna port 1252 (e.g., the second antenna port 802 or 1142), the RFFE 800 may connect the output terminal of the first amplification circuit 850 of the power amplifier 804 to the input terminal of the third amplification circuit 1262 (e.g., the n-th amplification circuit 832 or the third amplification circuit 932, 1052, or 1152) through the sixth switch 920 of the first switch circuit 810. The RFFE 800 may connect the output terminal of the third amplification circuit 1262 to the second antenna port 1252 through the thirteenth switch 1102 of the second switch circuit 820.

According to an embodiment, in case of receiving the signal through the antenna element (e.g., the first antenna element 6001 of FIG. 6) (or antenna) of the antenna array (e.g., the first antenna array 600 of FIG. 6) connected to the first antenna port 1250, the RFFE 800 may connect the first antenna port 1250 to the input terminal of the fifth amplification circuit 840 of the low noise amplifier 806 through the twelfth switch 1100 of the second switch circuit 820. The RFFE 800 may connect the output terminal of the fifth amplification circuit 840 of the low noise amplifier 806 to the input terminal of the fourth amplification circuit 860 through the sixth switch 920 of the first switch circuit 810.

According to an embodiment, in case of receiving the signal through the antenna element (e.g., the fifth antenna element 6101 of FIG. 6) (or antenna) of the antenna array (e.g., the second antenna array 610 of FIG. 6) connected to the second antenna port 1252, the RFFE 800 may connect the second antenna port 1252 to the input terminal of the sixth amplification circuit 1272 (e.g., the j-th amplification circuit 842 or the sixth amplification circuit 942, 1062, or 1162) of the low noise amplifier 806 through the thirteenth switch 1102 of the second switch circuit 820. The RFFE 800 may connect the output terminal of the sixth amplification circuit 1272 of the low noise amplifier 806 to the input terminal of the fourth amplification circuit 860 through the sixth switch 920 of the first switch circuit 810.

Figure 13A:
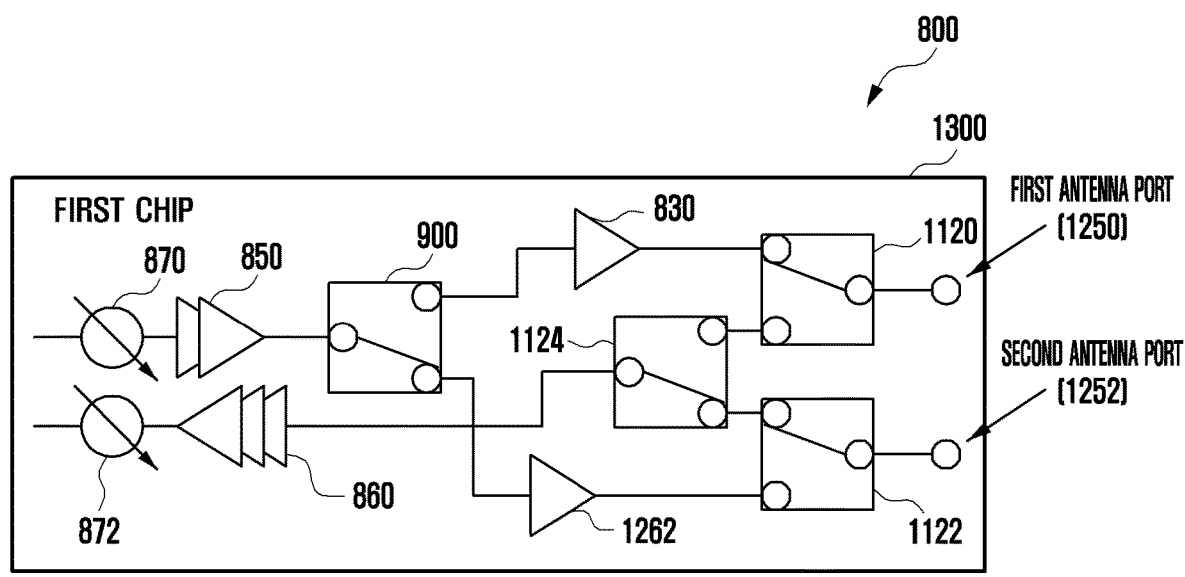
FIG. 13A is a diagram illustrating an example configuration using an external chip in the configuration of the RFFE explained with reference to FIG. 12A according to various embodiments.
Figure 13B:
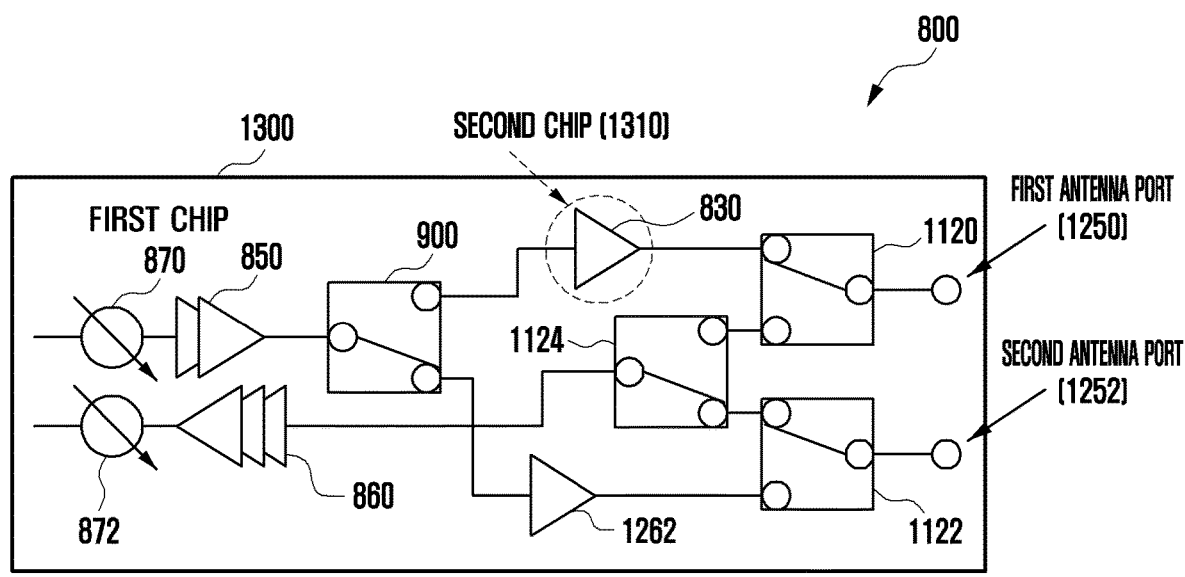
FIG. 13B is a diagram illustrating an example configuration using an external chip in the configuration of the RFFE explained with reference to FIG. 12A according to various embodiments.
Figure 13C:
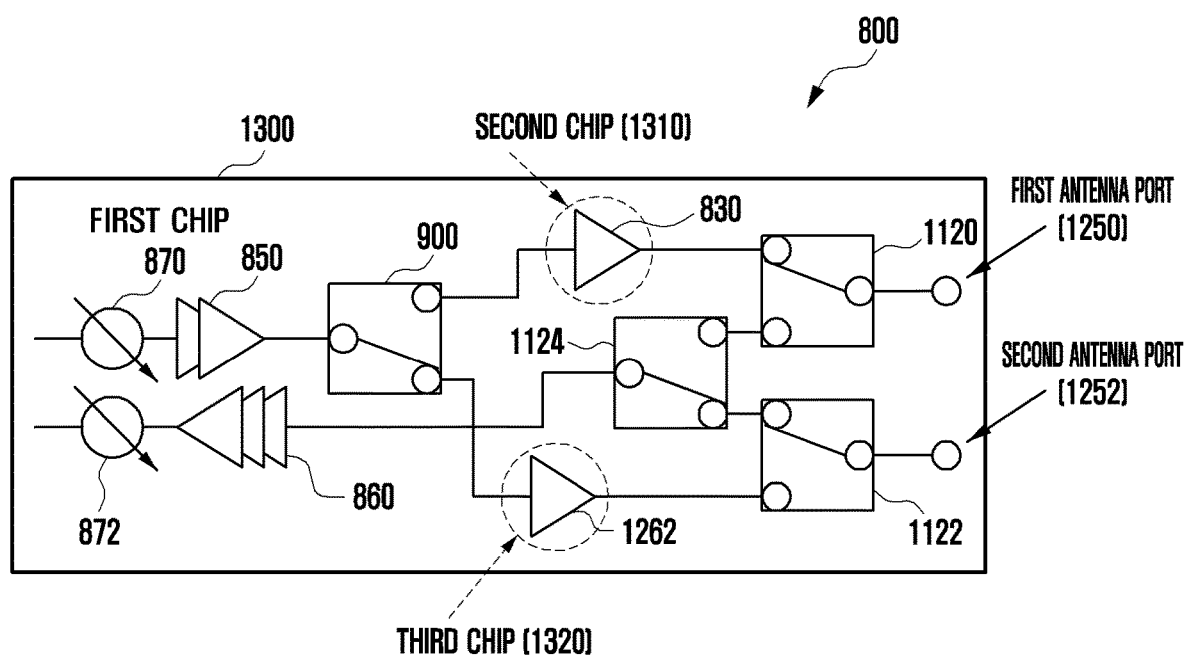
FIG. 13C is a diagram illustrating an example configuration using an external chip in the configuration of the RFFE explained with reference to FIG. 12A according to various embodiments.

FIGS. 13A, 13B, and 13C are diagrams illustrating example configurations using an external chip in the configuration of the RFFE 800 explained with reference to FIG. 12A according to various embodiments.

According to various embodiments, the RFFE 800 of FIGS. 13A, 13B, and 13C may include the first switch circuit 810 of FIG. 9D and the second switch circuit 820 of FIG. 11C as shown in FIG. 12A.

According to an embodiment, as shown in FIG. 6, the RFFE 800 may be disposed on the third surface 554*b* of the second substrate 554 including the second antenna array 610. According to an embodiment, the RFFE 800 may process the signal being transmitted and received through the antenna element (e.g., first antenna element 6001) of the first antenna array 600 connected to the first antenna port 1250 or the antenna element (e.g., fifth antenna element 6101) of the second antenna array 610 connected to the second antenna port 1252. As an example, the first antenna array 600 and the second antenna array 610 may form beams in different directions. As an example, the first antenna array 600 connected to the first antenna port 1250 and the second antenna array 610 connected to the second antenna port 1252 may support different frequency bands.

According to various embodiments, with reference to FIG. 13A, all configurations included in the RFFE 800 may be disposed in the first chip 1300. As an example, the first chip 1300 may include a semiconductor (e.g., complementary metal oxide semiconductor (CMOS)) produced in a single element process. As an example, the single element process may include one of silicon (Si) or germanium (Ge) processes.

According to various embodiments, with reference to the RFFE 800 of FIG. 13B or 13C, at least a part included in the RFFE 800 may be disposed in a different chip from the chip of the remaining part. According to an embodiment, with reference to the RFFE 800 of FIG. 13B, the second amplification circuit 830 of the power amplifier 804 may be formed as a separate chip. For example, the remaining configuration excluding the second amplification circuit 830 of the power amplifier 804 among the internal configurations of the RFFE 800 may be disposed in the first chip 1300. The second amplification circuit 830 of the power amplifier 804 may be disposed in the second chip 1310 different from the first chip 1300. As an example, the second chip 1310 may include a semiconductor (e.g., compound semiconductor) produced in a compound process. As an example, the compound semiconductor may include a semiconductor formed of two or more kinds of element compounds. As an example, an elemental compounds that form the compound semiconductor may include silicon-germanium (SiGe), gallium-arsenic (GaAs), indium-phosphorus (InP), gallium-phosphorus (GaP), cadmium sulfide (CdS), zinc telluride (ZnTe), or lead sulfide (PbS). As an example, the first chip 1300 and/or the second chip 1310 may be formed as one package. As an example, the package may be formed as a system in package (SIP) or a package on package (POP).

According to an embodiment, with reference to the RFFE 800 of FIG. 13C, the second amplification circuit 830 and the third amplification circuit 1262 may be formed as a separate chip. For example, the remaining configuration excluding the second amplification circuit 830 and the third amplification circuit 1262 of the power amplifier 804 among the internal configurations of the RFFE 800 may be disposed in the first chip 1300. In an embodiment, the second amplification circuit 830 of the power amplifier 804 may be disposed in the second chip 1310 different from the first chip 1300. In an example, the third amplification circuit 1262 of the power amplifier 804 may be disposed in a third chip 1320 different from the first chip 1300. As an example, the second chip 1310 and/or the third chip 1320 may include a compound semiconductor. As an example, the second chip 1310 and/or the third chip 1320 may be formed as one chip or different chips. As an example, the first chip 1300, the second chip 1310, and/or the third chip 1320 may be formed as one package. As an example, the package may be formed as the SIP or POP.

According to various embodiments, the second amplification circuit 830 of FIG. 13B, being formed of the compound semiconductor may increase the amplification efficiency in comparison to the third amplification circuit 832 of FIG. 13B, being formed of a CMOS. For example, the first chip 1300 included in the RFFE 800 may be disposed on the second substrate 554, and the second chip 1310 may be disposed on the first substrate 552 connected to the second substrate 554 through a conductive cable (e.g., conductive cable 555 of FIG. 6). The RFFE 800 may compensate for a loss caused by the conductive cable by amplifying the signal being output through one of antenna elements 6001, 6002, 6003, or 6004 of the first antenna array 600 disposed on the first substrate 552 by means of the second amplification circuit 830 disposed on the second chip 1310 formed of the compound semiconductor. As another example, the first chip 1300 and the second chip 1310 included in the RFFE 800 may be disposed on the second substrate 554. One of the antenna elements 6001, 6002, 6003, or 6004 of the first antenna array 600 disposed on the first substrate 552 may be connected to the second amplification circuit 830 disposed on the second chip 1310 formed of the compound semiconductor. The RFFE 800 may compensate for the loss caused by the conductive cable by amplifying the signal for being output through the antenna element connected to the second amplification circuit 830 by means of the second amplification circuit 830.

Figure 14A:
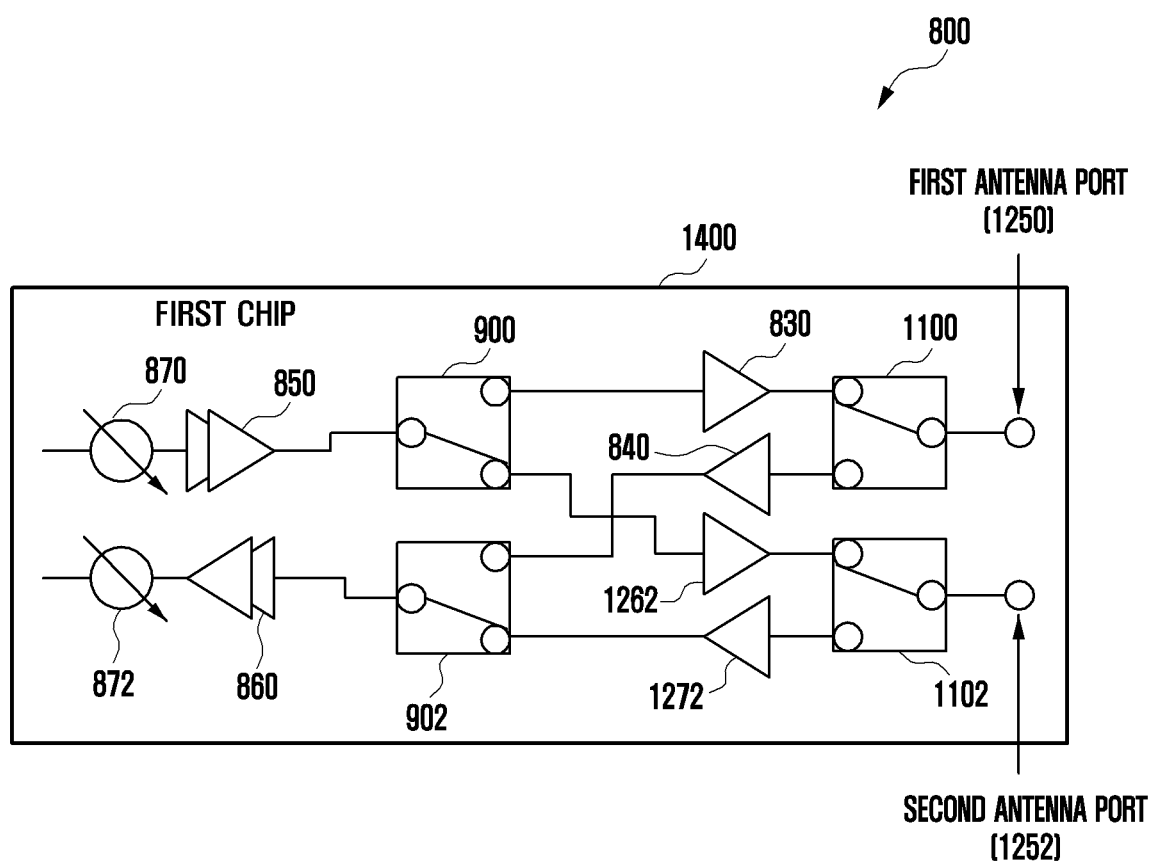
FIG. 14A is a diagram illustrating an example configuration using an external chip in the configuration of the RFFE explained with reference to FIG. 12B according to various embodiments.
Figure 14B:
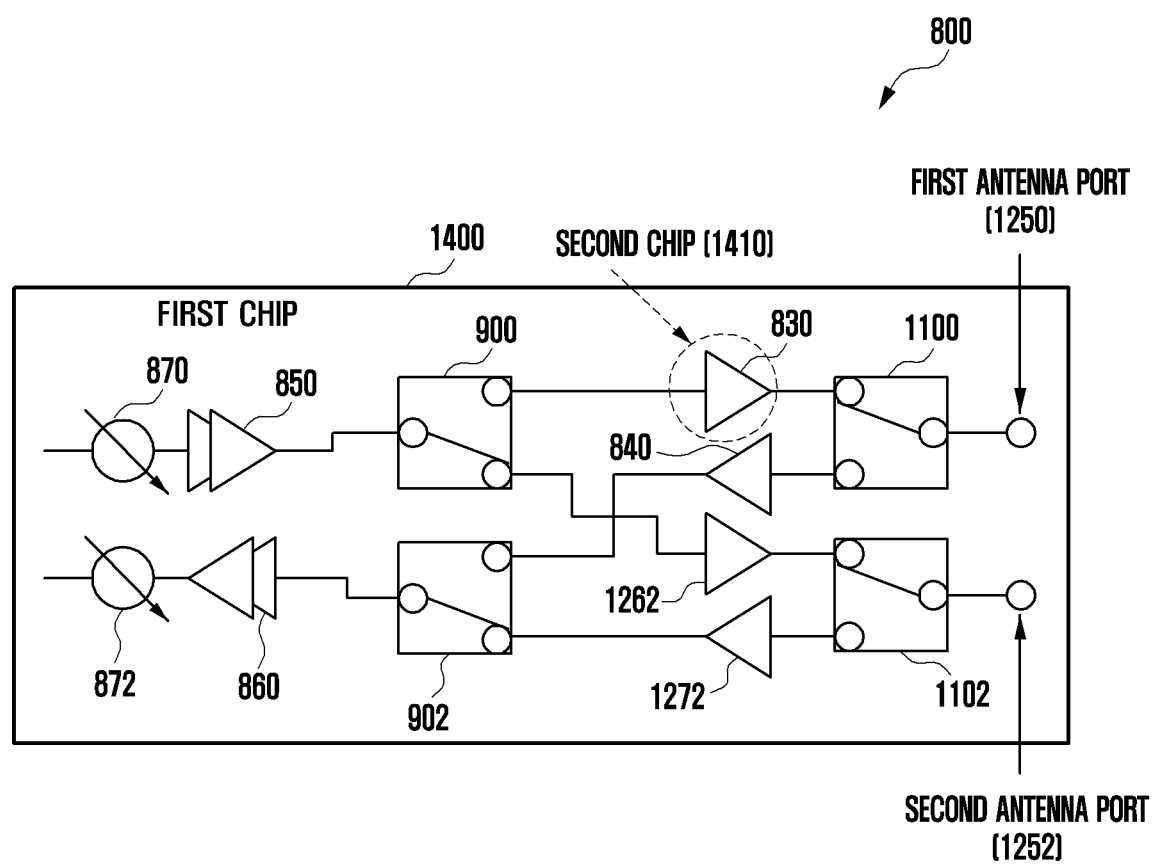
FIG. 14B is a diagram illustrating an example configuration using an external chip in the configuration of the RFFE explained with reference to FIG. 12B according to various embodiments.
Figure 14C:
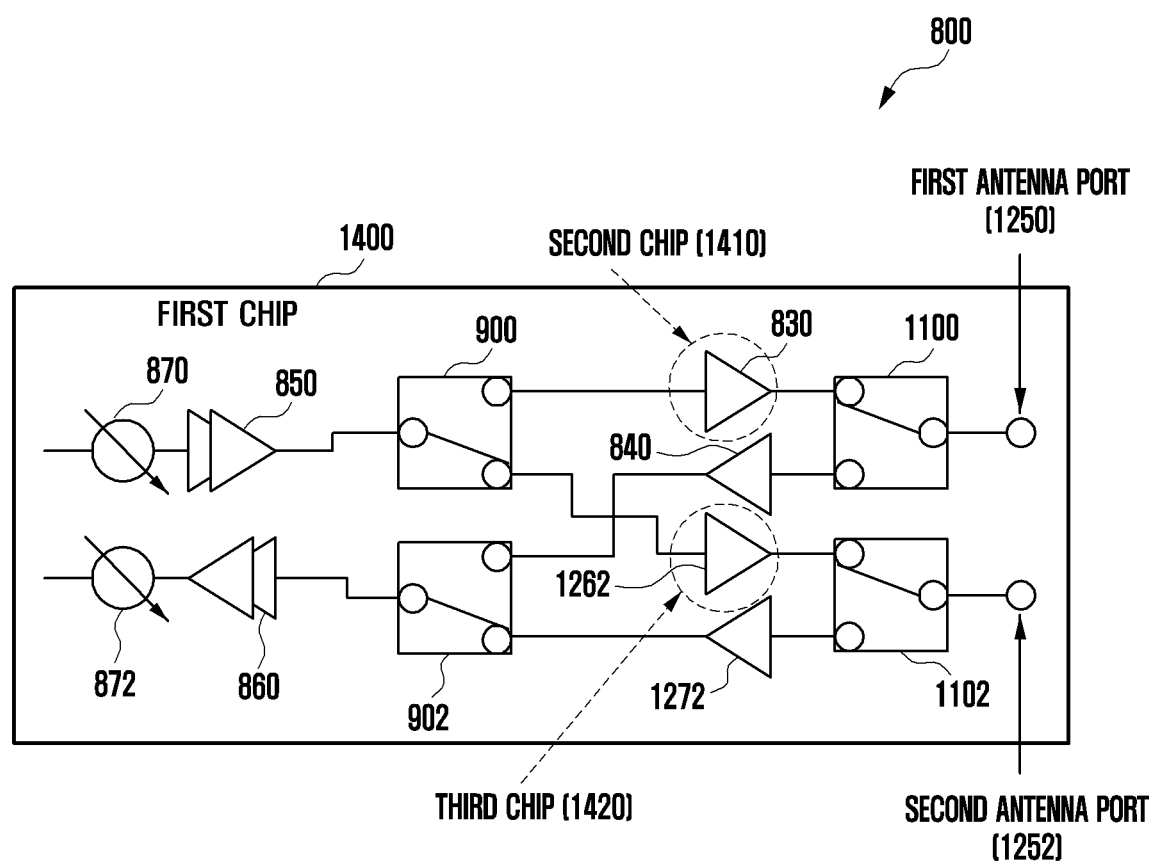
FIG. 14C is a diagram illustrating an example configuration using an external chip in the configuration of the RFFE explained with reference to FIG. 12B according to various embodiments.

FIGS. 14A, 14B, and 14C are diagrams illustrating example configurations using an external chip in the configuration of the RFFE explained with reference to FIG. 12B according to various embodiments.

According to various embodiments, the RFFE 800 of FIGS. 14A, 14B, and 14C may include the first switch circuit 810 of FIG. 9A and the second switch circuit 820 of FIG. 11A as shown in FIG. 12B. According to an embodiment, the RFFE 800 may be disposed on one surface (e.g., third surface 554*b* of FIG. 6) of the substrate (e.g., second substrate 554 of FIG. 6) including the antenna array (e.g., second antenna array 610 of FIG. 6) connected to the first antenna port 1250. According to an embodiment, the RFFE 800 may process the signal being transmitted and received through the antenna element (e.g., first antenna element 6001 of FIG. 6) connected to the first antenna port 1250 or the antenna element (e.g., fifth antenna element 6101 of FIG. 6) connected to the second antenna port 1252.

According to various embodiments, with reference to the RFFE 800 of FIG. 14A, all configurations included in the RFFE 800 may be disposed in the first chip 1400. As an example, the first chip 1400 may include complementary metal oxide semiconductor (CMOS).

According to various embodiments, with reference to the RFFE 800 of FIG. 14B or 14C, at least a part included in the RFFE 800 may be disposed in a different chip from the chip of the remaining part. According to an embodiment, with reference to the RFFE 800 of FIG. 14B, the second amplification circuit 830 of the power amplifier 804 may be formed as a second chip 1410. For example, the remaining configuration excluding the second amplification circuit 830 of the power amplifier 804 among the internal configurations of the RFFE 800 may be included in the first chip 1400 being different from a second chip 1410. As an example, the second chip 1410 may include a compound semiconductor. As an example, the first chip 1400 and/or the second chip 1410 may be formed as one package.

According to an embodiment, with reference to the RFFE 800 of FIG. 14C, the second amplification circuit 830 of the power amplifier 804 may be formed as the second chip 1410, and the third amplification circuit 1262 may be formed as a third chip 1420. For example, the remaining configuration excluding the second amplification circuit 830 and the third amplification circuit 1262 of the power amplifier 804 among the internal configurations of the RFFE 800 may be included in the first chip 1400 different from the second chip 1410 and the third chip 1420. As an example, the second chip 1410 and/or the third chip 1420 may include the compound semiconductor. As an example, the second chip 1410 and the third chip 1420 may be formed as one chip or different chips. As an example, the first chip 1400, the second chip 1410, and/or the third chip 1420 may be formed as one package.

FIGS. 15A, 15B, 15C, and 15D are diagrams illustrating example configurations using an external chip in the configuration of the RFFE explained with reference to FIG. 12C according to various embodiments.

According to various embodiments, the RFFE 800 of FIGS. 15A, 15B, 15C, and 15D may include the first switch circuit 810 of FIG. 9B and the second switch circuit 820 of FIG. 11A as shown in FIG. 12C. According to an embodiment, the RFFE 800 may be included in a wireless communication circuit 5541 disposed on the third surface 554*b* of the second substrate 554 of FIG. 6. According to an embodiment, the RFFE 800 may process the signal being transmitted and received through the second antenna array 610 included in the second substrate 554 of FIG. 6 and the first antenna array 600 included in the first substrate 552.

Figure 15A:
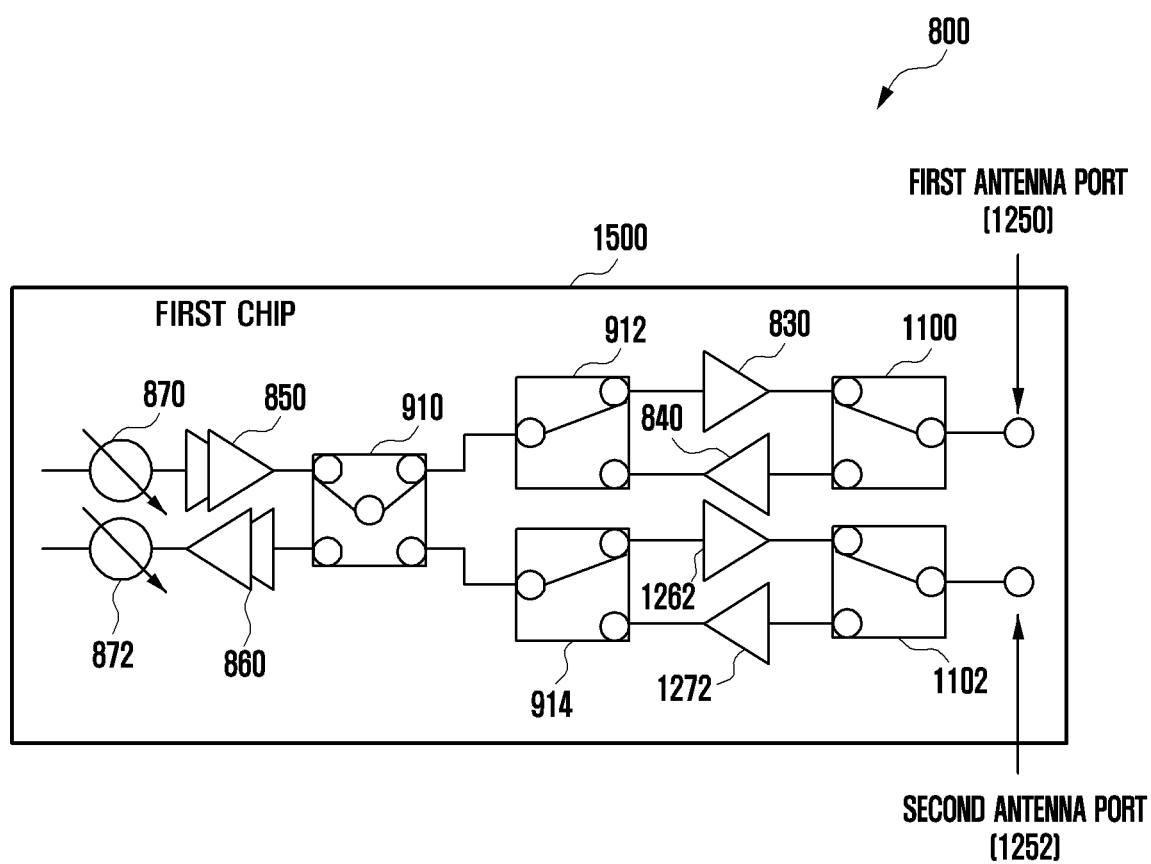
FIG. 15A is a diagram illustrating an example configuration using an external chip in the configuration of the RFFE explained with reference to FIG. 12C according to various embodiments.

According to various embodiments, with reference to the RFFE 800 of FIG. 15A, all configurations included in the RFFE 800 may be disposed in the first chip 1500. As an example, the first chip 1500 may include a complementary metal oxide semiconductor (CMOS).

Figure 15B:
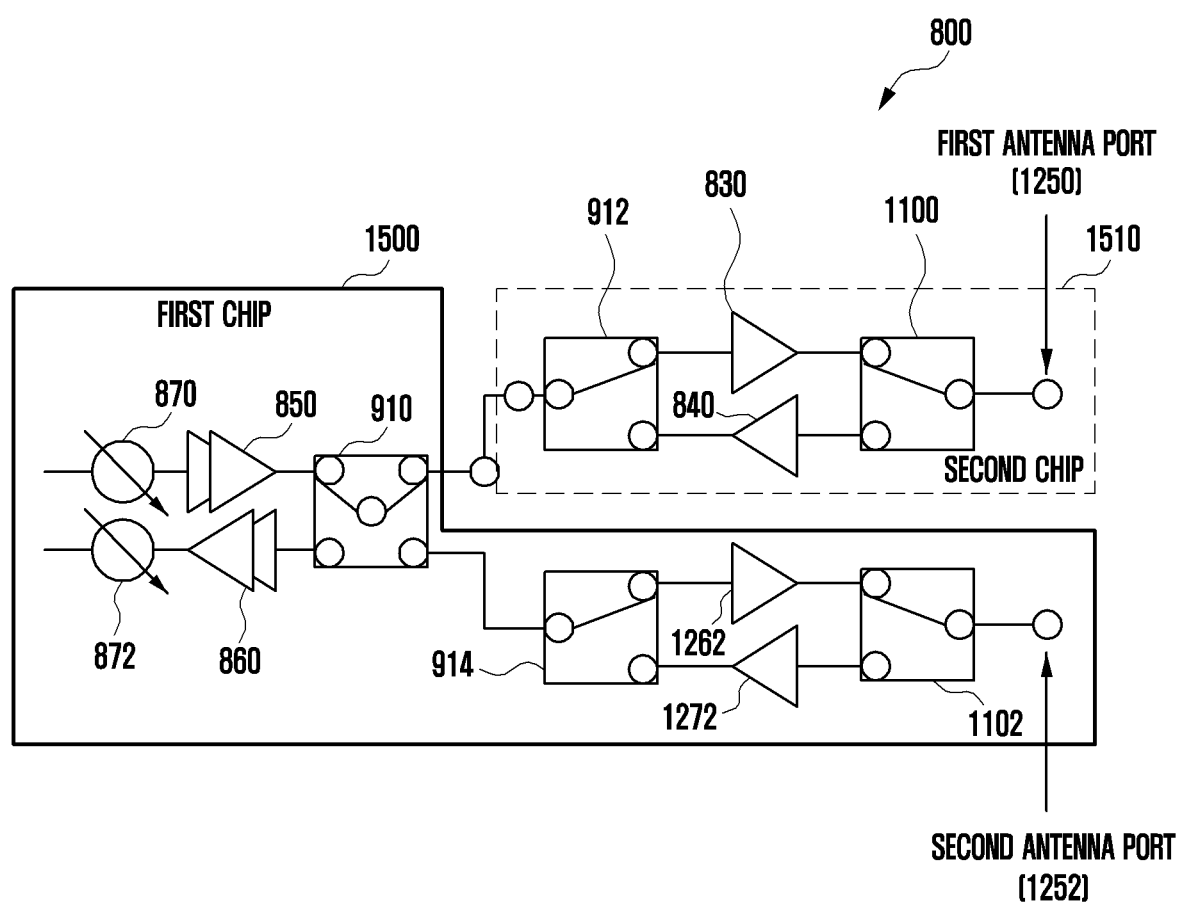
FIG. 15B is a diagram illustrating an example configuration using an external chip in the configuration of the RFFE explained with reference to FIG. 12C according to various embodiments.
Figure 15C:
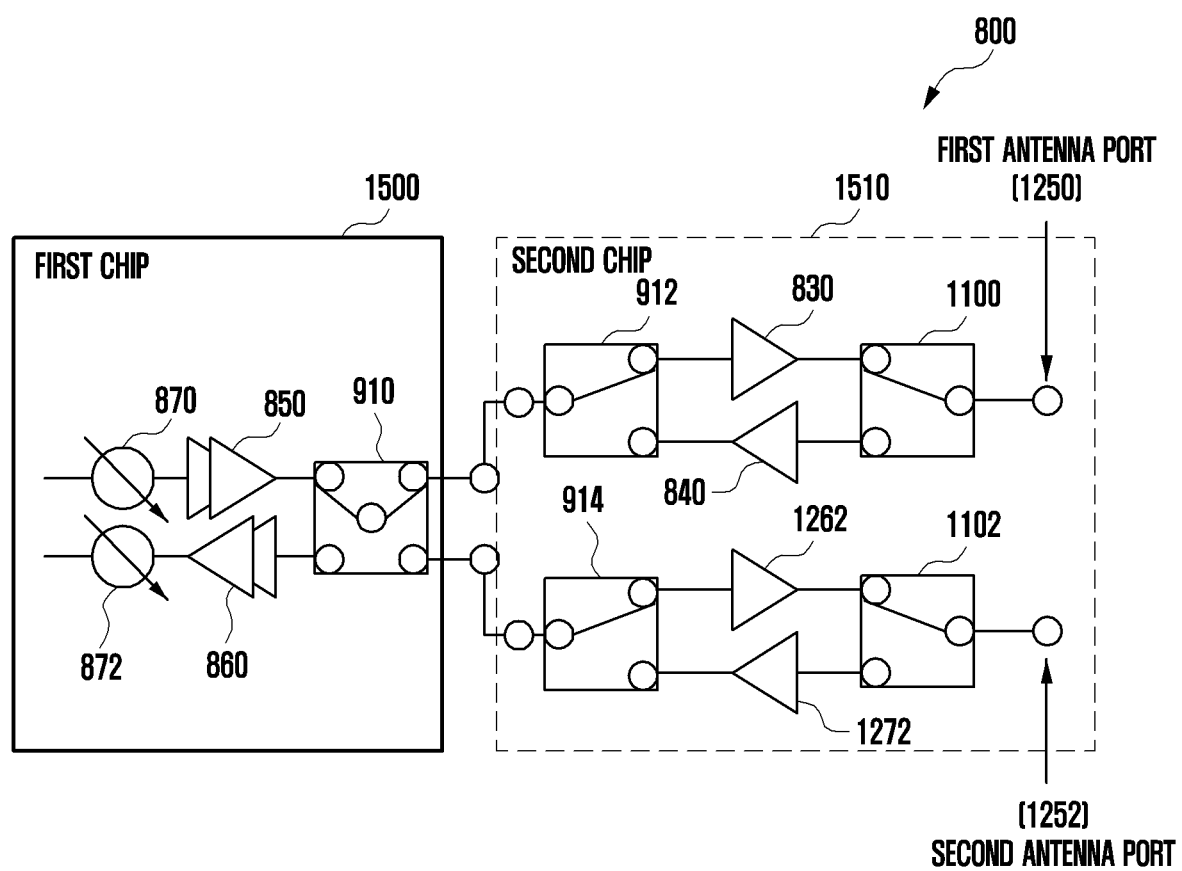
FIG. 15C is a diagram illustrating an example configuration using an external chip in the configuration of the RFFE explained with reference to FIG. 12C according to various embodiments.

According to various embodiments, with reference to the RFFE 800 of FIG. 15B or 15C, at least a part included in the RFFE 800 may be disposed in a different chip from the chip of the remaining part. According to an embodiment, with reference to the RFFE 800 of FIG. 15B, the fourth switch 912, the twelfth switch 1100, and the second amplification circuit 830 of the power amplifier 804 or the fifth amplification circuit 840 of the low noise amplifier 806, being selectively connected to different elements by the fourth switch 912 and the twelfth switch 1100, may be formed as the second chip 1510. For example, the remaining configuration excluding the at least a part included in the second chip 1510 among the internal configurations of the RFFE 800 may be included in the first chip 500 different from the second chip 1510. As an example, the second chip 1510 may include a compound semiconductor. As an example, the first chip 1500 and/or the second chip 1510 may be formed as one package.

According to an embodiment, with reference to the RFFE 800 of FIG. 15C, the fifth switch 914, the thirteenth switch 1102, and the third amplification circuit 1262 of the power amplifier 804 and the sixth amplification circuit 1272 of the low noise amplifier 806, being selectively connected to different elements by the fifth switch 914 or the thirteenth switch 1102, may be included in the second chip 1510.

According to an embodiment, in case that the RFFE 800 is formed as shown in FIGS. 15B and/or 15C, the second chip 1510 thereof may be disposed on one surface of the substrate (e.g., first substrate 552 of FIG. 6), on which the antenna array (e.g., first antenna array 600 of FIG. 6) including the antenna element (e.g., first antenna element 6001 of FIG. 6) connected to the first antenna port 1250 is disposed. As an example, the first chip 1500 of the RFFE 800 may be disposed on one surface (e.g., third surface 554*b* of FIG. 6) of the substrate (e.g., second substrate 554 of FIG. 6), on which the antenna array (e.g., second antenna array 610 of FIG. 6) including the antenna element (e.g., fifth antenna element 6101 of FIG. 6) connected to the second antenna port 1252 is disposed.

Figure 15D:
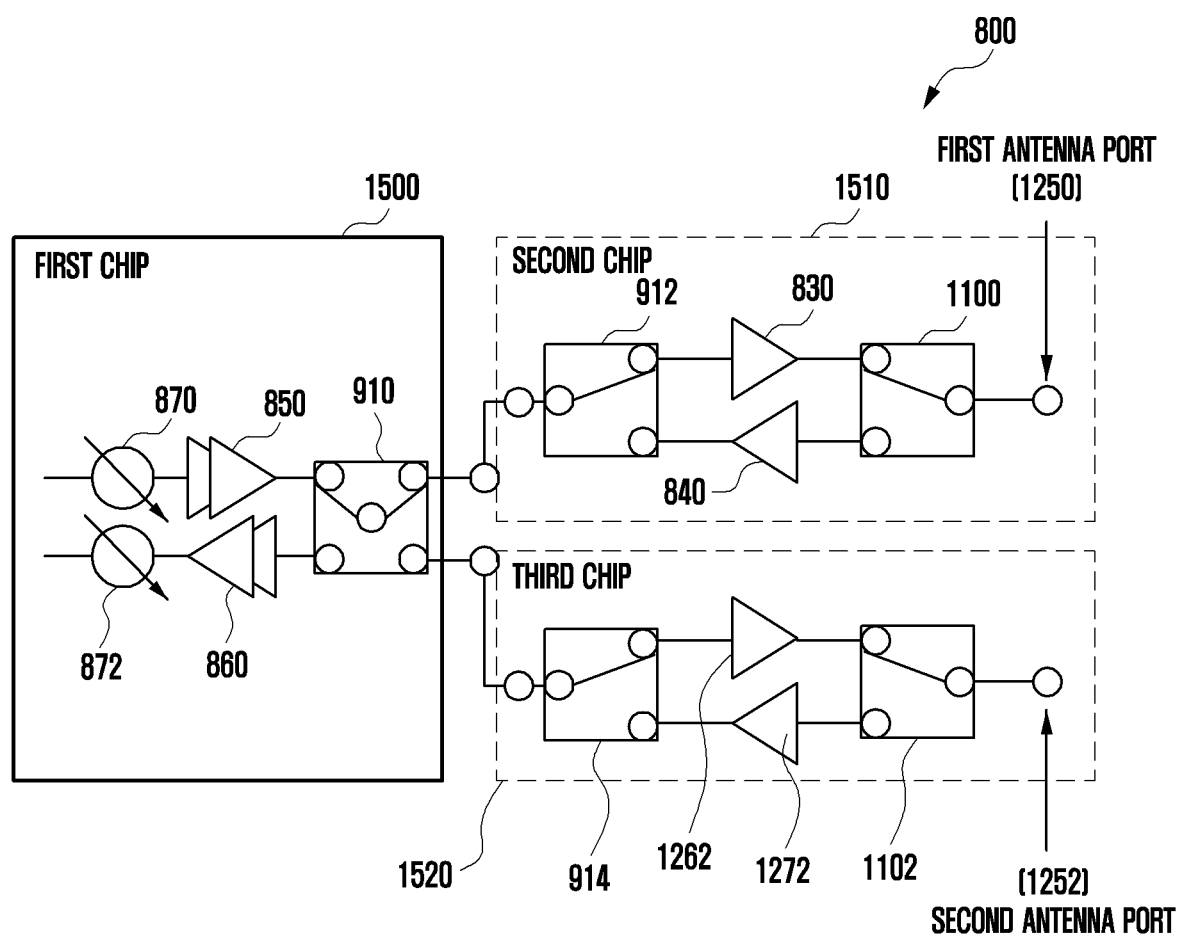
FIG. 15D is a diagram illustrating an example configuration using an external chip in the configuration of the RFFE explained with reference to FIG. 12C according to various embodiments.

According to an embodiment, with reference to the RFFE 800 of FIG. 15D, the fifth switch 914, the thirteenth switch 1102, the third amplification circuit 1262, and/or the sixth amplification circuit 1272 among the configurations of the second chip 1510 of FIG. 15C may be formed as the third chip 1520 different from the second chip 1510. For example, among the internal configurations of the RFFE 800, the fourth switch 912, the twelfth switch 1100, the second amplification circuit 830 of the power amplifier 804, and/or the fifth amplification circuit 840 of the low noise amplifier 806 may be included in the second chip 1510. For example, among the internal configurations of the RFFE 800, the fifth switch 914, the thirteenth switch 1102, the third amplification circuit 1262 of the power amplifier 804, and/or the sixth amplification circuit 1272 of the low noise amplifier 806 may be included in the third chip 1520. For example, among the internal configurations of the RFFE 800, the remaining configuration that is not included in the second chip 1510 and the third chip 1520 may be included in the first chip 1500 being different from the second chip 1510 and the third chip 1520. As an example, the second chip 1510 and/or the third chip 1320 may include a compound semiconductor. As an example, the second chip 1510 and the third chip 1520 may be formed as one chip or different chips. As an example, the first chip 1500, the second chip 1510, and/or the third chip 1520 may be formed as one package.

According to an embodiment, in case that the RFFE 800 is formed as shown in FIG. 15D, the second chip 1510 and/or the third chip 1520 may be disposed on one surface of the substrate (e.g., first substrate 552 of FIG. 6), on which the antenna array (e.g., first antenna array 600 of FIG. 6) including the antenna element (e.g., first antenna element 6001 of FIG. 6) connected to the first antenna port 1250 is disposed. As an example, the first chip 1500 of the RFFE 800 may be disposed on one surface (e.g., third surface 554*b* of FIG. 6) of the substrate (e.g., second substrate 554 of FIG. 6), on which the antenna array (e.g., second antenna array 610 of FIG. 6) including the antenna element (e.g., fifth antenna element 6101 of FIG. 6) connected to the second antenna port 1252 is disposed.

Figure 16A:
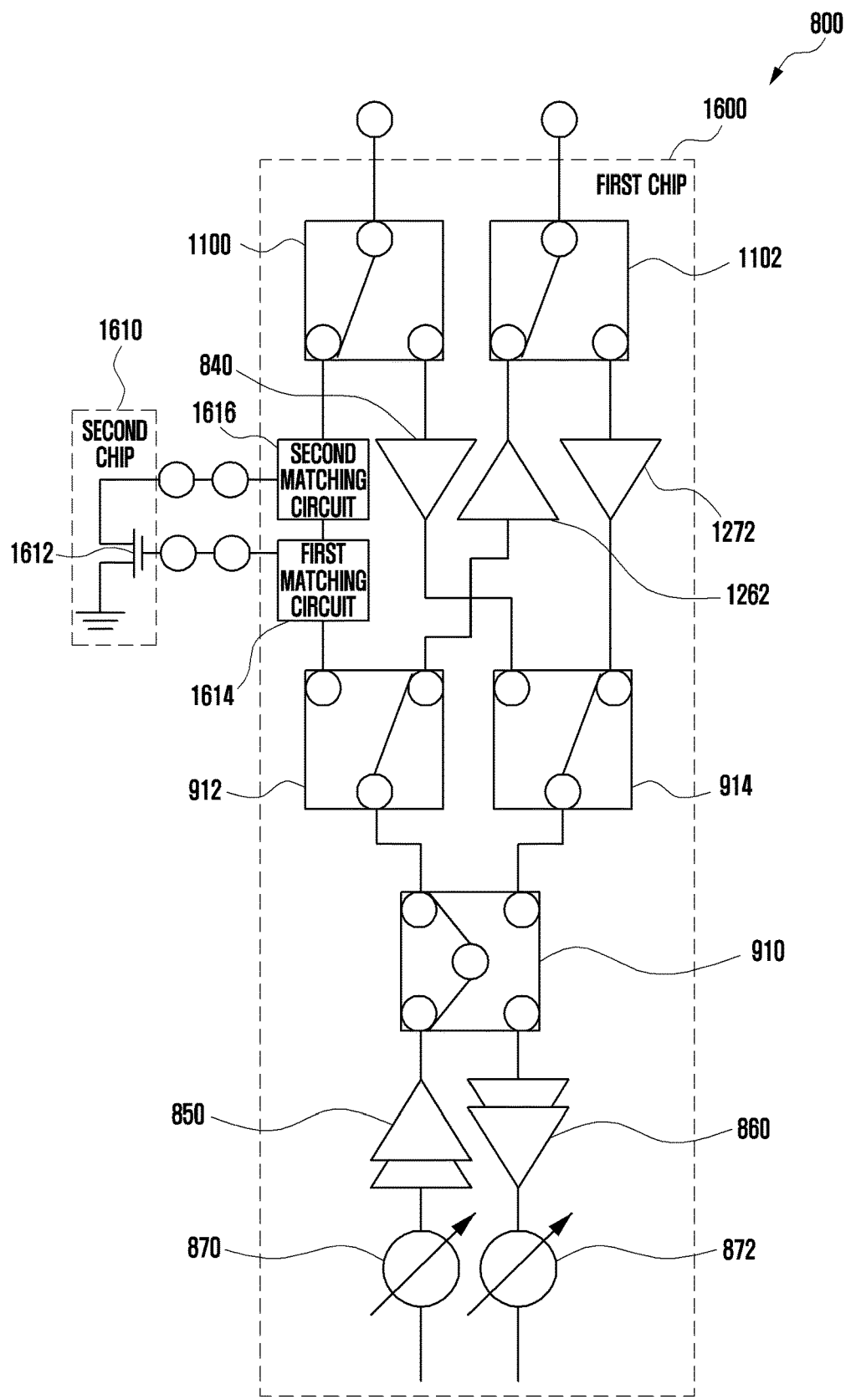
FIG. 16A is a diagram illustrating an example configuration of a matching circuit related to an external chip according to various embodiments.
Figure 16B:
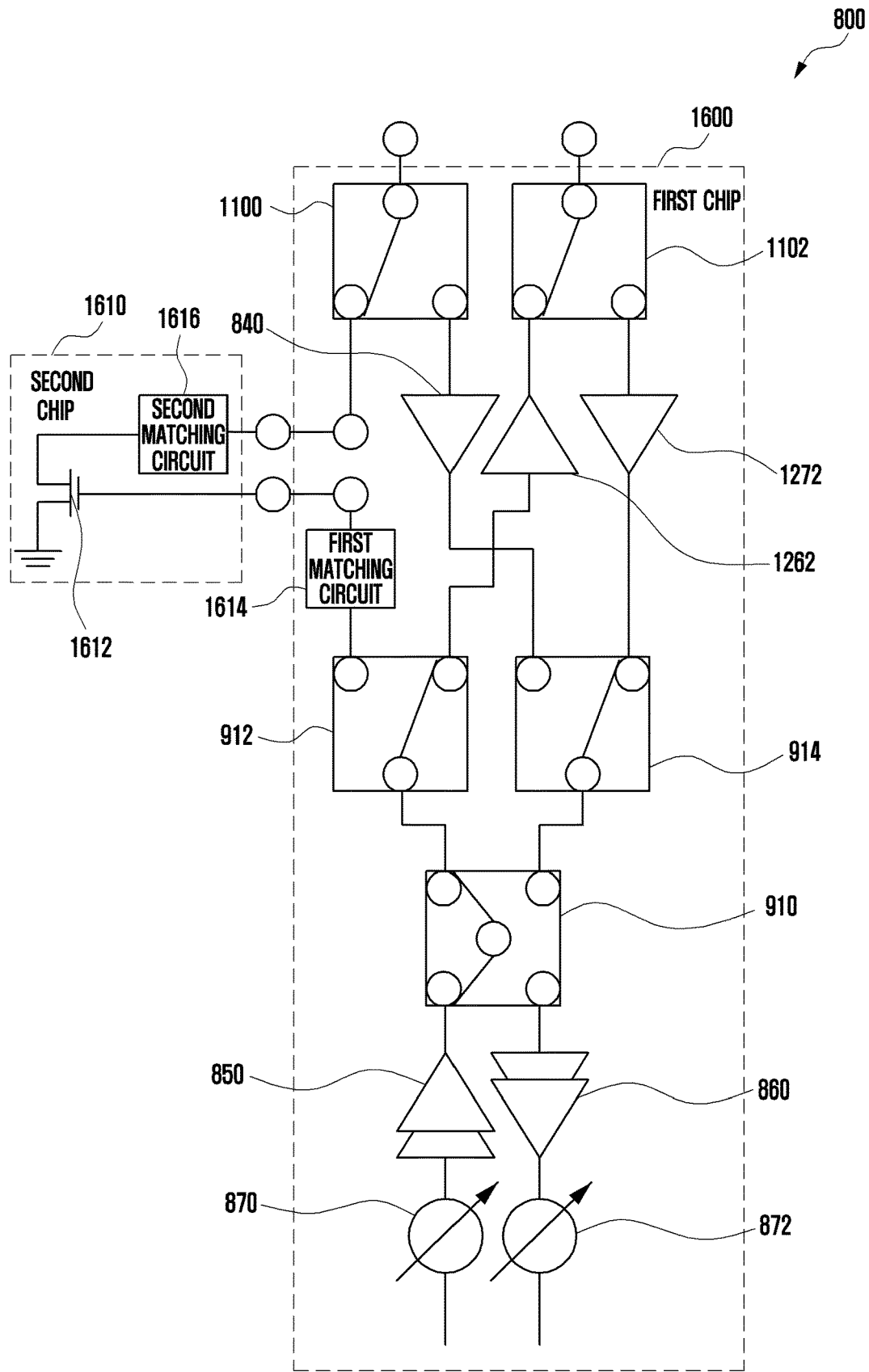
FIG. 16B is a diagram illustrating an example configuration of a matching circuit related to an external chip according to various embodiments.
Figure 16C:
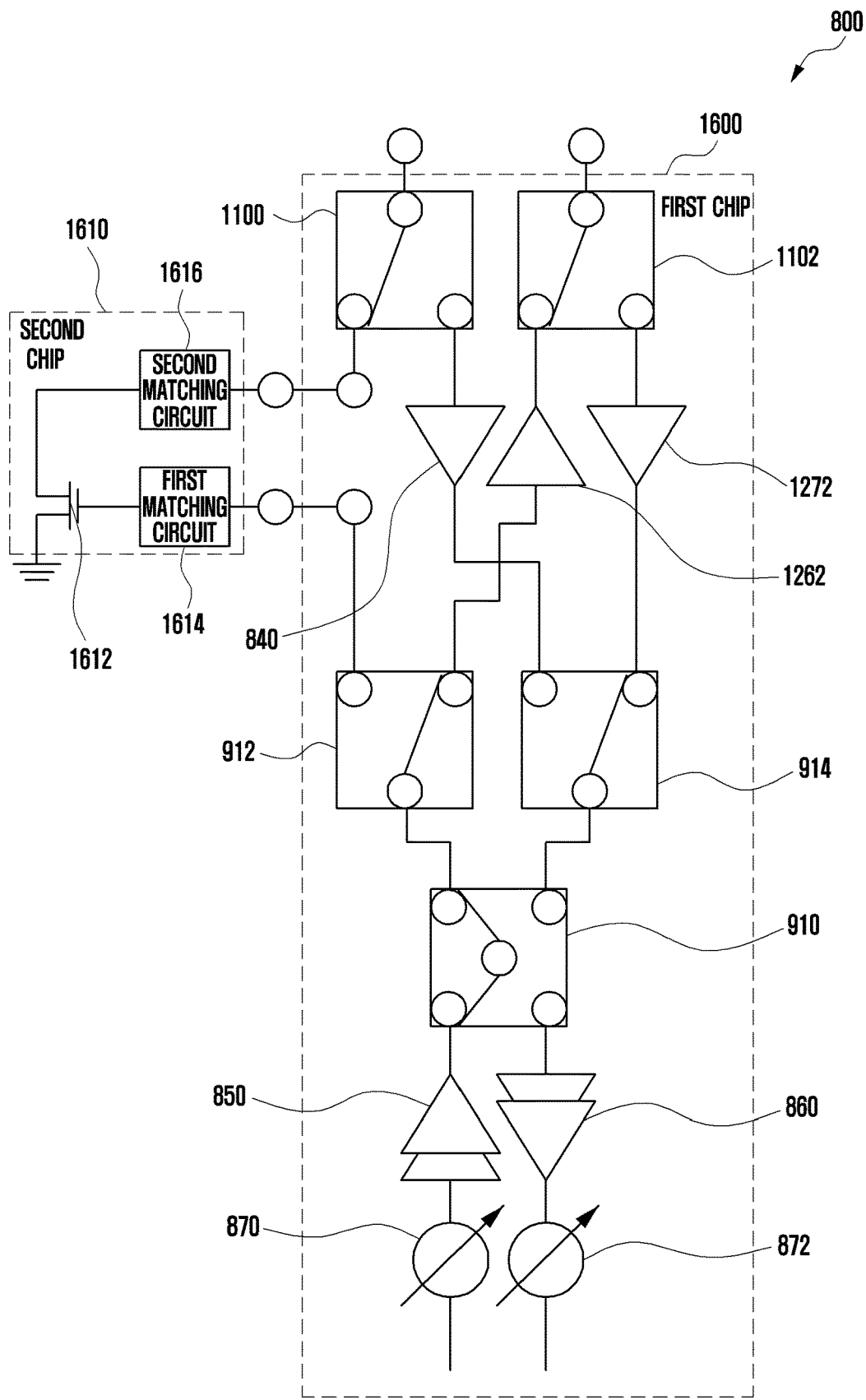
FIG. 16C is a diagram illustrating an example configuration of a matching circuit related to an external chip according to various embodiments.

FIGS. 16A, 16B, and 16C are diagrams illustrating example configurations of a matching circuit related to an external chip according to various embodiments. As an example, with reference to FIGS. 16A, 16B, and 16C, the configuration of a second chip 1610 will described by way of non-limiting example through the configuration of the RFFE 800 formed as shown in FIG. 14B.

According to various embodiments, as shown in FIGS. 16A, 16B, and 16C, at least a part of the internal configurations of the RFFE 800 may include a first chip 1600 and the second chip 1610 different from the first chip 1600. According to an embodiment, the second amplification circuit 830 of the power amplifier 804 may be included in the second chip 1610. According to an embodiment, the remaining configuration excluding the second amplification circuit 830 of the power amplifier 804 among elements included in the RFFE 800 may be included in the first chip 1600 different from the second chip 1610. As an example, the first chip 1600 may include a CMOS, and the second chip 1610 may include a compound semiconductor.

According to various embodiments, in the second amplification circuit 830 of the power amplifier 804 as shown in FIG. 16A, a transistor 1612 for power amplification may be included in the second chip 1610. According to an embodiment, a first matching circuit 1614 (e.g., input matching circuit) and a second matching circuit 1616 (e.g., output matching circuit) for impedance matching of the second amplification circuit 830 may be included in the first chip 1600.

According to various embodiments, with reference to the second amplification circuit 830 of the power amplifier of FIG. 16B, the transistor 1612 for the power amplification and the second matching circuit 1616 (e.g., output matching circuit) may be included in the second chip 1610. According to an embodiment, the first matching circuit 1614 (e.g., input matching circuit) for impedance matching of the second amplification circuit 830 may be included in the first chip 1600.

According to various embodiments, with reference to the second amplification circuit 830 of the power amplifier 804 of FIG. 16C, the transistor 1612 for the power amplification and the first matching circuit 1614 (e.g., input matching circuit) and the second matching circuit 1616 (e.g., output matching circuit) for the impedance matching of the second amplification circuit 830 may be included in the second chip 1610.

According to various embodiments, with reference to the RFFE 800 of FIG. 16B or 16C, in case that the matching circuits (e.g., first matching circuit 1614 and/or second matching circuit 1616) related to the second amplification circuit 830 is included in the second chip 1610, the system structure can be flexibly formed. For example, in the RFFE 800, the third amplification circuit 832 included in the first chip 1600 may be configured to support a broadband or dual band, and the second amplification circuit 830 included in the second chip 1610 may be configured to support a first frequency band (e.g., about 28 GHz or about 39 GHz).

According to various example embodiments, an electronic device (e.g., electronic device 101 of FIG. 1, electronic device 300 of FIG. 3A or 3B, or electronic device 500 of FIG. 5) may include: a communication processor (e.g., first communication processor 212 or second communication processor 214 of FIG. 2), and a power amplifier (e.g., power amplifier 730 of FIG. 7) electrically connected to the communication processor, the power amplifier including a first switch (e.g., switch 740 of FIG. 7), an input port (e.g., input port 764 of FIG. 7), a first output port (e.g., first output port 760 of FIG. 7), and a second output port (e.g., second output port 762 of FIG. 7), the power amplifier further including a first amplification circuit (e.g., first amplification circuit 730-1 of FIG. 7) disposed on a first electrical path between the input port and the first switch, a second amplification circuit (e.g., second amplification circuit 730-2 of FIG. 7) disposed on a second electrical path between the first switch and the first output port, and a third amplification circuit (e.g., third amplification circuit 730-3 of FIG. 7) disposed on a third electrical path between the first switch and the second output port.

According to various example embodiments, the first amplification circuit, the second amplification circuit, and the third amplification circuit may be disposed in a same chip.

According to various example embodiments, the first amplification circuit and the third amplification circuit may be disposed in a first chip (e.g., first chip 1300 of FIG. 13), and the second amplification circuit may be disposed in a second chip (e.g., second chip 1310 of FIG. 13) different from the first chip.

According to various example embodiments, an input matching circuit and an output matching circuit related to the second amplification circuit may be disposed in the first chip or the second chip.

According to various example embodiments, the input matching circuit related to the second amplification circuit may be disposed in the first chip, and the output matching circuit related to the second amplification circuit may be disposed in the second chip.

According to various example embodiments, the first chip may include a semiconductor produced in a single element process, and the second chip may include a semiconductor produced in a compound process.

According to various example embodiments, the single element process may include one of silicon (Si) and germanium (Ge), and the compound process may include one of silicon-germanium (SiGe), gallium-arsenic (GaAs), indium-phosphorus (InP), gallium-phosphorus (GaP), cadmium sulfide (CdS), zinc telluride (ZnTe), or lead sulfide (PbS).

According to various example embodiments, the first chip and the second chip may be provided as one package.

According to various example embodiments, the second amplification circuit and the third amplification circuit may be configured to support different frequency bands or different amplification factors.

According to various example embodiments, the electronic device may further include a plurality of antennas, wherein the first output port may be connected to a first antenna among the plurality of antennas, and the second output port may be connected to a second antenna different from the first antenna among the plurality of antennas.

According to various example embodiments, the electronic device may further include at least one antenna module including at least one antenna, wherein the power amplifier may be mounted on the at least one antenna module.

According to various example embodiments, the at least one antenna module may include a first printed circuit board and a second printed circuit board (e.g., second substrate 554 of FIG. 6) electrically connected to the first printed circuit board (e.g., first substrate 552 of FIG. 6), and the first printed circuit board may include a first antenna array including at least one first antenna, the second printed circuit board may include a second antenna array including at least one second antenna, the first amplification circuit and the second amplification circuit may be disposed on the first printed circuit board, the second amplification circuit may be electrically connected to the at least one first antenna through the first output port, and the third amplification circuit may be disposed on the second printed circuit board, and may be electrically connected to the at least one second antenna through the second output port.

According to various example embodiments, the electronic device may further include: a low noise amplifier electrically connected to the communication processor, the low noise amplifier including a second switch, an output port, a first input port, and a second input port, wherein the low noise amplifier may include a fourth amplification circuit disposed on a fourth electrical path between the second switch and the output port, a fifth amplification circuit disposed on a fifth electrical path between the first input port and the second switch, and a sixth amplification circuit disposed on a sixth electrical path between the second input port and the second switch.

According to various example embodiments, the electronic device may further include: a plurality of antennas, a third switch connecting a first antenna among the plurality of antennas to the first output port or the first input port, and a fourth switch connecting a second antenna among the plurality of antennas to the second output port or the second input port.

According to various example embodiments, the communication processor may be configured to control the first switch to connect the first amplification circuit to the second amplification circuit or the third amplification circuit based on the first output port or the second output port connected to an antenna configured to transmit a signal.

According to various example embodiments, an electronic device (e.g., electronic device 101 of FIG. 1, electronic device 300 of FIG. 3A or 3B, or electronic device 500 of FIG. 5) may include: a communication processor (e.g., first communication processor 212 or second communication processor 214 of FIG. 2); and at least one antenna module electrically connected to the communication processor, the at least one antenna module including a first antenna array (e.g., first array antenna 600 of FIG. 6) including at least one first antenna, a second antenna array (e.g., second array antenna 610 of FIG. 6) including at least one second antenna, and a wireless communication circuit (e.g., third RFIC 226 of FIG. 2 or RFIC 700 of FIG. 7), wherein the wireless communication circuit may include a power amplifier (e.g., power amplifier 730 of FIG. 7) including a first switch (e.g., switch 740 of FIG. 7), an input port (e.g., input port 764 of FIG. 7), a first output port (e.g., first output port 760 of FIG. 7), and a second output port (e.g., second output port 762 of FIG. 7), the power amplifier including a first amplification circuit (e.g., first amplification circuit 730-1 of FIG. 7) disposed on a first electrical path between the input port and the first switch, a second amplification circuit (e.g., second amplification circuit 730-2 of FIG. 7) disposed on a second electrical path between the at least one first antenna connected through the first output port and the first switch, and a third amplification circuit (e.g., third amplification circuit 730-3 of FIG. 7) disposed on a third electrical path between the at least one second antenna connected through the second output port and the first switch.

According to various example embodiments, the at least one antenna module may include: a first printed circuit board (e.g., first substrate 552 of FIG. 6) and a second printed circuit board (e.g., second substrate 554 of FIG. 6) electrically connected to the first printed circuit board, and the first printed circuit board may include the first antenna array and the wireless communication circuit, and the second printed circuit board may include the second antenna array.

According to various example embodiments, the first amplification circuit and the third amplification circuit may be disposed in a first chip (e.g., first chip 1300 of FIG. 13), and the second amplification circuit may be disposed in a second chip (e.g., second chip 1310 of FIG. 13) different from the first chip.

According to various example embodiments, an input matching circuit and/or an output matching circuit related to the second amplification circuit may be disposed in the first chip or the second chip.

According to various example embodiments, the first chip may include a semiconductor produced in a single element process, and the second chip may include a semiconductor produced in a compound process.

According to various example embodiments, the electronic device may be configured to process the radio signal using the wireless communication circuit wherein at least a part of the power amplifier including a plurality of amplification circuits is separated from a remaining part thereof, and thus it is possible to prevent and/or reduce the output power and/or the power efficiency of the power amplifier from being degraded.

According to various example embodiments, the electronic device may use the RF chains the number of which is less than the number of antenna modules using the wireless communication circuit having the structure in which at least a part of the power amplifier including a plurality of amplification circuits is separated from the remaining part thereof, and thus it is possible to reduce the size of the circuit for processing the RF signal.

While the disclosure has been illustrated and described with reference to various example embodiments, it will be understood that the various example embodiments are intended to be illustrative, not limiting. It will be further understood by one of ordinary skill in the art that various changes in form and detail may be made without departing from the true spirit and full scope of the disclosure, including the appended claims and their equivalents.

What is claimed is:

1. An electronic device comprising:
at least one antenna module comprising at least one antenna, a first printed circuit board, and a second printed circuit board electrically connected to the first printed circuit board;
a communication processor; and
a power amplifier mounted on the at least one antenna module, electrically connected to the communication processor and including a first switch, an input port, a first output port, and a second output port, the power amplifier further including:
a first amplification circuit disposed on a first electrical path between the input port and the first switch,
a second amplification circuit disposed on a second electrical path between the first switch and the first output port, and
a third amplification circuit disposed on a third electrical path between the first switch and the second output port,
wherein the first printed circuit board includes a first antenna array including at least one first antenna,
wherein the second printed circuit board includes a second antenna array including at least one second antenna,
wherein the first amplification circuit and the second amplification circuit are disposed on the first printed circuit board,
wherein the second amplification circuit is electrically connected to the at least one first antenna through at least the first output port, and
wherein the third amplification circuit is disposed on the second printed circuit board, and is electrically connected to the at least one second antenna through at least the second output port.

2. The electronic device of claim 1, wherein the first amplification circuit, the second amplification circuit, and the third amplification circuit are disposed in a same chip.

3. The electronic device of claim 2, wherein the chip includes a semiconductor produced in a single element process or
a semiconductor produced in a compound process.

4. The electronic device of claim 3, wherein the single element process includes one of silicon (Si) and germanium (Ge), and
wherein the compound process includes one of silicon-germanium (SiGe), gallium-arsenic (GaAs), indium-phosphorus (InP), gallium-phosphorus (GaP), cadmium sulfide (CdS), zinc telluride (ZnTe), or lead sulfide (PbS).

5. The electronic device of claim 1, wherein the second amplification circuit and the third amplification circuit are configured to support different frequency bands and/or different amplification factors.

6. The electronic device of claim 1,
wherein the first output port is connected to the at least one first antenna of the plurality of antennas, and
the second output port is connected to the at least one second antenna different from the at least one first antenna.

7. The electronic device of claim 1, further comprising a low noise amplifier electrically connected to the communication processor, the low noise amplifier including a second switch, an output port, a first input port, and a second input port, the low noise amplifier including:
a fourth amplification circuit disposed on a fourth electrical path between the second switch and the output port,
a fifth amplification circuit disposed on a fifth electrical path between the first input port and the second switch, and
a sixth amplification circuit disposed on a sixth electrical path between the second input port and the second switch.

8. The electronic device of claim 1, wherein the communication processor is configured to control the first switch to connect the first amplification circuit to the second amplification circuit or the third amplification circuit based on the first output port or the second output port connected to an antenna configured to transmit a signal.

9. An electronic device comprising:
a plurality of antennas:
a communication processor;
a power amplifier electrically connected to the communication processor and including a first switch, an input port, a first output port, and a second output port, the power amplifier further including:
a first amplification circuit disposed on a first electrical path between the input port and the first switch,
a second amplification circuit disposed on a second electrical path between the first switch and the first output port, and
a third amplification circuit disposed on a third electrical path between the first switch and the second output port;
a low noise amplifier electrically connected to the communication processor, the low noise amplifier including a second switch, an output port, a first input port, and a second input port, the low noise amplifier including:
a fourth amplification circuit disposed on a fourth electrical path between the second switch and the output port,
a fifth amplification circuit disposed on a fifth electrical path between the first input port and the second switch, and
a sixth amplification circuit disposed on a sixth electrical path between the second input port and the second switch;
a third switch connecting a first antenna of the plurality of antennas to the first output port or the first input port; and
a fourth switch connecting a second antenna of the plurality of antennas to the second output port or the second input port.

10. The electronic device of claim 9, further comprising at least one antenna module comprising at least one antenna,
wherein the power amplifier is mounted on the at least one antenna module.

11. The electronic device of claim 10, wherein the at least one antenna module comprises a first printed circuit board and a second printed circuit board electrically connected to the first printed circuit board, and
wherein the first printed circuit board includes a first antenna array including at least one first antenna,
the second printed circuit board includes a second antenna array including at least one second antenna,
the first amplification circuit and the second amplification circuit are disposed on the first printed circuit board,
the second amplification circuit is electrically connected to the at least one first antenna through the first output port, and
the third amplification circuit is disposed on the second printed circuit board, and is electrically connected to the at least one second antenna through the second output port.

12. The electronic device of claim 9, wherein the first amplification circuit and the third amplification circuit are disposed in a first chip, and
the second amplification circuit is disposed in a second chip different from the first chip.

13. An electronic device comprising:
a communication processor; and
at least one antenna module electrically connected to the communication processor, the at least one antenna module including a first antenna array including at least one first antenna, a second antenna array including at least one second antenna, a wireless communication circuit, a first printed circuit board a second printed circuit board electrically connected to the first printed circuit board,
wherein the first printed circuit board includes the first antenna array and the wireless communication circuit, and the second printed circuit board includes the second antenna array,
wherein the wireless communication circuit includes a power amplifier including a first switch, an input port, a first output port, and a second output port, the power amplifier including:
a first amplification circuit disposed on a first electrical path between the input port and the first switch,
a second amplification circuit disposed on a second electrical path between the at least one first antenna connected through the first output port and the first switch, and
a third amplification circuit disposed on a third electrical path between the at least one second antenna connected through the second output port and the first switch.

* * * * *